US012505802B2

(12) United States Patent
Toyotaka et al.

(10) Patent No.: US 12,505,802 B2
(45) Date of Patent: Dec. 23, 2025

(54) CORRECTION METHOD OF DISPLAY APPARATUS AND THE DISPLAY APPARATUS

(71) Applicant: SEMICONDUCTOR ENERGY LABORATORY CO., LTD., Atsugi (JP)

(72) Inventors: Kouhei Toyotaka, Kanagawa (JP); Kazuma Furutani, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/685,010

(22) PCT Filed: Aug. 9, 2022

(86) PCT No.: PCT/IB2022/057397
§ 371 (c)(1),
(2) Date: Feb. 20, 2024

(87) PCT Pub. No.: WO2023/026125
PCT Pub. Date: Mar. 2, 2023

(65) Prior Publication Data
US 2024/0363069 A1 Oct. 31, 2024

(30) Foreign Application Priority Data
Aug. 27, 2021 (JP) ................................ 2021-138839
Sep. 10, 2021 (JP) ................................ 2021-147271

(51) Int. Cl.
*G09G 3/32* (2016.01)
*G09G 3/20* (2006.01)
(Continued)

(52) U.S. Cl.
CPC ......... *G09G 3/3233* (2013.01); *G09G 3/2074* (2013.01); *H10K 71/70* (2023.02);
(Continued)

(58) Field of Classification Search
CPC ............... G09G 3/3233; G09G 3/2074; G09G 2354/00; G09G 2360/10; G09G 2360/142;
(Continued)

(56) References Cited

U.S. PATENT DOCUMENTS

| | | | |
|---|---|---|---|
| 7,088,052 | B2 | 8/2006 | Kimura |
| 8,947,328 | B2 | 2/2015 | Kimura |

(Continued)

FOREIGN PATENT DOCUMENTS

| | | | |
|---|---|---|---|
| CN | 001407526 | A | 4/2003 |
| CN | 109599060 | A | 4/2019 |

(Continued)

OTHER PUBLICATIONS

International Search Report (Application No. PCT/IB2022/057397), dated Oct. 25, 2022.

(Continued)

*Primary Examiner* — Michael A Faragalla
(74) *Attorney, Agent, or Firm* — Fish & Richardson P.C.

(57) ABSTRACT

A novel correction method for a display apparatus is provided. A correction circuit of the display apparatus obtains offset corresponding to a current flowing through a second subpixel when a first subpixel is not lit. The correction circuit of the display apparatus obtains, for each pixel, correction output data, obtained by correcting, with the offset, data corresponding to a current flowing through each of the second subpixels in sequentially supplying correction video data to the first subpixels and stores the correction video data and the correction output data corresponding to the correction video data in a memory circuit. The correction circuit of the display apparatus calculates coefficients obtained when a relation between the correction video data and the correction output data corresponding to the correc- (Continued)

tion video data is approximated by a quadratic expression and stores the coefficients in the memory circuit. The correction circuit of the display apparatus stores a correction table that is created on the basis of the correction output data and the coefficients, in the memory circuit. The correction circuit of the display apparatus corrects display video data in accordance with the correction table.

15 Claims, 47 Drawing Sheets

(51) Int. Cl.

| | |
|---|---|
| ***G09G 3/3233*** | (2016.01) |
| ***H10K 71/70*** | (2023.01) |
| *H10K 39/34* | (2023.01) |
| *H10K 59/13* | (2023.01) |
| *H10K 59/40* | (2023.01) |

(52) U.S. Cl.
CPC ..... *G09G 2354/00* (2013.01); *G09G 2360/10* (2013.01); *G09G 2360/142* (2013.01); *G09G 2360/148* (2013.01); *H10K 39/34* (2023.02); *H10K 59/13* (2023.02); *H10K 59/40* (2023.02)

(58) Field of Classification Search
CPC .. G09G 2360/148; H10K 71/70; H10K 39/34; H10K 59/40; H10K 59/13
See application file for complete search history.

(56) References Cited

U.S. PATENT DOCUMENTS

| | | | | |
|---|---|---|---|---|
| 11,056,055 | B2 | 7/2021 | Chung et al. | |
| 2003/0057895 | A1 | 3/2003 | Kimura | |
| 2005/0237318 | A1 | 10/2005 | Inoue et al. | |
| 2008/0315890 | A1 | 12/2008 | Kasai et al. | |
| 2015/0179095 | A1 | 6/2015 | Kimura | |
| 2019/0018183 | A1* | 1/2019 | Ochi | G02B 6/0043 |
| 2020/0051499 | A1* | 2/2020 | Chung | G09G 5/377 |
| 2021/0225272 | A1* | 7/2021 | Yang | G09G 3/2092 |
| 2021/0326567 | A1* | 10/2021 | Liu | G06V 40/1318 |

FOREIGN PATENT DOCUMENTS

| | | | |
|---|---|---|---|
| JP | 2003-195813 | A | 7/2003 |
| JP | 2005-316408 | A | 11/2005 |
| JP | 2006-091462 | A | 4/2006 |
| JP | 2009-003092 | A | 1/2009 |
| JP | 2010-096908 | A | 4/2010 |
| JP | 2020-024411 | A | 2/2020 |
| KR | 2003-0022084 | A | 3/2003 |
| TW | I221268 | | 9/2004 |
| WO | WO-2020/143666 | | 7/2020 |

OTHER PUBLICATIONS

Written Opinion (Application No. PCT/IB2022/057397), dated Oct. 25, 2022.

* cited by examiner

9101

9102

9200

9201

9201

9201

CORRECTION METHOD OF DISPLAY APPARATUS AND THE DISPLAY APPARATUS

CROSS REFERENCE TO RELATED APPLICATIONS

This application is a U.S. National Phase Application under 35 U.S.C. § 371 of International Application PCT/IB2022/057397, filed on Aug. 9, 2022, which is incorporated by reference and claims the benefit of foreign priority applications filed in Japan on Aug. 27, 2021, as Application No. 2021-138839, and on Sep. 10, 2021, as Application No. 2021-147271.

TECHNICAL FIELD

One embodiment of the present invention relates to a semiconductor device, a display apparatus, a display module, and an electronic device. One embodiment of the present invention relates to a method for correcting video data to be displayed on a display apparatus, the display apparatus, and the like.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor or the like), an input/output device (e.g., a touch panel or the like), a method for driving any of them, and a method for manufacturing any of them.

BACKGROUND ART

A display apparatus using an organic electroluminescence (EL) device is suitable for thinning of a device, not needing a backlight necessary for a liquid crystal display apparatus, and thus, is used more and more in information terminal devices such as a smartphone.

An organic EL device has a problem such as a non-lighting state (a black dot state) of a pixel due to a defective shape or the like in manufacturing a device; thus, unfortunately, the yield of the display apparatus may be reduced. As a countermeasure to correct a display defect such as a black dot, it is possible to find the position of a defect by checking lighting states of all pixels by image capturing with an external camera or the like in an inspection before shipment, and to incorporate a correction algorithm for peripheral pixels at the time of shipment (e.g., see Patent Document 1).

REFERENCE

Patent Document

[Patent Document 1] Japanese Published Patent Application No. 2009-3092

SUMMARY OF THE INVENTION

Problems to be Solved by the Invention

A display apparatus using an organic EL device has a higher definition of pixels and a large number of pixels for display. Thus, unfortunately, the number of times of image capturing may be increased in the structure in which images of all pixels are captured with an external camera in an inspection before shipment. In addition, in an inspection after shipment, it is difficult to capture images of all the pixels with the external camera. Moreover, a method for finding a defective pixel with a control circuit such as an external compensation circuit and correcting video data is given; however, it is difficult to correct a relative variation in luminance between pixels.

An object of one embodiment of the present invention is to provide a novel correction method for a display apparatus, the display apparatus having a novel structure, and the like. Another object of one embodiment of the present invention is to provide a novel correction method for a display apparatus that can correct a variation in luminance between pixels even after shipment, the display apparatus having a novel structure, and the like. Another object of one embodiment of the present invention is to provide a novel correction method for a display apparatus that can correct a variation in luminance between pixels without increasing the number of times of image capturing, the display apparatus having a novel structure, and the like.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a correction method for a display apparatus. The display apparatus includes a display portion, a correction circuit, and a memory circuit, and the display portion includes a plurality of pixels each including a first subpixel including a light-emitting device and a second subpixel including a light-receiving device. The correction circuit obtains offset corresponding to a current flowing through the second subpixel when the first subpixel is not lit; obtains for each pixel, correction output data, obtained by correcting, with the offset, data corresponding to a current flowing through each of the second subpixels in sequentially supplying correction video data to the first subpixels, and stores the correction video data and the correction output data corresponding to the correction video data in the memory circuit; calculates coefficients obtained when a relation between the correction video data and the correction output data corresponding to the correction video data is approximated by a quadratic expression; stores the coefficients in the memory circuit; creates a correction table on the basis of the correction output data and the coefficients; stores the correction table in the memory circuit; and corrects display video data in accordance with the correction table.

In one embodiment of the present invention, the quadratic expression is expressed by Expression (1) with the correction video data set as $D_{DATA}$ and the correction output data set as $D_{PI}$.

[Formula 1]

$$D_{PI} = \alpha(D_{DATA} - \beta)^2 \tag{1}$$

In a preferred correction method for a display apparatus, the coefficients of Expression (1) are α and β.

One embodiment of the present invention is a correction method for a display apparatus. The display apparatus includes a display portion, a correction circuit, and a memory circuit, and the display portion includes a plurality of pixels each including a first subpixel including a light-emitting device and a second subpixel including a light-receiving device. The correction circuit obtains offset corresponding to a current flowing through the second subpixel when the first subpixel is not lit; obtains first correction output data corresponding to a current flowing through the second subpixel when the first subpixel is lit with a maximum grayscale level; obtains, for each pixel, correction output data, obtained by correcting, with the offset, data corresponding to a current flowing through each of the second subpixels in sequentially supplying correction video data to the first subpixels; determines second correction output data corresponding to a grayscale level on the basis of the first correction output data; stores a correction table created on the basis of the correction video data corresponding to the second correction output data in the memory circuit; and corrects display video data in accordance with the correction table.

A preferred embodiment of the present invention is a correction method for the display apparatus in which the display apparatus includes a reflective plate, and the offset and the correction output data are obtained with the display portion and the reflective plate overlapping with each other.

One embodiment of the present invention is a display apparatus including a display portion, a correction circuit, and a memory circuit. The display portion includes a plurality of pixels each including a first subpixel including a light-emitting device and a second subpixel including a light-receiving device. The correction circuit has a function of obtaining offset corresponding to a current flowing through the second subpixel when the first subpixel is not lit, a function of obtaining, for each pixel, correction output data, obtained by correcting, with the offset, data corresponding to a current flowing through each of the second subpixels in sequentially supplying correction video data to the first subpixels, and storing the correction video data and the correction output data corresponding to the correction video data in the memory circuit; a function of calculating coefficients obtained when a relation between the correction video data and the correction output data corresponding to the correction video data is approximated by a quadratic expression and storing the coefficients in the memory circuit; a function of creating a correction table on the basis of the correction output data and the coefficients and storing the correction table in the memory circuit; and a function of correcting display video data in accordance with the correction table.

In one embodiment of the present invention, the quadratic expression is expressed by Expression (1) with the correction video data set as $D_{DATA}$ and the correction output data set as $D_{PI}$.

[Formula 2]

$$D_{PI} = \alpha(D_{DATA} - \beta)^2 \quad (1)$$

In a preferred display apparatus, the coefficients of Expression (1) are α and β.

In a preferred embodiment of the present invention, the display apparatus includes a reflective plate, and the offset and the correction output data are obtained with the display portion and the reflective plate overlapping with each other.

In a preferred embodiment of the present invention, the light-emitting device is an organic EL device, and the light-receiving device is an organic photodiode.

Effect of the Invention

One embodiment of the present invention can provide a novel correction method for a display apparatus, the display apparatus having a novel structure, and the like. Another embodiment of the present invention can provide a novel correction method for a display apparatus that can correct a variation in luminance between pixels even after shipment, the display apparatus having a novel structure, and the like. Another embodiment of the present invention is to provide a novel correction method for a display apparatus that can correct a variation in luminance between pixels without increasing the number of times of image capturing, the display apparatus having a novel structure, and the like.

Note that the description of these effects does not preclude the existence of other effects. One embodiment of the present invention does not necessarily have all of these effects. Other effects can be derived from the description of the specification, the drawings, and the claims.

MODE FOR CARRYING OUT THE INVENTION

Figure 1:
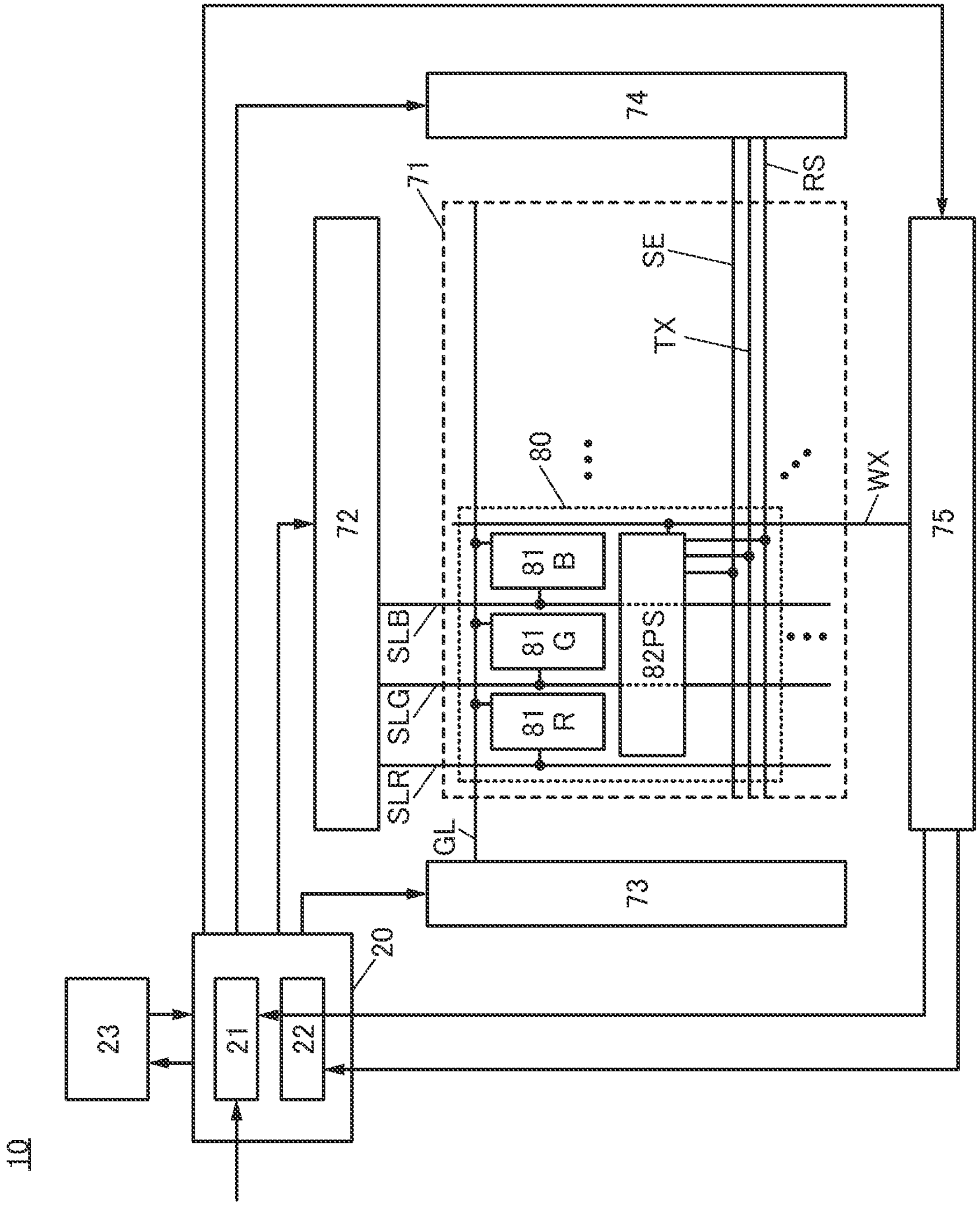
FIG. 1 is a diagram illustrating a structure example of a display apparatus.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Thus, the disclosed invention is not necessarily limited to the position, size, range, or the like disclosed in the drawings.

The term "film" and the term "layer" can be interchanged with each other depending on the case or circumstances. For example, the term "conductive layer" can be replaced with the term "conductive film". As another example, the term "insulating film" can be replaced with the term "insulating layer".

In the case where a plurality of components are denoted by the same reference numerals, and, particularly when they need to be distinguished from each other, an identification sign such as "_1", "_2", "[n]", or "[m, n]" is sometimes added to the reference numerals. For example, a second wiring GL is referred to as a wiring GL [2].

Embodiment 1

In this embodiment, a display apparatus of one embodiment of the present invention is described. In this embodiment, a circuit configuration of a pixel in the display apparatus is specifically described.

<Block Diagram of Display Apparatus>

FIG. 1 is a block diagram of a display apparatus 10. The display apparatus 10 includes a display portion 71, a signal line driver circuit 72, a gate line driver circuit 73, a control line driver circuit 74, a signal readout circuit 75, a correction circuit 20, a memory circuit 23, and the like.

The display portion 71 includes a plurality of pixels 80 arranged in a matrix. The pixel 80 includes a subpixel 81R, a subpixel 81G, a subpixel 81B, and a subpixel 82PS. The subpixel 81R, the subpixel 81G, and the subpixel 81B each include a light-emitting device functioning as a display device. The subpixel 82PS includes a light-receiving device functioning as a photoelectric conversion element. In the display apparatus of one embodiment of the present invention, the light-emitting devices are arranged in a matrix in the display portion, and an image can be displayed on the display portion. In addition, the display apparatus of one embodiment of the present invention has a function of detecting light with use of light-receiving devices.

As the light-emitting device (also referred to as a light-emitting element), an EL device such as an OLED (Organic Light Emitting Diode) or a QLED (Quantum-dot Light Emitting Diode) is preferably used. Examples of a light-emitting substance contained in the EL device include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescence (TADF) material). In addition, an LED (Light Emitting Diode) such as a micro-LED can also be used as the light-emitting device. Note that as a TADF material, a material that is in a thermal equilibrium state between a singlet excited state and a triplet excited state may be used. Since such a TADF material has a short emission lifetime (excitation lifetime), it can inhibit a reduction in the efficiency of a light-emitting device in a high-luminance region.

For example, a pn or pin photodiode can be used as the light-receiving device (light-emitting element). The light-receiving device has a function of detecting visible light. The light-receiving device has sensitivity to visible light. The light-receiving device further preferably has a function of detecting visible light and infrared light. The light-receiving device preferably has sensitivity to at least one of visible light and infrared light.

In this specification and the like, a blue (B) wavelength range is greater than or equal to 400 nm and less than 490 nm, and blue (B) light has at least one emission spectrum peak in the wavelength range. A green (G) wavelength range is greater than or equal to 490 nm and less than 580 nm, and green (G) light has at least one emission spectrum peak in the wavelength range. A red (R) wavelength range is greater than or equal to 580 nm and less than 700 nm, and red (R) light has at least one emission spectrum peak in the wavelength range. In this specification and the like, a wavelength range of visible light is greater than or equal to 400 nm and less than 700 nm, and visible light has at least one emission spectrum peak in the wavelength range. An infrared (IR) wavelength range is greater than or equal to 700 nm and less than 900 nm, and infrared (IR) light has at least one emission spectrum peak in the wavelength range.

The active layer included in the light-receiving device contains a semiconductor. Examples of the semiconductor include an inorganic semiconductor such as silicon and an organic semiconductor including an organic compound. It is particularly preferable to use an organic photodiode including a layer containing an organic semiconductor, as the light-receiving device. An organic photodiode, which is easily made thin, lightweight, and large in area and has a high degree of freedom for shape and design, can be used for a variety of display apparatuses. An organic semiconductor is preferably used, in which case the EL layer included in the light-emitting device and the light-receiving layer included in the light-receiving device can be formed by the same method (e.g., a vacuum evaporation method) with the same manufacturing apparatus.

In the display apparatus of one embodiment of the present invention, an organic EL device can be used as the light-emitting device and an organic photodiode can be suitably used as the light-receiving device in each pixel. The organic EL device and the organic photodiode can be formed over the same substrate. Thus, the organic photodiode can be incorporated into the display apparatus including the organic EL device. The display apparatus of one embodiment of the present invention has one or both of an image capturing function and a sensing function in addition to an image displaying function.

The light-receiving devices are arranged in a matrix in the display portion of the display apparatus of one embodiment of the present invention, and each pixel in the display portion includes one or both of an image capturing function and a sensing function in addition to an image displaying function. The display portion can be used as an image sensor or a touch sensor. That is, by detecting light with the display portion, an image can be captured or the approach or contact of an object (e.g., a finger, a hand, or a stylus) can be detected. Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

When the light-receiving device is used as an image sensor, the display apparatus can capture an image with the use of the light-receiving device. For example, the display apparatus of this embodiment can be used as a scanner.

For example, data on biological information such as a fingerprint or a palm print can be obtained with use of the image sensor. That is, a biometric authentication sensor can be incorporated in the display apparatus. When the display apparatus incorporates a biometric authentication sensor, the number of components of an electronic device can be reduced as compared to the case where a biometric authentication sensor is provided separately from the display apparatus; thus, the size and weight of the electronic device can be reduced.

In the case where the light-receiving devices are used as the touch sensor, the display apparatus can detect the approach or contact of a target with use of the light-receiving devices.

The pixel 80 is electrically connected to a wiring GL, a wiring SLR, a wiring SLG, a wiring SLB, a wiring SE, a wiring RS, a wiring TX, a wiring WX, and the like. The wiring SLR, the wiring SLG, and the wiring SLB are electrically connected to the signal line driver circuit 72. The wiring GL is electrically connected to the gate driver circuit 73. The signal line driver circuit 72 functions as a source line driver circuit (also referred to as a source driver). The gate line driver circuit 73 is referred to as a gate driver in some cases.

The pixel 80 includes the subpixel 81R, the subpixel 81G, and the subpixel 81B as the subpixels each including a light-emitting device. For example, the subpixel 81R is a subpixel exhibiting red, the subpixel 81G is a subpixel exhibiting green, and the subpixel 81B is a subpixel exhibiting blue. Thus, the display apparatus 10 can perform full-color display. Note that although the example where the pixel 80 includes subpixels of three colors is illustrated here, subpixels of four or more colors may be included.

The subpixel 81R includes a light-emitting device that emits red light. The subpixel 81G includes a light-emitting device that emits green light. The subpixel 81B includes a light-emitting device that emits blue light. Note that the pixel 80 may include a subpixel including a light-emitting device that emits light of another color. For example, the pixel 80 may include, in addition to the three subpixels, a subpixel including a light-emitting device that emits white light, a subpixel including a light-emitting device that emits yellow light, or the like.

Note that in this specification and the like, although a minimum unit in which independent operation is performed in one "pixel" is defined as a "subpixel" in the description for convenience, a "subpixel" may be replaced with a "pixel" in some cases.

The wiring GL is electrically connected to the subpixel 81R, the subpixel 81G, and the subpixel 81B arranged in a row direction (an extending direction of the wiring GL). The wiring SLR, the wiring SLG, and the wiring SLB are electrically connected to the subpixel 81R, the subpixel 81G, and the subpixel 81B arranged in a column direction (an extending direction of the wiring SLR and the like), respectively.

The subpixel 82PS included in the pixel 80 is electrically connected to the wiring SE, the wiring TX, the wiring RS, and the wiring WX. The wiring SE is electrically connected to the control line driver circuit 74. The wiring TX is electrically connected to the control line driver circuit 74. The wiring RS is electrically connected to the control line driver circuit 74. The wiring WX is electrically connected to the signal readout circuit 75.

The control line driver circuit 74 has a function of generating a signal for driving the subpixel 82PS and outputting the signal to the subpixel 82PS through the wiring SE, the wiring TX, and the wiring RS. The signal readout circuit 75 has a function of receiving a signal output from the subpixel 82PS through the wiring WX and outputting the signal to the correction circuit 20 as touch detection output data or correction output data. The signal readout circuit 75 functions as a circuit for reading touch detection output data or correction output data.

The correction circuit 20 includes a video data correction circuit 21 and a touch detection circuit 22. The correction circuit 20 corrects a signal for controlling display on the display portion 71 in response to an operation determined on the basis of video data corrected by the video data correction circuit 21 and touch detection output data. The video data corrected by the video data correction circuit 21 is video data obtained by correcting video data input from the outside. The touch detection output data is data input from the signal readout circuit 75. A signal for controlling display on the display portion 71 corrected by the correction circuit 20 is output to the signal line driver circuit 72, the gate line driver circuit 73, the control line driver circuit 74, and the signal readout circuit 75. Note that in this specification, video data used for correction of video data is sometimes referred to as correction video data, and video data performing display corrected by the correction circuit is sometimes referred to as display video data.

The touch detection circuit 22 is a circuit that detects an approach or contact of an object in response to touch detection output data output from the signal readout circuit 75. The touch detection output data corresponds to a signal obtained by converting a current value of photocurrent output from the light-receiving device into a digital signal by an analog-digital converter circuit.

The video data correction circuit 21 is a circuit that corrects video data input to the correction circuit 20 in response to correction output data output from the signal readout circuit 75. The correction output data corresponds to a signal obtained by converting a current value of photocurrent output from the light-receiving device into a digital signal by the analog-digital converter circuit.

The memory circuit 23 is a circuit for storing various kinds of data such as a correction table obtained on the basis of the correction output data. As the memory circuit 23, a flash memory, a ferroelectric random access memory (FeRAM), a magnetoresistive random access memory (MRAM), a phase change random access memory (PRAM), a resistance random access memory (ReRAM), or the like can be used, for example. Alternatively, a NOSRAM (registered trademark), a DOSRAM (registered trademark), or the like that is a memory including a transistor using an oxide semiconductor (OS transistor) may be used.

The NOSRAM is a gain cell DRAM in which a write transistor of a memory cell is an OS transistor. The NOSRAM is an abbreviation for Nonvolatile Oxide Semiconductor RAM. The DOSRAM refers to a memory device including a ITIC (one transistor and one capacitor) memory cell where a write transistor is formed using an oxide semiconductor. The DOSRAM is an abbreviation for a Dynamic Oxide Semiconductor Random Access Memory.

In the structure of one embodiment of the present invention, a correction table for correcting video data can be formed using correction output data based on a current flowing through a light-receiving device included in a subpixel provided for each pixel. Thus, a structure can be employed in which variation in luminance between pixels is corrected even in a display apparatus with a large number of pixels with higher definition. In the structure of one embodiment of the present invention, correction output data obtained when a light-receiving device receives light emitted from a light-emitting device included in a pixel is used; hence, a relative variation in luminance between pixels found in inspections not only after shipment but also after shipment can be corrected. In the structure of one embodiment of the present invention, a light-receiving device is provided in each pixel, a signal corresponding to a variation in luminance between light-emitting devices included in pixels can be output as correction output data, without dividing a screen into a plurality of areas, differently from an operation of capturing images of pixels by an image-capturing means such as an external camera; thus, the relative variation in luminance between pixels can be measured without increasing the number of times of image capturing, and correction data corresponding to the value can be generated.

<Method for Correcting Video Data>

A method for correcting video data in a display apparatus of one embodiment of the present invention is described. Video data to be corrected is due to a relative variation in luminance appearing when video data having the same grayscale is supplied to the light-emitting devices included in the pixels. Thus, in order to correct the variation in luminance, video data needs to be corrected. For correction of video data, correction output data corresponding to luminance obtained when video data is supplied to the light-emitting devices in the pixels is needed. In correction of video data, preferably, corrected video data is calculated from the correction output data, and video data after correction is calculated in each grayscale level and stored in the memory circuit as the correction table. With this structure, video data before correction can be converted into corrected video data in a short period.

Figure 2:
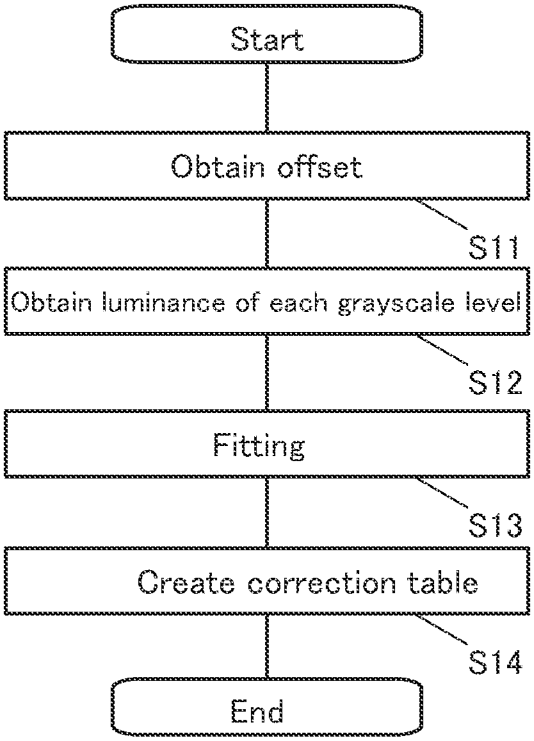
FIG. 2 is a flowchart illustrating an operation example of a display apparatus.

FIG. 2 is a flowchart for describing a method for correcting video data in the display apparatus in the correction circuit 20 including the video data correction circuit 21.

In the correction method of video data, a step of obtaining offset is performed (Step S11). Here, the offset is data corresponding to a current flowing through the light-receiving device included in a subpixel when the subpixel including a light-emitting device is brought into a non-lighting state in a state where the external light is weak. The offset can be read from a subpixel including a light-receiving device with the signal readout circuit 75, can be output as digital data to the correction circuit 20, and can be retained in the memory circuit 23. Note that in the following description, offset is sometimes described as the value of current flowing through the light-receiving device included in the subpixel.

In the correction method of video data, a step of obtaining luminance every grayscale level is performed (Step S12). Here, the step of obtaining luminance means to obtain data corresponding to a current flowing through a light-receiving device included in a subpixel when a light-emitting device of the subpixel including the light-emitting device is brought into a lighting state in a given grayscale level. The data can be read from the subpixel including the light-receiving device with the signal readout circuit 75, be output to the correction circuit 20 as digital data, and be retained in the memory circuit 23. Data obtained in Step S12 can be obtained as a value to be corrected with offset obtained in Step S11. Data obtained by correcting the data obtained in Step S12 with offset serves as correction output data. For example, if the number of grayscale levels of a subpixel including a light-emitting device is m grayscale levels (a first grayscale level to an m-th grayscale level, m is an integer greater than or equal to 2), first correction output data to m-th correction output data corresponding to the number of grayscale levels are obtained as the correction output data on a pixel-to-pixel basis. Note that the upper limit of m is N or less when the maximum grayscale levels that the signal line driver circuit 72 can output is N. Note that the correction output data does not necessarily correspond to the number of grayscale levels of subpixels, and correction output data corresponding to a grayscale level selected from a plurality of grayscale levels at a certain interval may be obtained. Note that in the following description, the correction output data is sometimes described as the value of current flowing through a light-receiving device included in a subpixel.

In the correction method of video data, the correction output data (the first correction output data to the m-th correction output data) and the video data (the correction video data) corresponding to each grayscale level (the first grayscale level to the m-th grayscale level) are stored in the memory circuit 23, and the relation between the correction output data and the video data is approximated (fitted) by a quadratic expression (Step S13). Note that it is preferable to obtain luminance of each grayscale level in Step S12 so that fitting can be performed with high accuracy in Step S13. Coefficients of the quadratic expression obtained by fitting are stored in the memory circuit 23. The video data corresponding to each grayscale level may be a video voltage supplied to the light-emitting device included in the subpixel. Note that the relation between correction output data and video data may be approximated by a plurality of linear expressions.

In the correction method of video data, a correction table based on the coefficients of the quadratic expression obtained in Step S13 and the correction output data (the first correction output data to the m-th correction output data) is created (Step S14). The correction table is a table for correcting video data (display video data), and can convert video data that is yet to be corrected can be converted into corrected video data. The correction table created in Step S14 can store a V-T curve of an analog voltage output from a grayscale voltage generation portion of the signal line driver circuit 72 versus each grayscale level can be stored in the memory circuit 23 as a gamma table. The correction table is created for each pixel. As described above, in the case where video data is corrected, corrected video data may be calculated from the correction output data. In that case, only the coefficients of the expression obtained by fitting may be stored in the memory circuit 23; thus, the storage capacity of the memory circuit 23 in which the correction table is stored can be reduced.

«Obtaining Offset»

Next, Step S11 of obtaining offset is described with reference to FIG. 3 to FIG. 5.

Figure 3A:
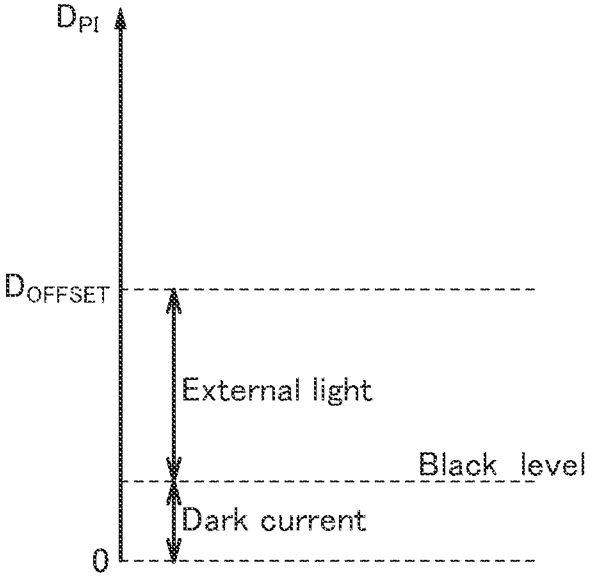
FIG. 3A and FIG. 3B are schematic views illustrating operation examples of a display apparatus.
Figure 3B:
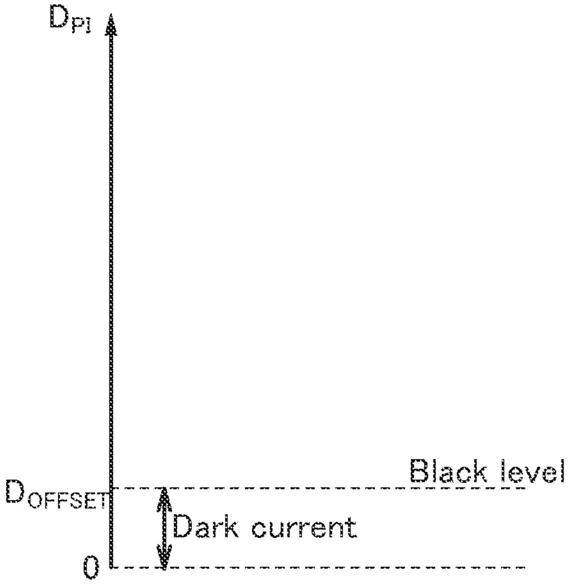
Figure 4A:
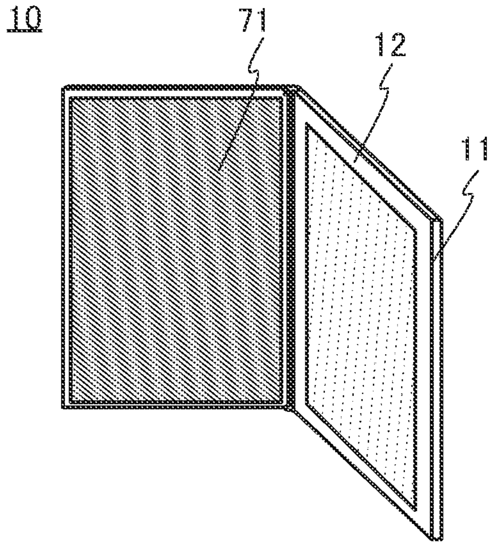
FIG. 4A to FIG. 4C are diagrams illustrating structure examples of a display apparatus.
Figure 4B:
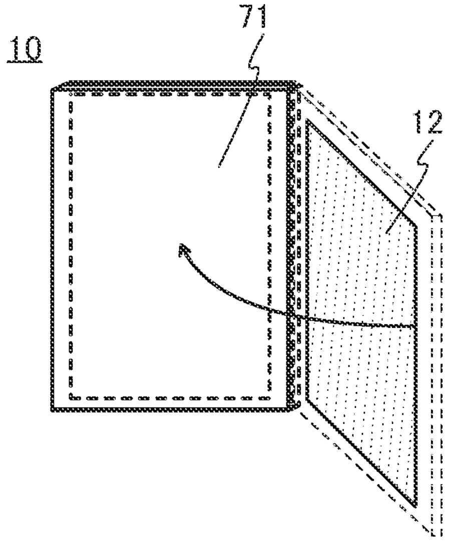

FIG. 3A and FIG. 3B are diagrams illustrating current obtained in the step of obtaining offset. When data corresponding to a current flowing through the light-receiving device is $D_{PI}$, in the case of illumination of external light as illustrated in FIG. 3A, $D_{PI}$ is data corresponding to a dark current (a current flowing through a light-receiving device in displaying black level) and a current corresponding to the influence of external light; thus, the offset data $D_{OFFSET}$ is affected by external light. Therefore, in the case where offset is obtained, it is preferable that the influence of external light be small as illustrated in FIG. 3B. When the influence of external light is reduced, the data $D_{OFFSET}$ corresponding to a fixed noise such as a dark current can be obtained. Note that the offset is data obtained for each pixel and the offset data is different for each pixel.

To make a state in which the influence of external light is small, a reflective plate is preferably provided to cover the display portion, for example. For example, as illustrated in FIG. 4A, a reflective plate 12 is provided in the protection portion 11 that can cover the display surface of the display portion 71 of the display apparatus 10. The reflective plate 12 can be provided so as to cover and overlap with the display surface of the display portion 71 of the display apparatus 10 when the protective portion 11 is folded on the display portion 71 side as illustrated in FIG. 4B. For example, as in a schematic cross-sectional view illustrated in FIG. 4C, the reflective plate 12 can be fixed, being in contact with the display portion 71.

Figure 4C:
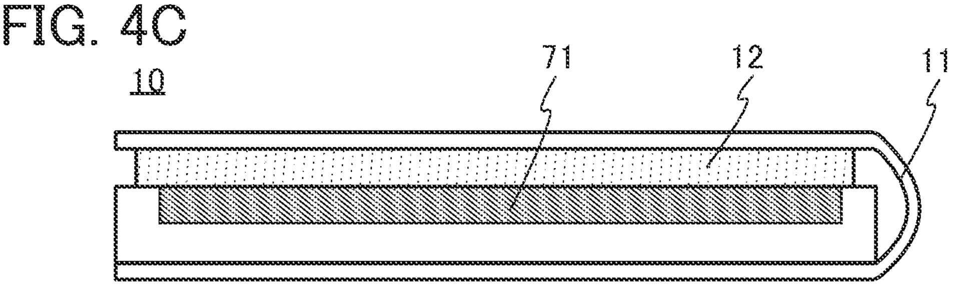
Figure 5:
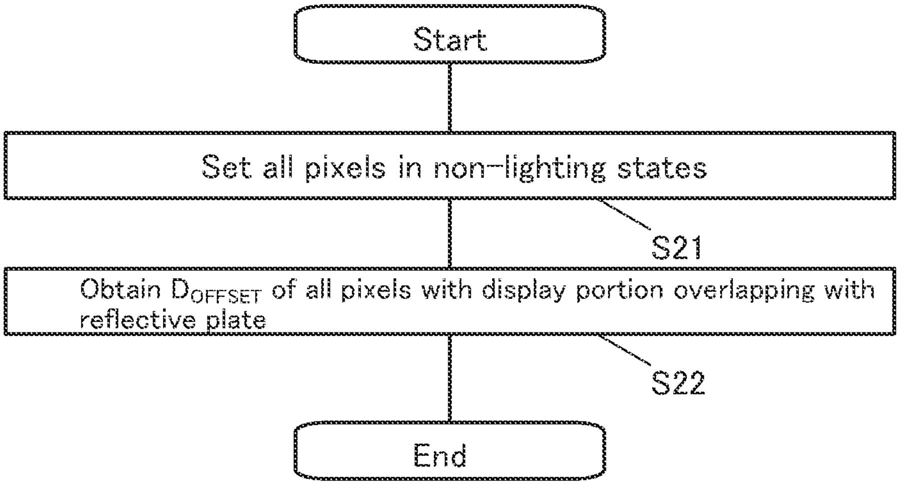
FIG. 5 is a flowchart of a display apparatus.

In the state illustrated in FIG. 4C, the influence of external light can be small as illustrated in FIG. 3B. In the step of obtaining offset continued from Step S21 in which all the pixels are not lit as illustrated in FIG. 5, $D_{PI}$ corresponding to a current flowing through the light-receiving device in a state where the reflective plate 12 overlaps with the display portion 71 and the influence of external light is small can be obtained in all the pixels as $D_{OFFSET}$ (Step S22). Note that $D_{PI}$ is obtained from pixels in one row at the same time, in which case higher speed can be obtained than in the case where $D_{PI}$ is obtained from each pixel, and noise of a selector or the like in obtaining data from each row can be reduced. When the white reflective plate 12 is provided to overlap with the display portion 71, the influence of external light can be reduced when $D_{PI}$ corresponding to a current flowing through the light-receiving device is obtained, so that reflected light of light from the light-emitting device can be received by the light-receiving device.

«Obtaining Luminance of Each Grayscale Level»

Next, a step of obtaining luminance of each grayscale level in each pixel will be described with reference to FIG. 6A to FIG. 7B.

$D_{OFFSET}$ of each pixel is obtained with the reflective plate 12 overlapping with the display portion 71 described with reference to FIG. 5, and then luminance of each grayscale level is obtained. Obtaining the luminance of each grayscale level is an operation of obtaining $D_{PI}$ that is data corresponding to a current flowing when the light-emitting devices included in subpixels of each pixel emit light of a single color and the light-receiving device receives light reflected by the reflective plate.

Figure 6A:
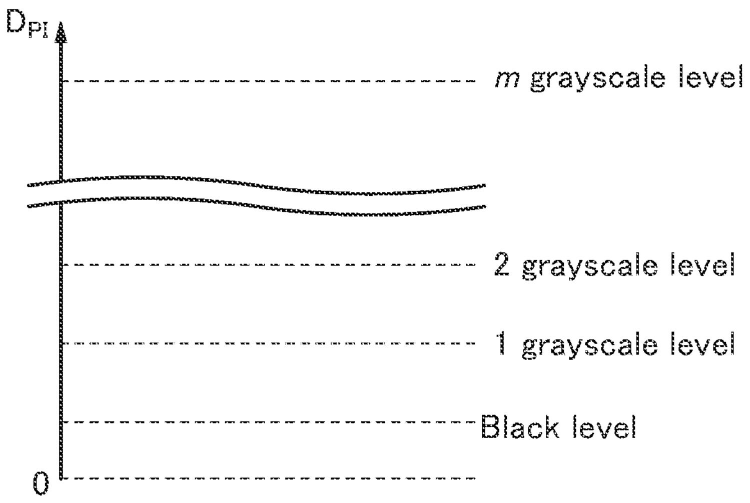
FIG. 6A and FIG. 6B are schematic views illustrating operation examples of a display apparatus.

For example, as illustrated in FIG. 6A, $D_{PI}$ is obtained that corresponds to a current flowing through the light-receiving device when video data corresponding to the grayscale level (a black level, a first grayscale level to an m grayscale level) is supplied to the light-emitting devices.

Figure 6B:
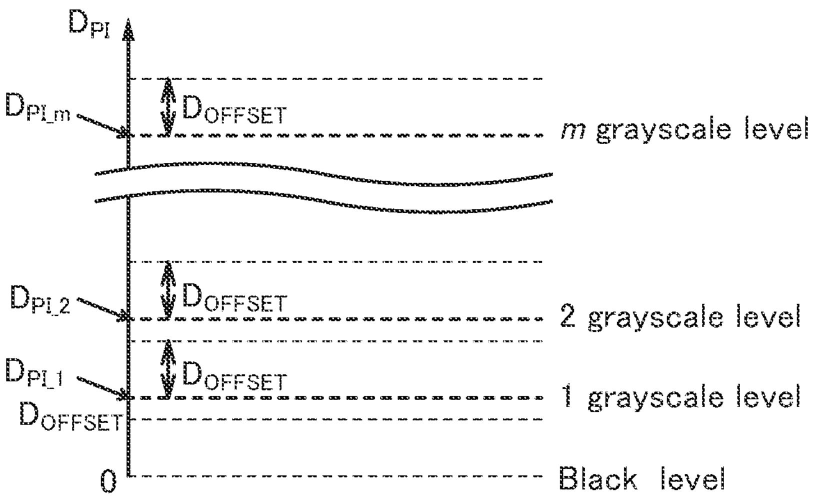

In obtaining $D_{PI}$ corresponding to the luminance of each grayscale level, which corresponds to obtaining the luminance of each grayscale level, $D_{PI}$ is preferably obtained as a value corrected with offset ($D_{OFFSET}$) in the light-receiving device of each pixel. With this structure, a method for correcting a display apparatus with high accuracy can be provided. Specifically, as illustrated in FIG. 6B, $D_{PI\_1}$ to $D_{PI\_m}$ obtained by offset correction of $D_{PI}$ of each grayscale level are obtained as current values corresponding to grayscale levels, for example. Note that $D_{PI\_1}$ to $D_{PI\_m}$ are data corresponding to the correction output data. The $D_{PI\_1}$ to $D_{PI\_m}$ can be calculated by the correction circuit 20 on the basis of the $D_{PI}$ and offset of each grayscale level.

Note that in the case where the obtained $D_{PI}$ is corrected, it is sometimes necessary that the driving noise in displaying on the display portion be subtracted as well as offset data. $D_{PI}$ is preferably obtained with the refresh rate of the display portion reduced to approximately 1 Hz, in which case the influence of the driving noise can be reduced. In order to reduce the refresh rate of the display portion, a transistor with a low off-state current such as a transistor including an oxide semiconductor in a channel formation region is preferably used as the transistor included in the subpixel.

Figure 7A:
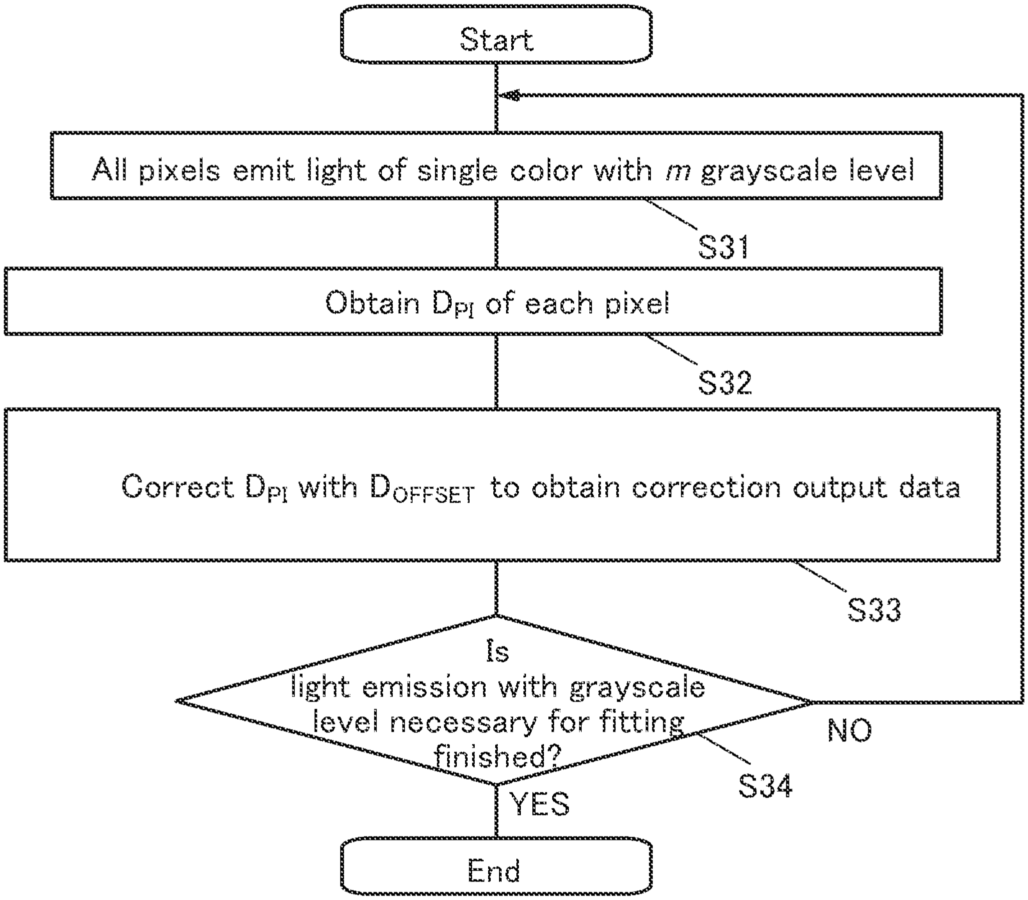
FIG. 7A is a flowchart illustrating an operation example of a display apparatus.
Figure 7B:
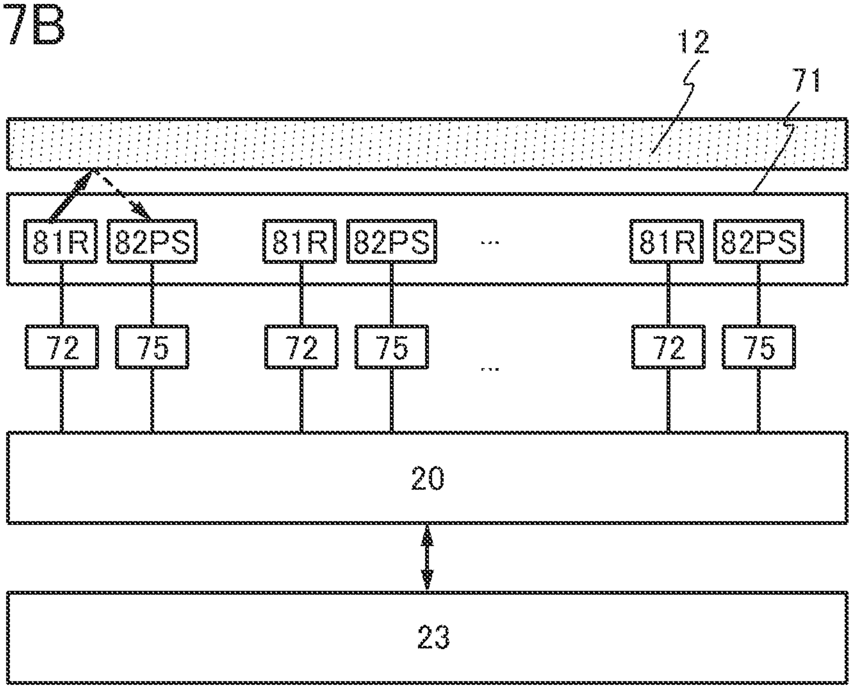
FIG. 7B is a block diagram illustrating an operation example of the display apparatus.

FIG. 7A is a flowchart illustrating a step of obtaining luminance of each grayscale level in each pixel including the above operation described with reference to FIG. 6A and FIG. 6B. FIG. 7B is a schematic cross-sectional view of a display apparatus for describing the operation in each step of the flowchart in FIG. 7A.

The light-emitting devices included in subpixels in all the pixels are made to emit light of a single color with an m grayscale level (Step S31). That is, in the structure of FIG. 1, a light-emitting device included in any one of the subpixels 81R, 81G, and 81B are made to emit light with video data corresponding to an m grayscale level. FIG. 7B illustrates a state where the signal line driver circuit 72 generates a video voltage in response to the video data output from the correction circuit 20 and the light-emitting device included in the subpixel 81R in the display portion 71 emits light in response to the voltage (the thick line arrow in the drawing). Light emitted from the light-emitting device is reflected by the reflective plate 12 and reflected light (the dotted arrow in the drawing) enters the light-receiving device included in the subpixel 82PS. Note that in the case where a plurality of subpixels each including the light-receiving device are provided in one pixel in accordance with light emitted from the light-emitting devices of each color, light emission of a single color in Step S31 may be performed at the same time as the light-emitting devices of a plurality of colors.

When light enters the light-receiving device of each pixel, a current flows through the light-receiving device included in the subpixel 82PS. The current is output to the correction circuit 20 as a digital signal through a circuit in the subpixel 82PS and the signal readout circuit 75 and is obtained as $D_{PI\_1}$ to $D_{PI\_m}$ corresponding to the luminance of each grayscale level (Step S32). That is, in the structure of FIG. 1, light corresponding to an m grayscale level is received by the light-receiving device included in the subpixel 82PS and data corresponding to a current corresponding to the received light is obtained.

The $D_{PI}$ obtained in Step S32 is corrected by $D_{OFFSET}$ in the correction circuit 20 to obtain $D_{PI\_1}$ to $D_{PI\_m}$, which are the correction output data (Step S33). The correction output data is stored in the memory circuit 23 together with video data corresponding to the grayscale level.

It is determined whether light emission with a grayscale level necessary for the fitting operation in Step S13 is finished (Step S34). For the determination, it is unnecessary to obtain N pieces of $D_{PI}$ when the number of all grayscale levels is N, and it is acceptable that coefficients of a quadratic expression obtained by fitting are obtained. Alternatively, the determination may be performed in a manner in which a required grayscale level is set as a value, or in a manner in which the grayscale level is changed (m is increased) until a fitting evaluation value (a value corresponding to an error) becomes lower than a certain value. The $D_{PI}$ of all the grayscale levels is not necessarily obtained, and $D_{PI}$ corresponding to light emission based on video data on the high grayscale level side can be thinned out. With this structure, the correction operation of the display apparatus can be performed in a short period.

«Fitting»

Figure 8A:
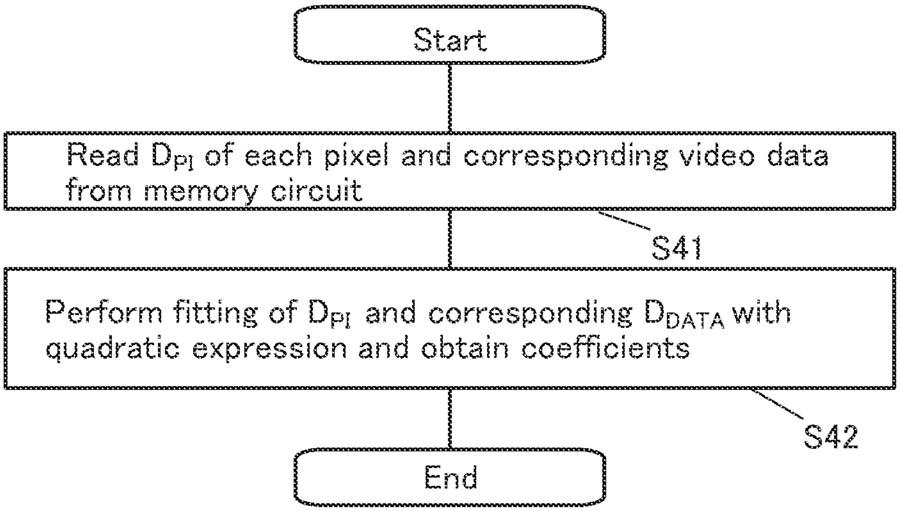
FIG. 8A is a flowchart illustrating an operation example of a display apparatus.
Figure 8B:
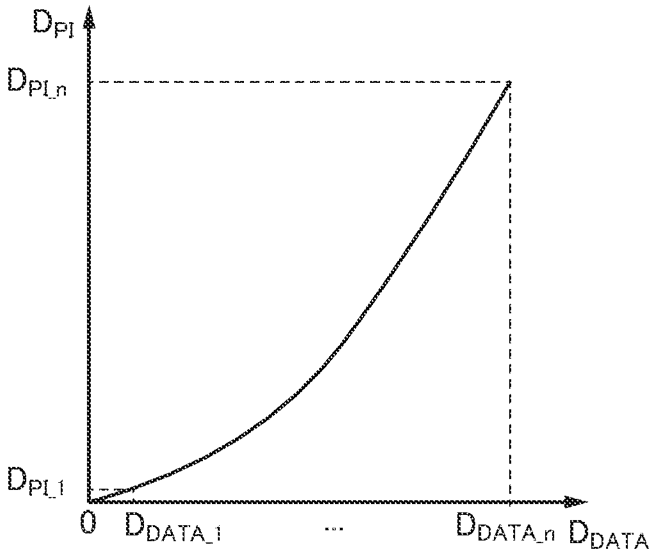
FIG. 8B is a schematic diagram illustrating an operation example of the display apparatus.

Next, with reference to FIG. 8A and FIG. 8B, a step in which $D_{PI}$ corresponding to the correction output data and video data corresponding to grayscale levels ($D_{DATA}$) are stored in the memory circuit 23 and the relation between $D_{PI}$ and $D_{DATA}$ is approximated by a quadratic expression (fitting) is described.

FIG. 8A is a flowchart for performing fitting, and FIG. 8B illustrates a schematic diagram of the quadratic expression to calculate coefficients by fitting.

The $D_{PI}$ corresponding to the luminance of the light-emitting device of each pixel and the corresponding video data ($D_{DATA}$) are read from the memory circuit 23 to the correction circuit 20 (Step S41). Next, coefficients that can be approximated by the quadratic expression are calculated on the basis of $D_{DATA}$ corresponding to $D_{PI}$ (Step S42). When the vertical axis represents $D_{PI}$ and the horizontal axis represents $D_{DATA}$, the quadratic expression can be represented by Expression (1). The coefficients to be calculated are α and β in Expression (1). The coefficients α and β are coefficients having different values for each pixel.

[Formula 3]

$$D_{PI} = \alpha(D_{DATA} - \beta)^2 \quad (1)$$

$D_{PI}$ shown in Expression (1) can be expressed by the coefficients α and β and video data ($D_{DATA}$). By solving Expression (1) for $D_{DATA}$, $D_{DATA}$ can be expressed by the coefficients α and β and $D_{PI}$ as shown in Expression (2).

[Formula 4]

$$D_{DATA} = \sqrt{\frac{D_{PI}}{\alpha}} + \beta \quad (2)$$

$D_{PI}$ is data depending on the luminance of the light-emitting device, and thus video data for obtaining the same luminance of light-emitting devices having different characteristics can be estimated by setting $D_{PI}$. Note that the video data ($D_{DATA}$) is digital data, and the video voltage output from the signal line driver circuit 72 corresponding to the digital data is corrected similarly; hence, a variation in luminance between the light-emitting devices supplied with the video voltage can also be corrected.

FIG. 8B is a schematic diagram of the quadratic expression showing the relation between $D_{DATA}$ and $D_{PI}$ in a given subpixel 81. For example, as illustrated in FIG. 8B, as in ($D_{PI\_1}$, $D_{DATA\_1}$) and ($D_{PI\_5}$, $D_{DATA\_5}$), a curve represented by the quadratic expression in the $D_{DATA}$-$D_{PI}$ coordinate can be fitted to a plurality of coordinates obtained in the previous step. As shown in the schematic diagram of the quadratic expression, video data $D_{DATA\_1}$ to $D_{DATA\_n}$ (n is the maximum grayscale level of video data) can be obtained from values ($D_{PI}$) corresponding to the luminance of a light-emitting device. The video data is corrected on the basis of the value ($D_{PI}$) corresponding to the luminance, so that the corrected video data can be obtained. Although FIG. 8B illustrates the structure in which a curve of the quadratic expression is fitted to the plurality of coordinates, another structure may be employed. For example, the $D_{DATA}$-$D_{PI}$ relation can be approximated by a plurality of linear expressions.

«Creation of Correction Table»

Next, a step of creating a correction table is described with reference to FIG. 9A and FIG. 9B.

Figure 9A:
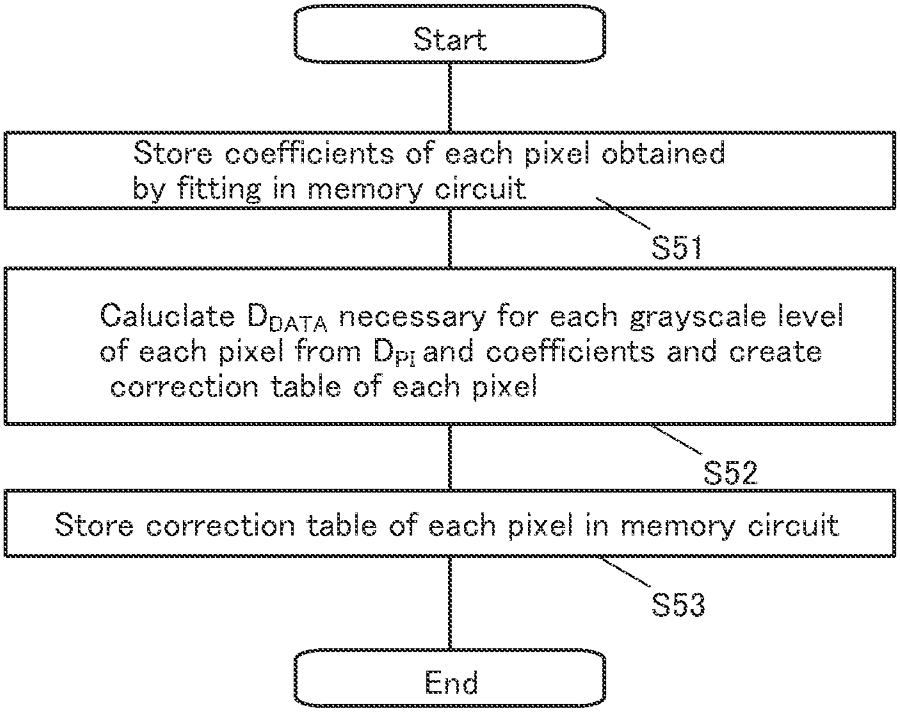
FIG. 9A is a flowchart illustrating an operation example of a display apparatus.
Figure 9B:
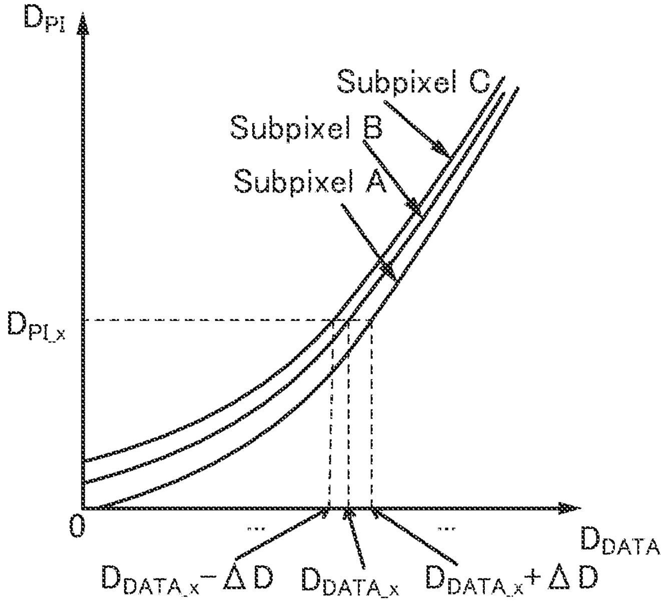
FIG. 9B is a schematic diagram illustrating an operation example of the display apparatus.

FIG. 9A is a flowchart for creating a correction table, and FIG. 9B illustrates a schematic view illustrating correction of video voltages in a subpixel A to a subpixel C having a variation in luminance (the subpixel A to the subpixel C are subpixels in different pixels that exhibit the same color).

In the correction circuit 20, the coefficients α and β of Expression (1) and Expression (2) obtained by fitting are stored in the memory circuit 23 (Step S51). Next, $D_{DATA}$ needed for each grayscale level is calculated from the value of $D_{PI}$ corresponding to the luminance of the light-emitting device of each subpixel and the coefficient of each pixel to create a correction table of each pixel (Step S52). Then, the created correction table is stored in the memory circuit 23 (Step S53).

FIG. 9B is a schematic view illustrating a case where video data is corrected so that the luminance of the subpixel A to the subpixel C exhibiting the same color, which have variations in characteristics of the light-emitting devices, is substantially the same luminance. In order to reduce a variation in luminance of the light-emitting devices in the subpixel A to the subpixel C, video data corresponding to the same grayscale level is preferably corrected so that the values of $D_{PI}$ corresponding to the luminance of the light-emitting devices can be equal.

For example, in FIG. 9B, a correction table is created, in which video data $D_{DATA}$ representing a grayscale level X corresponding to $D_{PI\_X}$ that is a value of $D_{PI}$ of the subpixel B is $D_{DATA\_X}$ as video data. In addition, a correction table is created, in which video data $D_{DATA}$ representing a grayscale level X corresponding to the $D_{PI\_X}$ that is a value of $D_{PI}$ of the subpixel A included in another pixel is $D_{DATA\_X}+\Delta D$ as video data. In addition, a correction table is created, in which video data $D_{DATA}$ representing a grayscale level X corresponding to the $D_{PI\_X}$ that is a value of $D_{PI}$ of the subpixel C included in another pixel is $D_{DATA\_X}-\Delta D$ as video data.

The correction table for performing correction such that video data exhibiting the same grayscale level in each pixel can be video data exhibiting the same luminance is created in this manner, in which case a variation in luminance between pixels can be corrected even in the display apparatus having a large number of pixels with higher definition. In the structure of one embodiment of the present invention, correction output data obtained when a light-receiving device receives light emitted from a light-emitting device included in a pixel is used; hence, a relative variation in luminance between pixels found in an inspection not only after shipment but also after shipment can be corrected. In the structure of one embodiment of the present invention, a light-receiving device is provided in each pixel, a signal corresponding to a variation in luminance between light-emitting devices included in pixels can be output as correction output data without dividing a screen into a plurality of areas and without scanning by an external camera, differently from an operation of capturing images of pixels; thus, the relative variation in luminance between pixels can be measured without increasing the number of times of image capturing, and correction data corresponding to the value can be generated.

Note that the correction table created can store a V-T curve of an analog voltage output from the grayscale voltage generation portion of the signal line driver circuit 72 versus a grayscale level as a gamma table in the memory circuit 23.

Structure Example of Pixel Circuit

FIG. 10A to FIG. 10D and FIG. 11A to FIG. 11D illustrate examples of a circuit diagram of a pixel circuit that can be used in the subpixel 81R, the subpixel 81G, and the subpixel 81B.

Figure 10A:
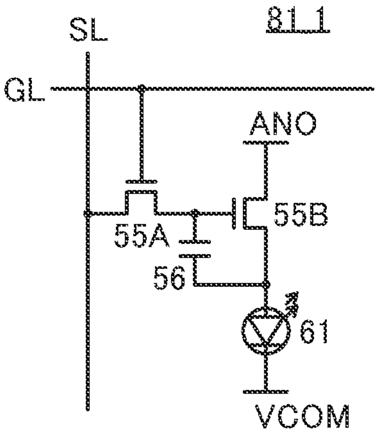
FIG. 10A to FIG. 10D are diagrams illustrating structure examples of a display apparatus.

A pixel circuit 81_1 illustrated in FIG. 10A includes a transistor 55A, a transistor 55B, and a capacitor 56. FIG. 10A illustrates a light-emitting device 61 connected to the pixel circuit 81_1. FIG. 10A also illustrates the wiring SL, the wiring GL, a wiring ANO, and a wiring VCOM.

A gate of the transistor 55A is electrically connected to the wiring GL, one of a source and a drain of the transistor 55A is electrically connected to the wiring SL, and the other of the source and the drain of the transistor 55A is electrically connected to a gate of the transistor 55B and one electrode of the capacitor 56. One of a source and a drain of the transistor 55B is electrically connected to the wiring ANO and the other of the source and the drain of the transistor 55B is electrically connected to an anode of the light-emitting device 61. The other electrode of the capacitor 56 is electrically connected to the anode of the light-emitting device 61. A cathode of the light-emitting device 61 is electrically connected to the wiring VCOM.

The transistor 55A functions as a switch. The transistor 55B functions as a transistor that controls current flowing through the light-emitting device 61.

Here, transistors each including silicon in a channel formation region (hereinafter referred to as Si transistors) are preferably used as the transistor 55A and the transistor 55B. Alternatively, it is preferable that a transistor including a metal oxide (hereinafter also referred to as an oxide semiconductor) in its channel formation region (hereinafter such a transistor is also referred to as an OS transistor) be used as the transistor 55A and a Si transistor be used as the transistor 55B.

As silicon, single crystal silicon, polycrystalline silicon, amorphous silicon, and the like can be given. A Si transistor has high field-effect mobility and favorable frequency characteristics. For example, a transistor including low-temperature polysilicon (LTPS) in its channel formation region (hereinafter such a transistor is also referred to as an LTPS transistor) can be used.

With the use of Si transistors, a circuit required to be driven at a high frequency (e.g., a source driver circuit) can be formed on the same substrate as the display portion. This allows simplification of an external circuit mounted on the display apparatus and a reduction in component cost and mounting cost.

The oxide semiconductor preferably contains indium, a metal M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin. It is particularly preferable to use an oxide containing indium, gallium, and zinc (also referred to as IGZO) for the semiconductor layer of the OS transistor. Alternatively, it is preferable to use an oxide containing indium, tin, and zinc. Further alternatively, it is preferable to use an oxide containing indium, gallium, tin, and zinc.

An OS transistor using an oxide semiconductor having a wider band gap and a lower carrier density than silicon can achieve an extremely low off-state current. Thus, such a low off-state current enables long-term retention of charge accumulated in a capacitor that is connected in series with the OS transistor. Therefore, it is particularly preferable to use an OS transistor as the transistor 55A which is connected in series with the capacitor 56. The use of the OS transistor as the transistor 55A can prevent leakage of charge retained in the capacitor 56 through the transistor 55A. Furthermore, since charge retained in the capacitor 56 can be retained for a long period, a still image can be displayed for a long period without rewriting data in the pixel circuit 81_1.

The off-state current value per micrometer of channel width of the OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than that of a Si transistor by approximately ten orders of magnitude.

For example, when both an LTPS transistor and an OS transistor are used for the transistor 55A and the transistor 55B, the display apparatus can have low power consumption and high drive capability. Note that a structure in which the LTPS transistor and the OS transistor are combined is referred to as LTPO in some cases. Note that as a more preferable example, it is preferable to use an OS transistor as a transistor or the like functioning as a switch for controlling electrical continuity between wirings and an LTPS transistor as a transistor or the like for controlling a current.

The light-emitting device 61 has a function of emitting light (hereinafter, also referred to as a light-emitting function). The light-emitting device 61 is preferably an organic EL device (organic electroluminescent device).

Figure 10B:
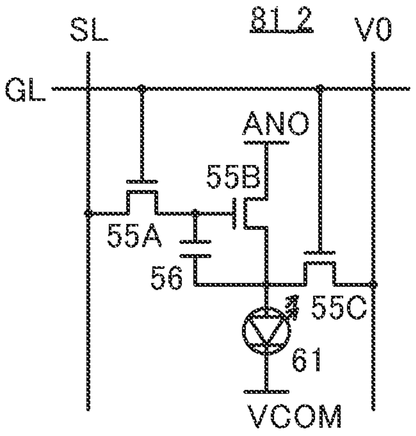

A pixel circuit 81_2 illustrated in FIG. 10B has a structure in which a transistor 55C is added to the pixel circuit 81_1. In addition, a wiring V0 supplying a constant potential is electrically connected to the pixel circuit 81_2.

Figure 10C:
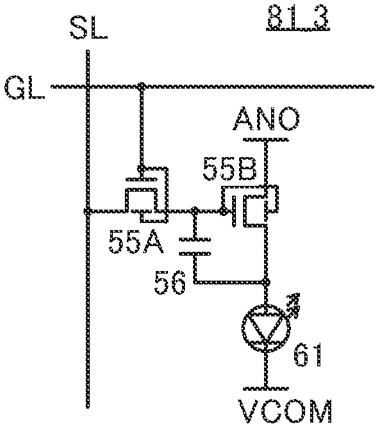
Figure 10D:
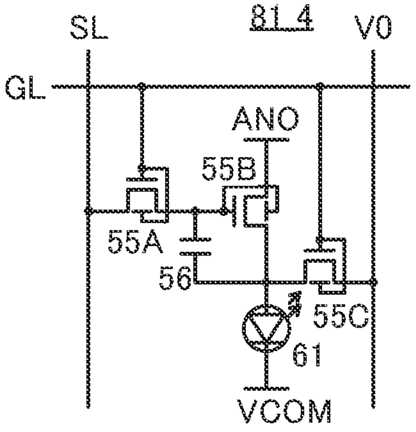

A pixel circuit 81_3 illustrated in FIG. 10C is an example in which a transistor including a pair of gates is used as the transistor 55A and the transistor 55B of the pixel circuit 81_3. A pixel circuit 81_4 illustrated in FIG. 10D is an example in which such transistors are used in the pixel circuit 81_2. Note that although a transistor including a pair of gates is used for each of the transistors here, one embodiment of the present invention is not limited thereto.

In the transistor including a pair of gates, the same potential is supplied to the pair of gates electrically connected to each other, which brings advantage that the transistor can have a higher on-state current and improved saturation characteristics. A potential for controlling the threshold voltage of the transistor may be supplied to one of the pair of gates. Furthermore, when a constant potential is supplied to one of the pair of gates, the stability of the electrical characteristics of the transistor can be improved. For example, one of the gates of the transistor may be electrically connected to a wiring to which a constant potential is supplied or may be electrically connected to a source or a drain of the transistor.

Figure 11A:
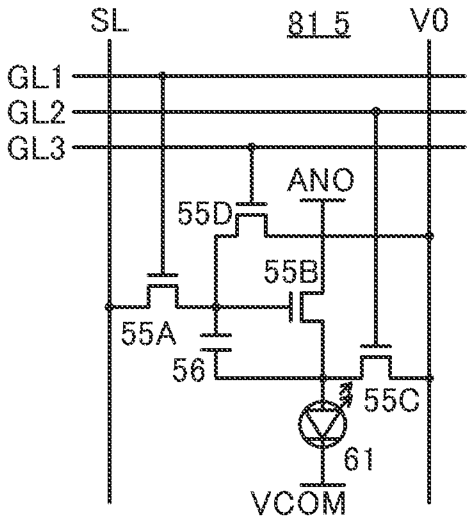
FIG. 11A to FIG. 11D are diagrams illustrating structure examples of a display apparatus.

A pixel circuit 81_5 illustrated in FIG. 11A has a structure in which a transistor 55D is added to the pixel circuit 81_2. Three wirings (a wiring GL1, a wiring GL2, and a wiring GL3) functioning as gate lines are electrically connected to the pixel circuit 81_5.

A gate of the transistor 55D is electrically connected to the wiring GL3, one of a source and a drain of the transistor 55D is electrically connected to the gate of the transistor 55B, and the other of the source and the drain of the transistor 55D is electrically connected to the wiring V0. The gate of the transistor 55A is electrically connected to the wiring GL1, and the gate of the transistor 55C is electrically connected to the wiring GL2.

When the transistor 55C and the transistor 55D are brought into conduction states at the same time, the source and the gate of the transistor 55B have the same potential, so that the transistor 55B can be bring into a non-conduction state. Thus, current flowing through the light-emitting device 61 can be blocked forcibly. Such a pixel circuit is suitable for the case of using a display method in which a display period and a non-lighting period are alternately provided.

Figure 11B:
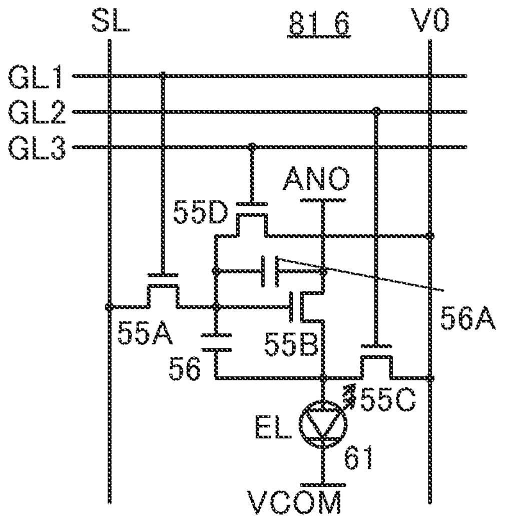

A pixel circuit 81_6 illustrated in FIG. 11B is an example of the case where a capacitor 56A is added to the pixel circuit 81_5. The capacitor 56A functions as a storage capacitor.

Figure 11C:
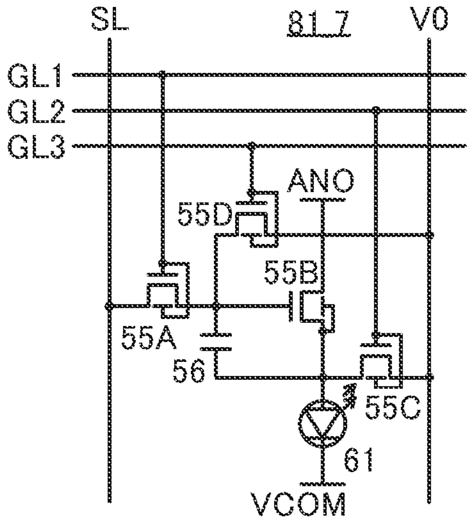
Figure 11D:
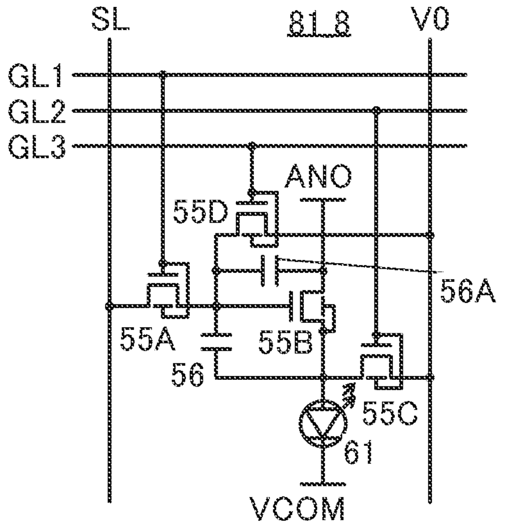

A pixel circuit 81_7 illustrated in FIG. 11C is an example where a transistor including a pair of gates is used in the pixel 81_5. A pixel circuit 81_8 illustrated in FIG. 11D is an example of the case where transistors including a pair of gates are used in the pixel circuit 81_6. A transistor in which a pair of gates are electrically connected to each other is used as each of the transistor 55A, the transistor 55C, and the transistor 55D, and a transistor in which one of gates is electrically connected to a source is used as the transistor 55B.

Next, FIG. 12A to FIG. 12F illustrate examples of circuit diagrams of pixel circuits that can be used in the subpixel 82PS. FIG. 12A to FIG. 12F illustrate the wiring RS and the wiring TX in addition to the wiring SE and the wiring WX. The wiring SE is, for example, a wiring transmitting a selection signal for reading data from the pixel circuit. The wiring RS is, for example, a wiring transmitting a reset signal for initializing the pixel circuit. The wiring WX is, for example, a wiring transmitting a signal read from the pixel circuit. The wiring TX is, for example, a wiring transmitting a transmission signal for controlling a current flowing to the light-receiving device 62. The pixel circuit that can be used in the subpixel 82PS is connected to a wiring transmitting a constant potential.

Figure 12A:
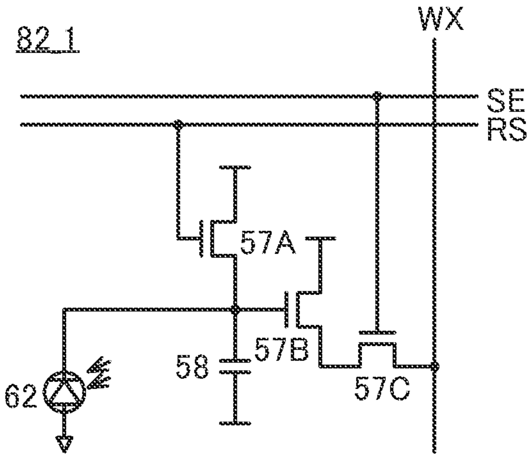
FIG. 12A to FIG. 12F are diagrams illustrating structure examples of a display apparatus.

A pixel circuit 82_1 illustrated in FIG. 12A includes a transistor 57A, a transistor 57B, a transistor 57C, and a capacitor 58, and the transistors and the capacitor are electrically connected to each other as illustrated in FIG. 12A. FIG. 12A also illustrates the light-receiving device 62 connected to the pixel circuit 82_1.

Figure 12B:
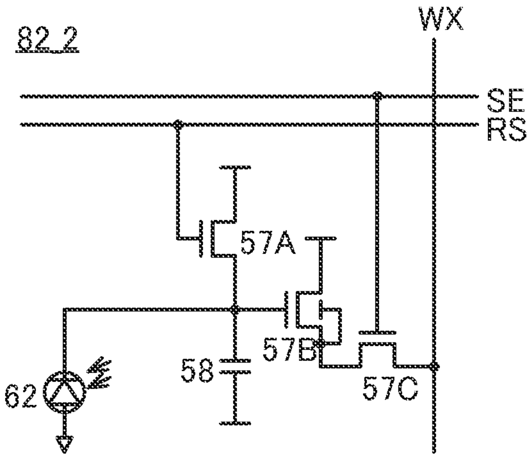
Figure 12C:
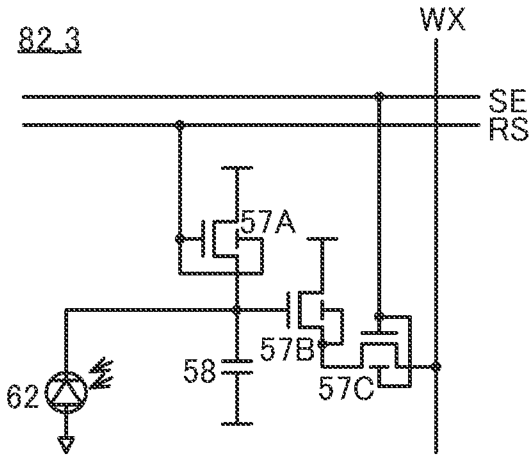
Figure 12D:
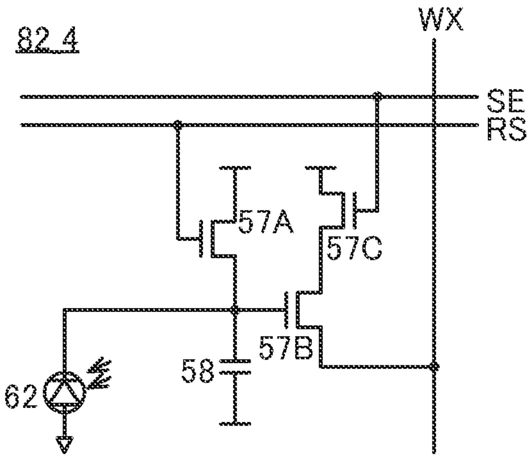
Figure 12E:
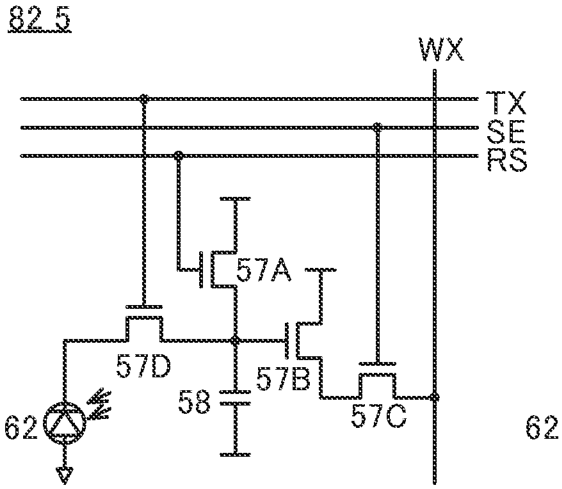

A pixel circuit 82_2 illustrated in FIG. 12B has a structure in which the transistor 57B in the pixel circuit 82_1 includes a pair of gates. A pixel circuit 82_3 illustrated in FIG. 12C is an example in which transistors each including a pair of gates are used as each of the transistor 57A to the transistor 57C in the pixel circuit 82_2. A pixel circuit 82_4 illustrated in FIG. 12D is an example in which the position of the transistor 57C is changed. A pixel circuit 82_5 illustrated in FIG. 12E is an example in which a transistor 57D is added.

Figure 12F:
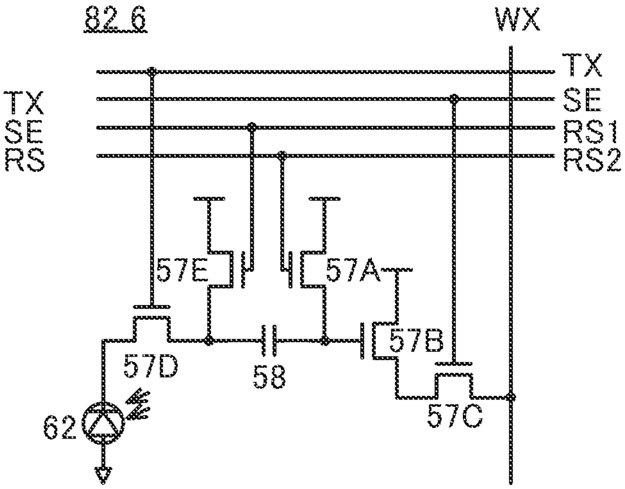

A pixel circuit 82_6 illustrated in FIG. 12F is an example in which the transistor 57D and the transistor 57E are added and the capacitor 58 is positioned between the transistor 57D and the transistor 57B. In the structure of the pixel circuit 82_6 illustrated in FIG. 12F, wirings RS1 and RS2 functioning as wirings RS are provided and the transistor 57A and the transistor 57E are controlled at different timings. With this structure, different voltages can be supplied to both ends of the capacitor 58, so that the level of output based on photocurrent flowing through the light-receiving device can be shifted.

As described above, in the display apparatus and the correction method of one embodiment of the present invention, a correction table for correcting video data can be created using correction output data corresponding to a current flowing through the light-receiving device included in a subpixel including a light-receiving device provided for each pixel. Thus, a structure can be employed in which a variation in luminance between pixels can be corrected even in a display apparatus with a large number of pixels with higher definition. In addition, in the display apparatus and the correction method of one embodiment of the present invention, the correction output data obtained when the light-receiving device receives light emitted from the light-emitting device included in the pixel is used; hence, a relative variation in luminance between pixels found in an inspection not only after shipment but also after shipment can be corrected. In the display apparatus and the correction method of one embodiment of the present invention, a light-receiving device is provided in each pixel, a signal corresponding to a variation in luminance between light-emitting devices included in pixels can be output as correction output data without dividing a screen into a plurality of areas and without scanning by an external camera, differently from an operation of capturing images of pixels without scanning by an external camera; thus, the relative variation in luminance between pixels can be measured without increasing the number of times of image capturing, and correction data corresponding to the value can be generated.

This embodiment can be combined with any of the other embodiments as appropriate. In this specification, in the case where a plurality of structure examples are shown in one embodiment, the structure examples can be combined as appropriate.

Embodiment 2

In this embodiment, a structure different from the structure of the correction method described in Embodiment 1 will be described. In the structure of this embodiment, the description of portions in Embodiment 1 can be referred to for portions similar to those in Embodiment 1, and detailed description of the portions is omitted.

<Correction Method of Video Data>

Figure 13:
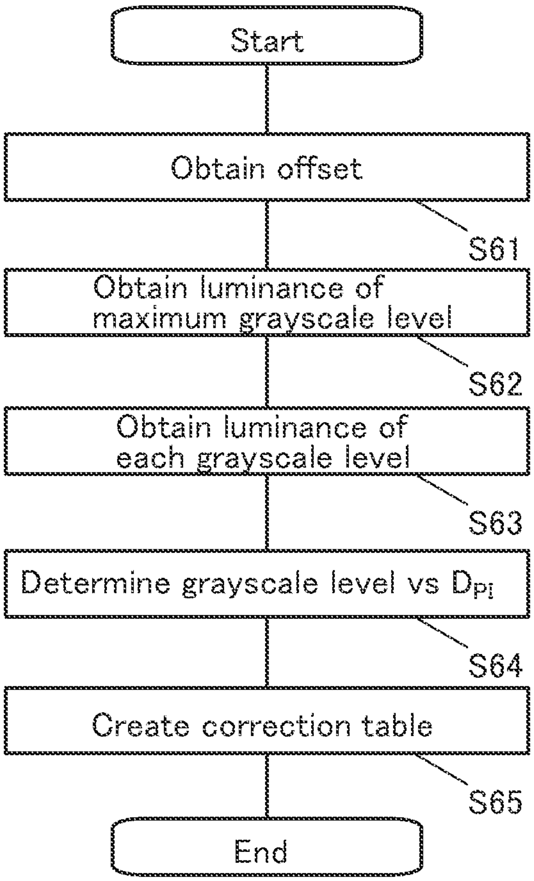
FIG. 13 is a flowchart showing an operation example of a display apparatus.

FIG. 13 to FIG. 19B are diagrams illustrating a method for correcting video data in the display apparatus illustrated in FIG. 1 and the like. FIG. 13 is a flowchart for describing a method for correcting video data in the display apparatus in the correction circuit 20 including the video data correction circuit 21.

In the correction method of video data, a step of obtaining offset is performed (Step S61). Here, the offset is data corresponding to a current flowing through the light-receiving device included in a subpixel when the subpixel including a light-emitting device is brought into a non-lighting state in a state where the external light is weak. Note that in the structure of this embodiment, offset is obtained in a state where the voltages of wirings connected to the subpixels are adjusted so that all the pixels perform black display. The offset can be read from a subpixel including a light-receiving device in the signal readout circuit 75, can be output as digital data to the correction circuit 20, and can be retained in the memory circuit 23. Note that in the following description, offset is sometimes described as the value of current flowing through a light-receiving device included in a subpixel.

In the correction method of video data, the step of obtaining luminance of the maximum grayscale level in each pixel is performed (Step S62). Here, the step of obtaining luminance of the maximum grayscale level means to obtain data corresponding to a current flowing through the light-receiving device included in a subpixel when video data for light emission at the maximum luminance is supplied to a light-emitting device included in the subpixel. The data can be read from the subpixel including a light-receiving device with the signal readout circuit 75, can be output to the correction circuit 20 as digital data, and can be retained in the memory circuit 23. Data obtained in Step S62 can be obtained as a value to be corrected with offset obtained in Step S61.

In the correction method of video data, a step of obtaining luminance every grayscale level is performed (Step S63). Here, the step of obtaining luminance means to obtain data corresponding to a current flowing through a light-receiving device included in a subpixel when a light-emitting device of the subpixel including the light-emitting device is brought into a lighting state in a given grayscale level. The data can be read from the subpixel including the light-receiving device with the signal readout circuit 75, be output to the correction circuit 20 as digital data, and be retained in the memory circuit 23. Data obtained in Step S63 can be obtained as a value to be corrected with offset obtained in Step S61. Data obtained by correcting the data obtained in Step S63 with offset serves as correction output data. For example, if the number of grayscale levels of the subpixel including a light-emitting device is N grayscale levels (referred to as a maximum grayscale level N), first correction output data to m-th correction output data corresponding to the number of grayscale levels are obtained as the correction output data on a pixel-to-pixel basis. That is, the correction output data corresponding to all the grayscale levels is obtained in each pixel.

In the correction method of video data, correction video data ($D_{PI}$) corresponding to each grayscale level is determined (Step S64). The correction video data ($D_{PI}$) corresponding to each grayscale level is shown as grayscale level vs $D_{PI}$. When $D_{PI}$ corresponding to each grayscale level is determined, video data (correction video data) corresponding to data corresponding to a current flowing through the light-receiving device in each pixel is determined. The correction video data ($D_{PI}$) corresponding to each grayscale level is stored in the memory circuit 23. In the case where $D_{PI}$ corresponding to each grayscale level is determined in each pixel, the determination is performed on the basis of a value obtained by dividing $D_{PI}$ corresponding to luminance of the maximum grayscale level obtained in Step S62 by the number of grayscale levels.

In the correction method of video data, a correction table corresponding to $D_{PI}$ is created from $D_{PI}$ corresponding to the gray scale levels obtained in Step S64 and video data corresponding to $D_{PI}$ obtained in each pixel (Step S65). The correction table is a table for correcting video data (display video data), and can convert video data that is yet to be corrected can be converted into corrected video data. The correction table is created for each pixel.

«Obtaining Offset»

Figure 14:
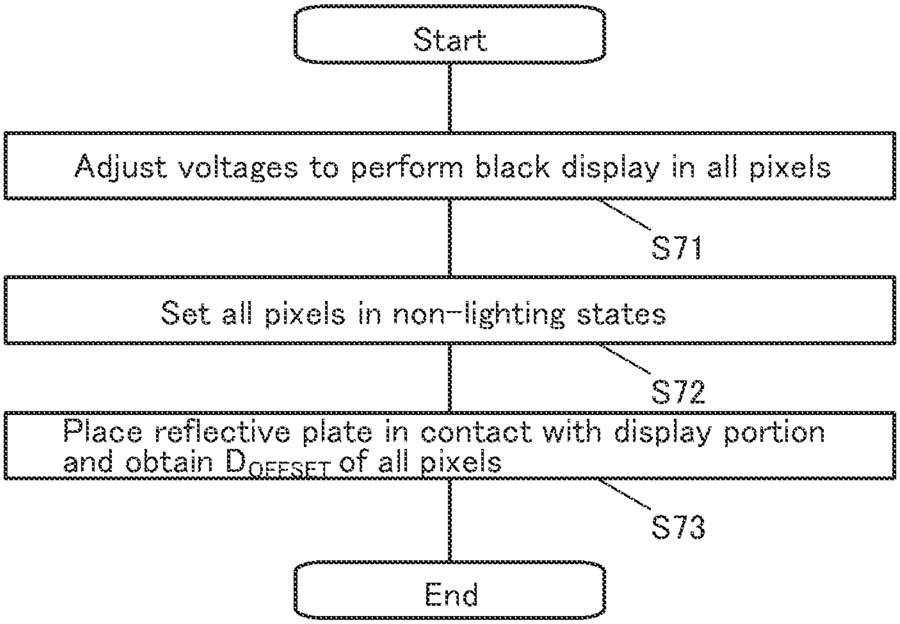
FIG. 14 is a flowchart showing an operation example of a display apparatus.

Next, Step S61 of obtaining offset is described with reference to FIG. 14. FIG. 14 is a flowchart for describing the details of Step S61 of obtaining offset.

In the step of obtaining offset of Step S61, voltage is adjusted so as to perform black display in all the pixels (Step S71). The voltage adjustment is performed in a manner in which a video voltage output from the grayscale voltage generation portion of the signal line driver circuit 72 is lowered so that a current flowing between an anode and a cathode of a light-emitting device included in a subpixel can be zero. Alternatively, a structure may be employed in which a video voltage is lowered until the luminance is below the measurement lower limit of a luminance meter. Alternatively, a reference voltage supplied to the subpixel may be adjusted so that a current flowing between the anode and the cathode of the light-emitting device included in the subpixel may be zero.

After Step S71 for adjusting the voltages to perform black display with all the pixels, all the pixels are not lit (Step S72).

After Step S72 in which all the pixels are not lit, the reflective plate 12 is placed to overlap with the display portion 71 so that the influence of external light is small, and $D_{PI}$ corresponding to current flowing through the light-receiving device is obtained as $D_{OFFSET}$ in each of all the pixels (Step S73).

In order to obtain a state where the influence of external light is small in Step S61, a reflective plate is preferably provided to cover the display portion as described above with reference to FIG. 4A to FIG. 4C in Embodiment 1. With this structure, a correction method for the display apparatus that can correct video data with higher accuracy can be obtained.

«Obtaining Luminance of Maximum Grayscale Level»

Figure 15A:
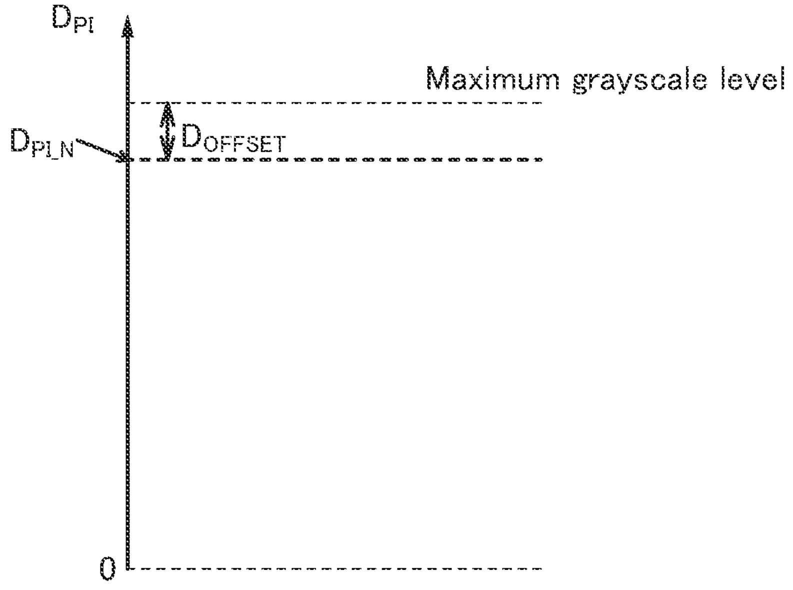
FIG. 15A is a schematic diagram illustrating an operation example of a display apparatus.
Figure 15B:
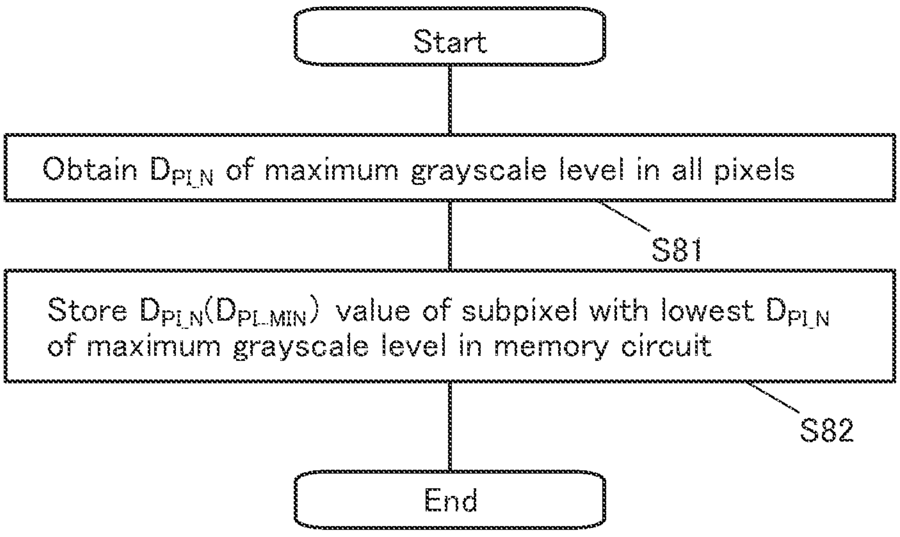
FIG. 15B is a flowchart illustrating the operation example of the display apparatus.

Next, with reference to FIG. 15A and FIG. 15B, Step S62 of obtaining the luminance of the maximum grayscale level in each pixel is described.

Obtaining the luminance of the maximum grayscale level is an operation of obtaining data corresponding to current flowing when the light-emitting devices included in subpixels of each pixel are supplied with video data of the maximum grayscale level to emit light of a single color and the light-receiving device receives light reflected by the reflective plate. Note that even in the operation, the luminance of the maximum grayscale level is obtained with the reflective plate 12 overlapping with the display portion 71.

For example, $D_{PI}$ corresponding to a current flowing through a light-receiving device when video data corresponding to the maximum grayscale level (the total number of grayscale levels when the number of grayscale levels is N, also referred to as a maximum grayscale level N) is supplied to a light-emitting device is obtained as $D_{PI\_N}$. In obtaining $D_{PI}$ corresponding to the luminance of the maximum grayscale level, which corresponds to obtaining the luminance of the maximum grayscale level, a value corrected with offset ($D_{OFFSET}$) in the light-receiving device of each pixel is preferably as $D_{PI\_N}$. With this structure, a method for correcting a display apparatus with high accuracy can be obtained. Specifically, as illustrated in FIG. 15A, $D_{PI\_N}$ obtained by offset correction of $D_{PI}$ of each grayscale level is obtained as data obtained in the step of obtaining the luminance of the maximum grayscale level, for example.

Note that in the case where the obtained $D_{PI\_N}$ is corrected, it is sometimes necessary that the driving noise in displaying an image on the display portion be subtracted as well as the offset data. $D_{PI}$ is preferably obtained with the refresh rate of the display portion reduced to approximately 1 Hz, in which case the influence of the driving noise can be reduced. In order to reduce the refresh rate of the display portion, a transistor with a low off-state current such as a transistor including an oxide semiconductor in a channel formation region is preferably used as the transistor included in a subpixel.

FIG. 15B is a flowchart for describing a step of obtaining the luminance of the maximum grayscale level in each pixel described with reference to FIG. 15A.

When the light-emitting devices included in the subpixels 81R (or 81G or 81B, also referred to as the subpixel 81) in all the pixels are made to emit light of a single color at the maximum grayscale level, and light enters the light-receiving device of each pixel, a current flows through the light-receiving device included in the subpixel 82PS. The current is output to the correction circuit 20 as a digital signal through a circuit in the subpixel 82PS and the signal readout circuit 75 and obtained as $D_{PI\_N}$ corresponding to the luminance of the maximum grayscale level (Step S81). In the structure of FIG. 1, a light-emitting device included in any one of the subpixels 81R, 81G, and 81B is made to emit light with video data corresponding to the maximum grayscale level. Note that in the case where a plurality of subpixels each including the light-receiving device are provided in one pixel in accordance with light emitted from the light-emitting devices of each color, light emission of a single color in Step S81 may be performed at the same time as the light-emitting devices of a plurality of colors.

The $D_{PI\_X}$ obtained in Step S81 is obtained for each subpixel. By comparing $D_{PI\_N}$ of the subpixels, the value of the $D_{PI\_N}$ of the subpixel having the lowest $D_{PI\_N}$ is stored in the memory circuit 23 as $D_{PI\_MIN}$ (Step S82).

«Obtaining Luminance of Each Grayscale Level»

Next, Step S63 of obtaining the luminance of each grayscale level in each pixel will be described with reference to FIG. 16.

The step of obtaining the luminance of each grayscale level performed in Step S63 is an operation of obtaining data corresponding to a current flowing when the light-emitting device included in a subpixel of each pixel is supplied with video data of a given grayscale level to emit light of a single color and the light-receiving device receives light reflected by the reflective plate, and obtaining correction output data corresponding to all grayscale levels. Note that also in the operation, the luminance of a given grayscale level is obtained with the reflective plate 12 overlapping with the display portion 71.

Figure 16:
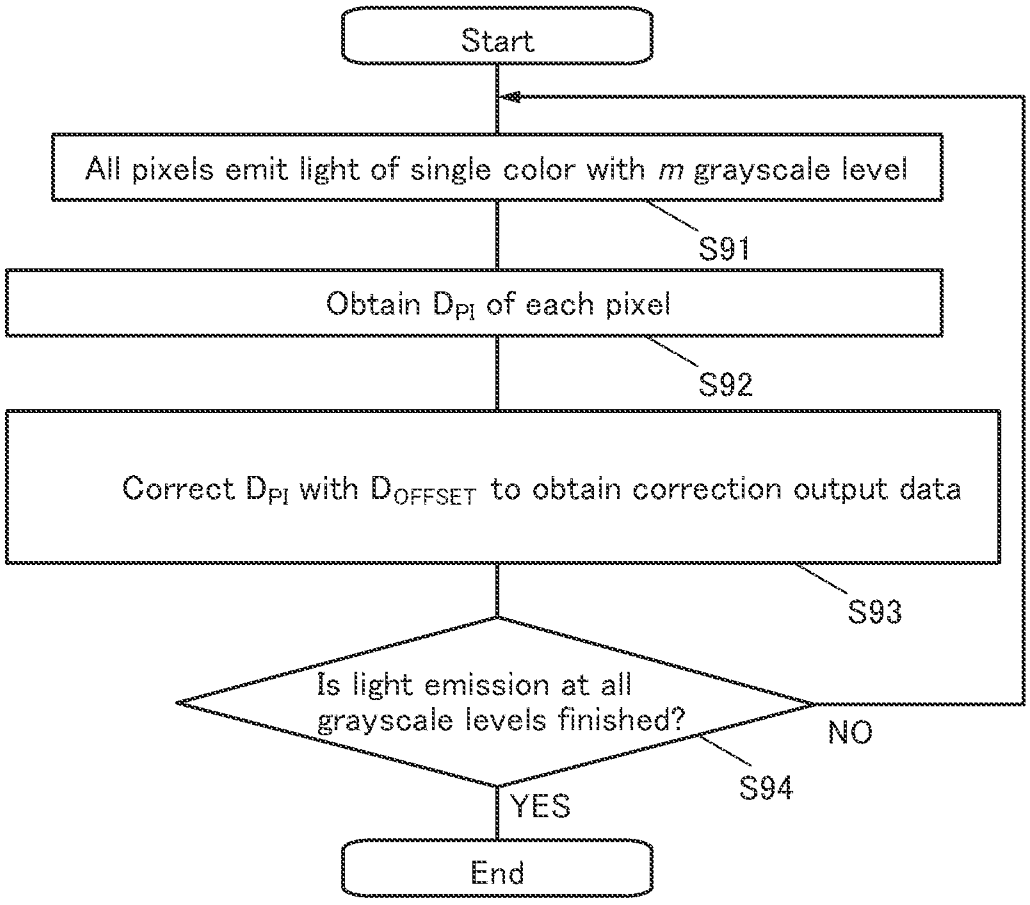
FIG. 16 is a flowchart illustrating an operation example of a display apparatus.

FIG. 16 is a flowchart for describing a step of obtaining the luminance of each grayscale level in each pixel when the correction output data corresponding to all the grayscale levels is obtained.

The light-emitting devices included in the subpixels in all the pixels are made to emit light of a single color with m grayscale levels (Step S91). Note that in the case where a plurality of subpixels each including the light-receiving device are provided in one pixel in accordance with light emitted from the light-emitting devices of each color, light emission of a single color in Step S91 may be performed at the same time as the light-emitting devices of a plurality of colors.

When light enters the light-receiving device of each pixel, a current flows through the light-receiving device included in the subpixel 82PS. The current is output to the correction circuit 20 as a digital signal through a circuit in the subpixel 82PS and the signal readout circuit 75 and obtained as $D_{PI}$ corresponding to the luminance of each grayscale level (Step S92).

The $D_{PI}$ obtained in Step S92 is corrected with $D_{OFFSET}$ in the correction circuit 20 and the correction output data is obtained (Step S93). The correction output data is stored in the memory circuit 23 together with video data corresponding to the grayscale level.

It is determined whether light emission at all grayscale levels is finished (Step S94). With this structure, video data information corresponding to the luminance obtained in the light-receiving device is obtained in each pixel. Note that $D_{PI}$ obtained in Step S92 may be obtained in response to a video voltage output from the signal line driver circuit 72. With this structure, a variation in luminance between the light-emitting devices can be corrected with high accuracy.

Note that the luminance of the maximum grayscale level may be obtained in a step of obtaining the luminance of each grayscale level. For example, a structure may be employed in which the luminance of each grayscale level is obtained in ascending order and the luminance corresponding to the maximum grayscale level is obtained last. With this structure, the step of obtaining the luminance corresponding to the maximum grayscale level, which is repeated operation, can be omitted.

«Determination of $D_{PI}$ Corresponding to Grayscale Level»

Next, Step S64 of determining $D_{PI}$ corresponding to a grayscale level is described with reference to FIG. 17, FIG. 18A, and FIG. 18B.

Figure 17:
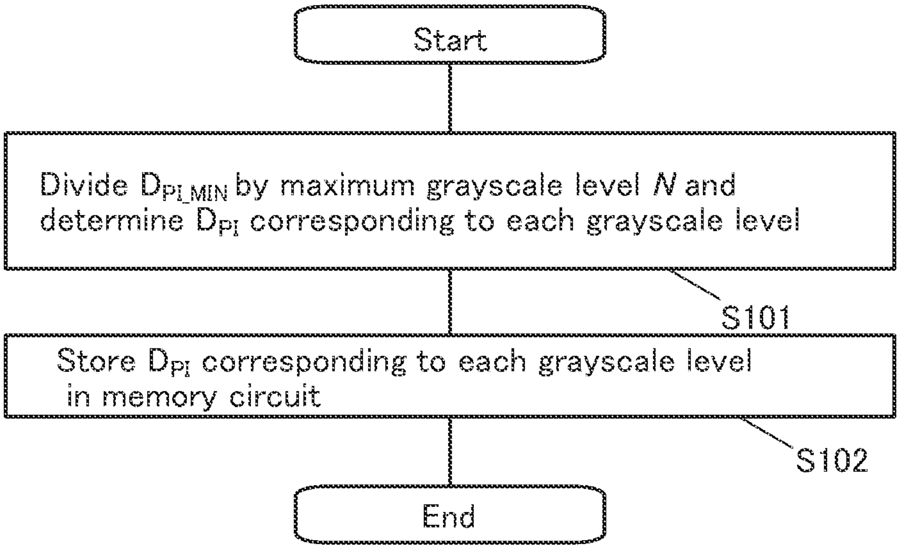
FIG. 17 is a flowchart illustrating an operation example of a display apparatus.

FIG. 17 is a flowchart for determining $D_{PI}$ corresponding to a grayscale level.

$D_{PI}$ ($D_{PI\_MIN}$) in the subpixel 81 having a low luminance at the maximum grayscale level obtained in Step S62 is divided by N (N is a number corresponding to the maximum grayscale level) and $D_{PI}$ corresponding to each grayscale level is determined (Step S101). That is, $D_{PI}$ corresponding to each grayscale level is determined with the subpixel 81 having the lowest luminance in the display portion set as a benchmark. With this structure, a variation in luminance between the other subpixels can be corrected with the subpixel with a low luminance set as a benchmark. $D_{PI}$ corresponding to the grayscale level is stored in the memory circuit 23 (Step S102).

Figure 18A:
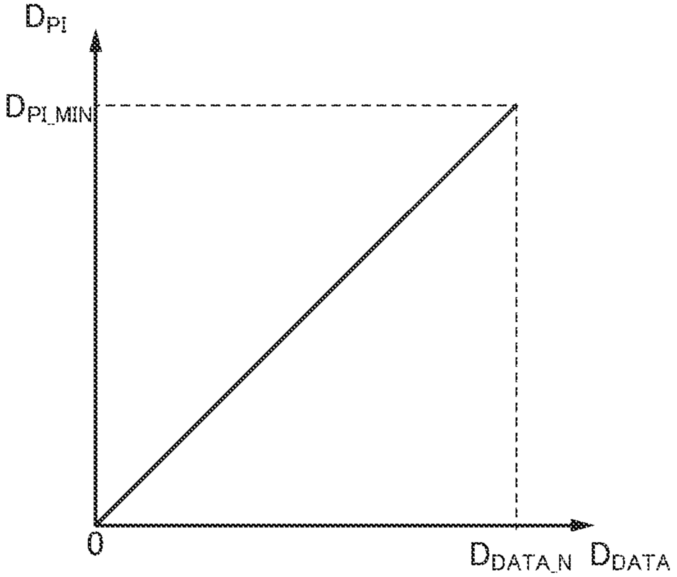
FIG. 18A and FIG. 18B are schematic views illustrating operation examples of a display apparatus.

FIG. 18A illustrates a schematic diagram of a graph showing the relation between $D_{DATA\_N}$ and $D_{PI\_MIN}$ in the subpixel 81 with a low luminance at the maximum grayscale level, which is obtained in the flowchart in FIG. 17. As illustrated in FIG. 18A, the relation between $D_{PI}$ and $D_{DATA}$ can be expressed with $D_{PI\_MIN}$ and the corresponding video data $D_{DATA\_N}$.

Figure 18B:
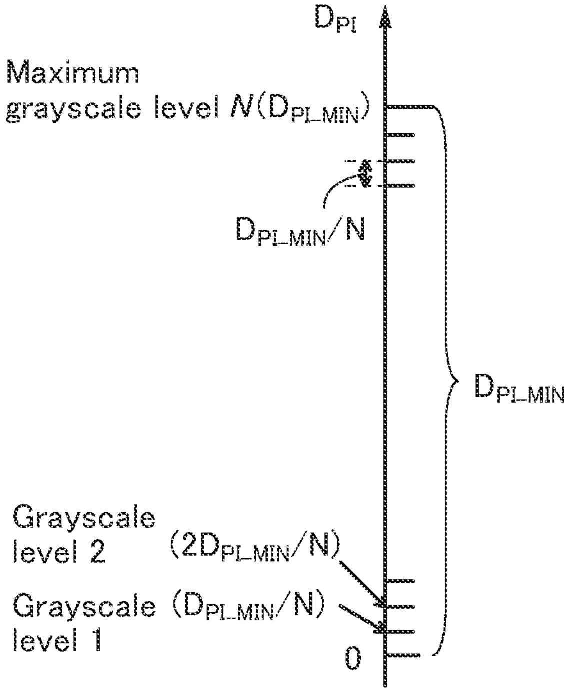

FIG. 18B is a diagram illustrating $D_{PI}$ corresponding to a grayscale level on the basis of $D_{PI\_MIN}$. As illustrated in FIG. 18B, $D_{PI\_MIN}$ corresponding to the luminance of the maximum grayscale level of the subpixel with the lowest $D_{PI\_N}$ can represent one grayscale level with $D_{PI\_MIN}$/N, which is divided by the maximum grayscale level N. $D_{PI}$ corresponding to the grayscale level can be obtained on the basis of the magnitude of the one grayscale level. For example, $D_{PI}$ representing the grayscale level 1 can be represented by $D_{PI\_MIN}$/N, and $D_{PI}$ representing the grayscale level 2 can be represented by 2 $D_{PI\_MIN}$/N. The magnitude from the black display (0) to N can be expressed by $D_{PI\_MIN}$. $D_{PI}$ of the subpixel with a low luminance is a benchmark of $D_{PI}$ corresponding to grayscale levels in all the other subpixels, and thus the $D_{PI}$ can be a benchmark of correcting a variation in luminance.

Note that in the description of the structure of FIG. 17, FIG. 18A, and FIG. 18B, $D_{PI\_MIN}$ is divided simply by the number of grayscale levels N to give the magnitude of one grayscale level in order to obtain $D_{PI}$ corresponding to the grayscale level for $D_{PI\_MIN}$ corresponding to the luminance of the maximum grayscale level of the subpixel with the lowest $D_{PI\_N}$; however, one embodiment of the present invention is not limited thereto. For example, $D_{PI}$ representing the grayscale level 1 may be set to a given value, e.g., to a higher value than the $D_{PI\_MIN}$/N.

«Creation of Correction Table»

Next, a step of creating a correction table is described with reference to FIG. 19A and FIG. 19B.

Figure 19A:
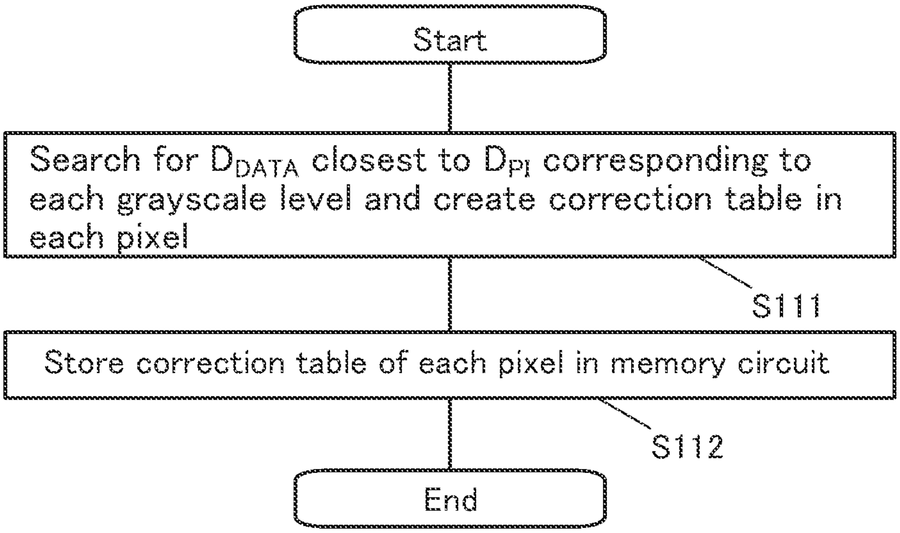
FIG. 19A is a flowchart illustrating an operation example of a display apparatus.
Figure 19B:
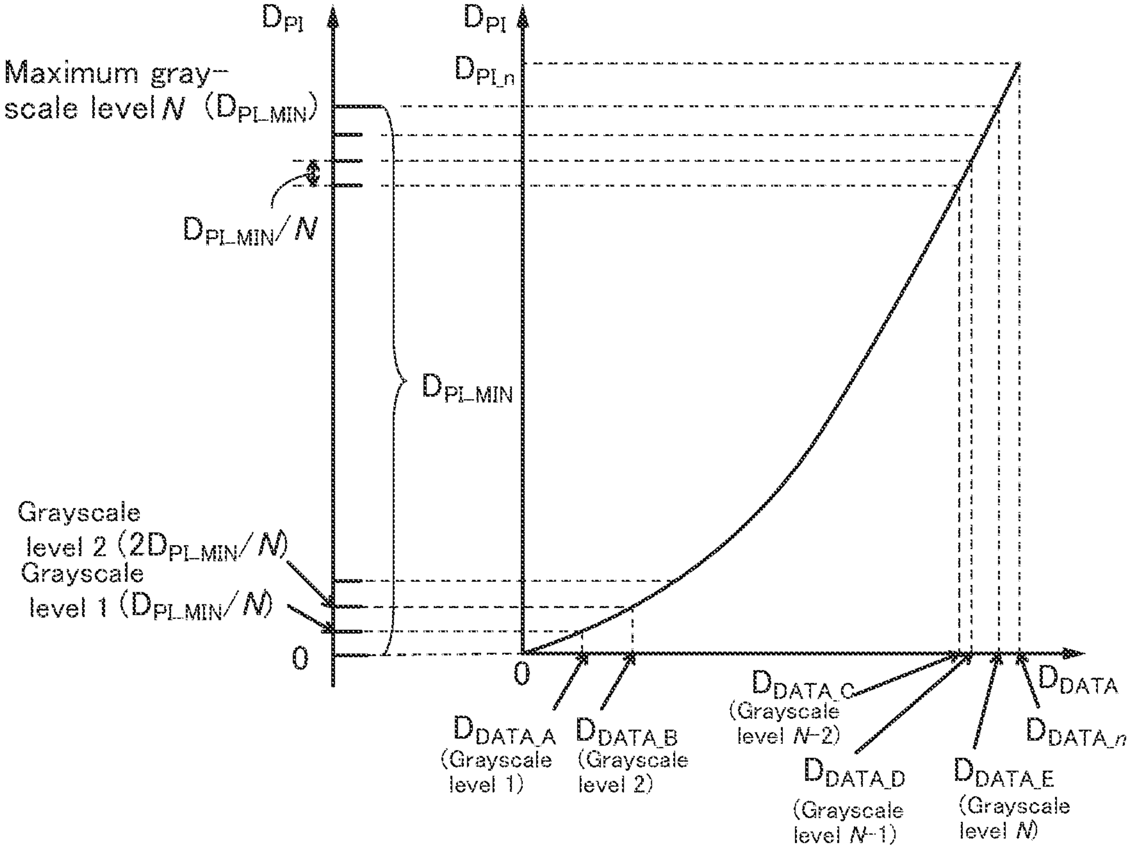
FIG. 19B is a schematic diagram illustrating the operation example of the display apparatus.

FIG. 19A is a flowchart for creating a correction table, and FIG. 19B illustrates a schematic view for describing correction of video data in a given subpixel.

In each pixel, the correction circuit 20 searches for $D_{DATA}$ that is a value closest to $D_{PI}$ corresponding to each grayscale level and creates a correction table (Step S111). Then, the created correction table is stored in the memory circuit 23 (Step S112).

In Step S111, $D_{PI}$ corresponding to each grayscale level is based on a value obtained by determining the $D_{PI}$ corresponding to a grayscale level. In other words, $D_{PI}$ corresponding to each grayscale level corresponds to a standardized value obtained by dividing the luminance of the maximum grayscale level of the subpixel with a low luminance by the number of grayscale levels. Since $D_{PI}$ corresponding to all the grayscale levels is obtained in each subpixel, a variation in luminance between pixels can be corrected by searching for video data supplied to each subpixel on the basis of the standardized $D_{PI}$ corresponding to a grayscale level and creating the correction table.

FIG. 19B is a diagram illustrating correction of video data in a given subpixel, for describing $D_{PI}$ standardized as $D_{PI}$ corresponding to the grayscale level by dividing the luminance of the maximum grayscale level of the subpixel with a low luminance ($D_{PI\_MIN}$) by the number of grayscale levels N, and video data to be corrected on the basis of the standardized $D_{PI}$.

In FIG. 19B, for example, on the basis of the standardized $D_{PI}$, $D_{PI}$ for expressing the grayscale level 1 is referred to as $D_{PI\_MIN}$/N, $D_{PI}$ for expressing the grayscale level 2 is referred to as 2 $D_{PI\_MIN}$/N, which is increased by $D_{PI\_MIN}$/N, and $D_{PI}$ for expressing N of the maximum grayscale level is referred to as $D_{PI\_MIN}$. In a given corresponding pixel, $D_{PI\_n}$ can be given as $D_{PI}$ corresponding to the maximum grayscale level n (=N), $D_{DATA\_n}$ or the like can be given as the corresponding video data, and video data to be corrected is based on the standardized $D_{PI}$. For example, the grayscale level 1 has video data $D_{DATA\_A}$ With $D_{PI\_MIN}$/N as a benchmark of $D_{PI}$, the grayscale level 2 has video data $D_{DATA\_B}$ with 2 $D_{PI\_MIN}$/N as a benchmark of $D_{PI}$, the grayscale level N−2 has video data $D_{DATA\_C}$ with (N−2) $D_{PI\_MIN}$/N as a benchmark of $D_{PI}$, the grayscale level N−1 has video data $D_{DATA\_D}$ with (N−1) $D_{PI\_MIN}$/N as a benchmark of $D_{PI}$, and the grayscale level N has video data $D_{DATA\_E}$ with $D_{PI\_MIN}$ as a benchmark of $D_{PI}$.

In this manner, the correction table for correcting video data for expressing the same grayscale level in each pixel so as to be video data expressing the same luminance can be created.

As described above, in the display apparatus and the correction method of one embodiment of the present invention, a correction table for correcting video data can be created using correction output data corresponding to a current flowing through the light-receiving device included in a subpixel including a light-receiving device provided for each pixel. Thus, a structure can be employed in which a variation in luminance between pixels can be corrected even in a display apparatus with a large number of pixels with higher definition. In addition, in the display apparatus and the correction method of one embodiment of the present invention, the correction output data obtained when the light-receiving device receives light emitted from the light-emitting device included in the pixel is used; hence, a relative variation in luminance between pixels found in an inspection not only after shipment but also after shipment can be corrected. In the display apparatus and the correction method of one embodiment of the present invention, a light-receiving device is provided in each pixel, a signal corresponding to a variation in luminance between light-emitting devices included in pixels can be output as correction output data without dividing a screen into a plurality of areas and without scanning by an external camera, differently from an operation of capturing images of pixels; thus, the relative variation in luminance between pixels can be measured without increasing the number of times of image capturing, and correction data corresponding to the value can be generated.

This embodiment can be combined with any of the other embodiments as appropriate. In this specification, in the case where a plurality of structure examples are shown in one embodiment, the structure examples can be combined as appropriate.

Embodiment 3

In this embodiment, a usage mode and the like of a display apparatus including the light-emitting devices and the light-receiving devices described in the above embodiments will be described.

Figure 20A:
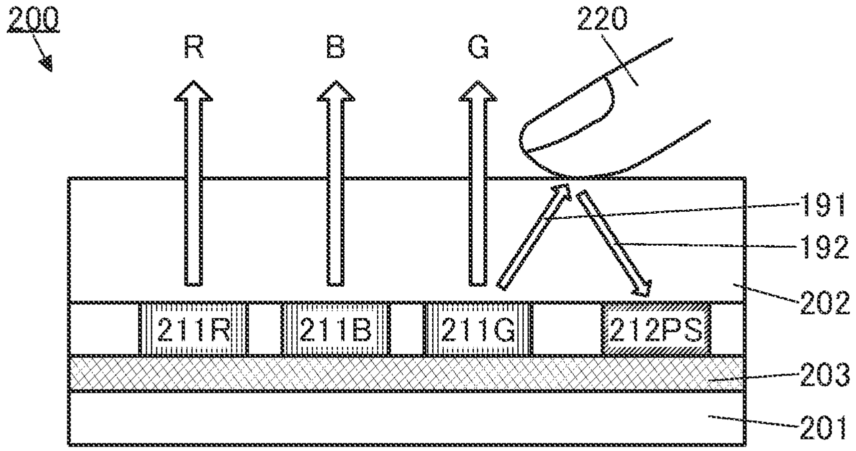
FIG. 20A, FIG. 20B, and FIG. 20D are cross-sectional views illustrating an example of a display apparatus.

FIG. 20A shows a schematic view illustrating a display apparatus of one embodiment of the present invention. A display apparatus 200 illustrated in FIG. 20A includes a substrate 201, a substrate 202, a light-emitting device 211R, a light-emitting device 211G, a light-emitting device 211B, a light-receiving device 212PS, a functional layer 203, and the like.

The light-emitting device 211R, the light-emitting device 211G, the light-emitting device 211B, and the light-receiving device 212PS are provided between the substrate 201 and the substrate 202. The light-emitting device 211R, the light-emitting device 211G, and the light-emitting device 211B emit red (R) light, green (G) light, and blue (B) light, respectively. Any of the above-described light-emitting devices can be used as the light-emitting device 211R, the light-emitting device 211G, and the light-emitting device 211B. Any of the light-receiving devices can be used as the light-receiving device 212PS. Note that in the following description, the term "light-emitting device 211" is sometimes used when the light-emitting device 211R, the light-emitting device 211G, and the light-emitting device 211B are not particularly distinguished from each other.

FIG. 20A illustrates a state where a finger 220 is in contact with a surface of the substrate 202. Part of light emitted by the light-emitting device (e.g., the light-emitting device 211G) is reflected by a contact portion between the substrate 202 and the finger 220. In the case where part of the reflected light is incident on the light-receiving device 212PS, the contact of the finger 220 with the substrate 202 can be detected. That is, the display apparatus 200 can function as a touch panel.

The functional layer 203 includes a circuit for driving the light-emitting device 211R, the light-emitting device 211G, and the light-emitting device 211B and a circuit for driving the light-receiving device 212PS. The functional layer 203 is provided with a switch, a transistor, a capacitor, a wiring, and the like. Note that in the case where the light-emitting device 211R, the light-emitting device 211G, the light-emitting device 211B, and the light-receiving device 212PS are driven by a passive matrix method, the switch and the transistor are not necessarily provided.

Figure 20B:
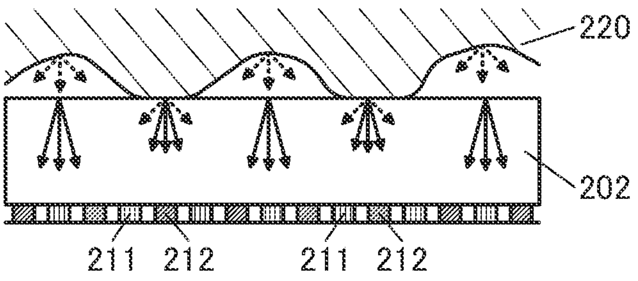

The display apparatus 200 can detect a fingerprint of the finger 220, for example. FIG. 20B schematically shows an enlarged view of the contact portion between the substrate 202 and the finger 220. FIG. 20B illustrates the light-emitting devices 211 and the light-receiving devices 212 that are alternately arranged.

The fingerprint of the finger 220 is formed of depressions and projections. Accordingly, as illustrated in FIG. 20B, the projections of the fingerprint touch the substrate 202.

Reflection of light from a surface or an interface is categorized into regular reflection and diffuse reflection. Regularly reflected light is highly directional light with an angle of reflection equal to the angle of incidence. Diffusely reflected light has low directionality and low angular dependence of intensity. As for regular reflection and diffuse reflection, diffuse reflection components are dominant in the light reflected from the surface of the finger 220. Meanwhile, regular reflection components are dominant in the light reflected from the interface between the substrate 202 and the air.

The intensity of light that is reflected from contact surfaces or non-contact surfaces between the finger 220 and the substrate 202 and is incident on the light-receiving devices 212 positioned directly below the contact surfaces or the non-contact surfaces is the sum of intensities of regularly reflected light and diffusely reflected light. As described above, regularly reflected light (indicated by solid arrows) is dominant in the depressions of the finger 220, where the finger 220 is not in contact with the substrate 202; whereas diffusely reflected light (indicated by dashed arrows) from the finger 220 is dominant in the projections of the finger 220, where the finger 220 is in contact with the substrate 202. Thus, the intensity of light received by the light-receiving device 212 positioned directly below the depression is higher than the intensity of light received by the light-receiving device 212 positioned directly below the projection. Accordingly, a fingerprint image of the finger 220 can be captured.

In the case where an arrangement interval between the light-receiving devices 212 is smaller than a distance between two projections of a fingerprint, preferably a distance between a depression and a projection adjacent to each other, a clear fingerprint image can be obtained. The distance between a depression and a projection of a human's fingerprint is approximately 200 μm; thus, the arrangement interval between the light-receiving devices 212 is, for example, less than or equal to 400 μm, preferably less than or equal to 200 μm, further preferably less than or equal to 150 μm, still further preferably less than or equal to 100 μm, yet still further preferably less than or equal to 50 μm and greater than or equal to 1 μm, preferably greater than or equal to 10 μm, further preferably greater than or equal to 20 μm.

Figure 20C:
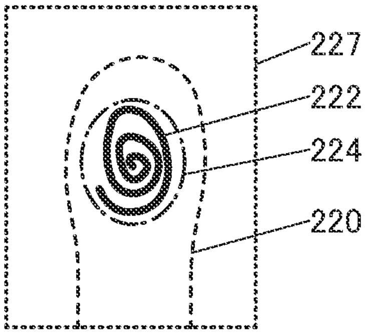
FIG. 20C and FIG. 20E are diagrams each illustrating an example of an image captured by the display apparatus.

FIG. 20C illustrates an example of a fingerprint image captured by the display apparatus 200. In FIG. 20C, in an imaging range 227, the outline of the finger 220 is indicated by a dashed line and the outline of a contact portion 224 is indicated by a dashed-dotted line. In the contact portion 224, a high-contrast image of a fingerprint 222 can be captured owing to a difference in the amount of light incident on the light-receiving devices 212.

Figure 20D:
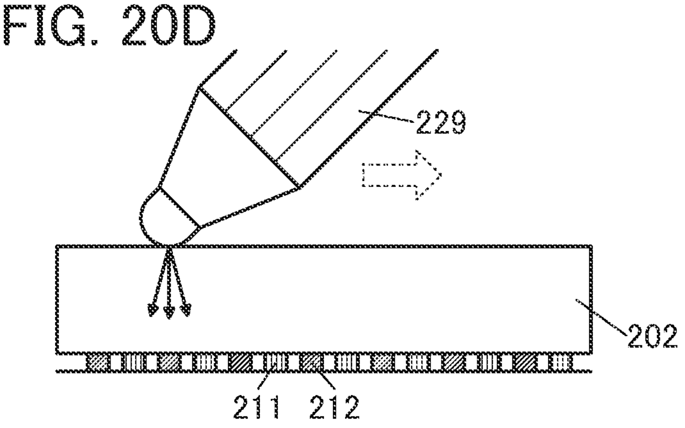

The display apparatus 200 can also function as a touch panel or a pen tablet. FIG. 20D illustrates a state where a tip of a stylus 229 slides in a direction indicated by a dashed arrow while being in contact with the substrate 202.

As illustrated in FIG. 20D, when diffusely reflected light that is diffused at the contact surface between the tip of the stylus 229 and the substrate 202 is incident on the light-receiving device 212 positioned in a portion overlapping with the contact surface, the position of the tip of the stylus 229 can be detected with high accuracy.

Figure 20E:
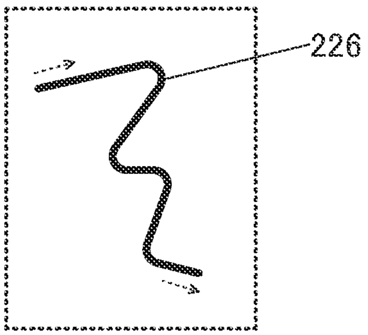

FIG. 20E illustrates an example of a path 226 of the stylus 229 that is detected by the display apparatus 200. The display apparatus 200 can detect the position of an object to be detected, such as the stylus 229, with high position accuracy, so that high-definition drawing can be performed using a drawing application or the like. Unlike the case of using a capacitive touch sensor, an electromagnetic induction touch pen, or the like, the display apparatus 200 can detect even the position of a highly insulating object to be detected, the material of a tip portion of the stylus 229 is not limited, and a variety of writing materials (e.g., a brush, a glass pen, and a quill pen) can be used.

Figure 21:
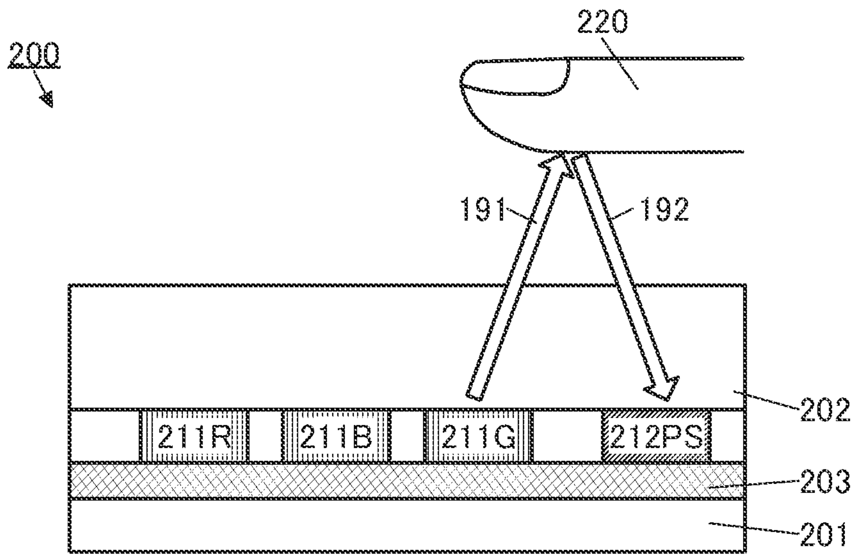
FIG. 21 is a cross-sectional view illustrating an example of a display apparatus.

The light-receiving device 212PS can be used in a touch sensor (also referred to as a direct touch sensor), a near touch sensor (also referred to as a hover sensor, a hover touch sensor, a contactless sensor, or a touchless sensor), or the like. FIG. 21 illustrates a state where light 191 emitted from the light-emitting device (e.g., the light-emitting device 211G) is reflected by an object (e.g., the finger 220), and light 192 that is reflected light is incident on the light-receiving device 212PS. The object is not in contact with the display apparatus 200; however, the object can be detected with the use of the light-receiving device 212PS. Note that the wavelength of light detected by the light-receiving device 212PS may be determined as appropriate depending on the intended use.

The touch sensor or the near touch sensor can detect an approach or contact of an object (e.g., a finger, a hand, or a pen). The touch sensor can detect the object when the display apparatus and the object come in direct contact with each other. Furthermore, even when an object is not in contact with the display apparatus, the near touch sensor can detect the object. For example, the display apparatus is preferably capable of detecting an object positioned in the range of 0.1 mm to 300 mm inclusive, further preferably 3 mm to 50 mm inclusive from the display apparatus. This structure enables the display apparatus to be operated without direct contact of an object; in other words, the display apparatus can be operated in a contactless (touchless) manner. With the above structure, the display apparatus can have a reduced risk of being dirty or damaged, or can be operated without the object directly touching a dirt (e.g., dust or a virus) attached to the display apparatus.

The refresh rate of the display apparatus of one embodiment of the present invention can be variable. For example, the refresh rate is adjusted (adjusted in the range from 1 Hz to 240 Hz inclusive, for example) depending on contents displayed on the display apparatus, whereby power consumption can be reduced. The driving frequency of the touch sensor or the near touch sensor may be changed depending on the refresh rate. In the case where the refresh rate of the display apparatus is 120 Hz, for example, the driving frequency of the touch sensor or the near touch sensor can be a frequency higher than 120 Hz (typically 240 Hz). With this structure, low power consumption can be achieved, and the response speed of the touch sensor or the near touch sensor can be increased.

The light-receiving device 212PS is preferably provided in all of the pixels included in the display apparatus. Providing the light-receiving device 212PS in all of the pixels enables highly accurate touch detection. Note that the light-receiving device 212PS may be provided in some of the pixels. For example, the display apparatus may include a pixel including the light-emitting device and the light-receiving device and a pixel including the light-receiving device (not including light-emitting device).

Figure 22A:
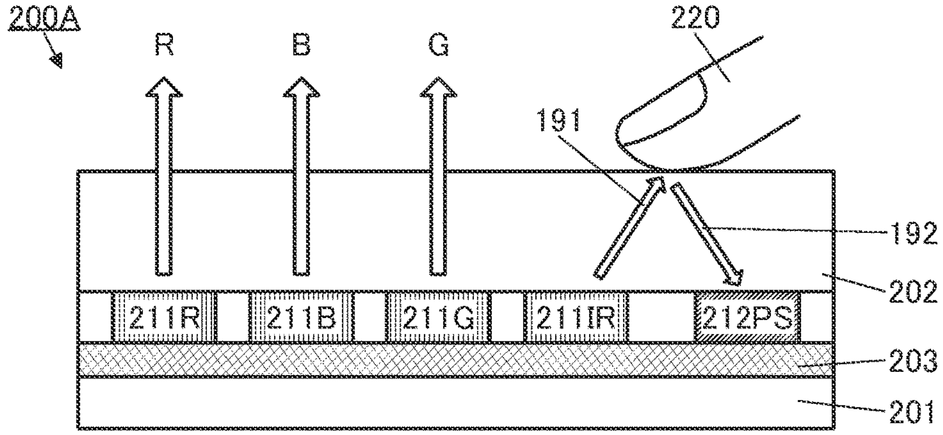
FIG. 22A to FIG. 22C are cross-sectional views illustrating an example of a display apparatus.

FIG. 22A illustrates a structure example different from that of the above-described display apparatus 200. A display apparatus 200A illustrated in FIG. 22A includes the substrate 201, the substrate 202, the light-emitting device 211R, the light-emitting device 211G, the light-emitting device 211B, a light-emitting device 211IR, the light-receiving device 212PS, the functional layer 203, and the like. The display apparatus 200A is different from the described-above display apparatus 200 mainly in including the light-emitting device 211IR.

The light-emitting device 211R, the light-emitting device 211G, the light-emitting device 211B, and the light-receiving device 212PS are provided between the substrate 201 and the substrate 202. The light-emitting device 211IR emits infrared light. The above-described light-emitting device can be used as the light-emitting device 211IR.

FIG. 22A illustrates a state where the finger 220 touches a surface of the substrate 202. Part of light emitted from the light-emitting device (e.g., the light-emitting device 211IR) is reflected by a contact portion between the substrate 202 and the finger 220. In the case where part of the reflected light is incident on the light-receiving device 212PS, the contact of the finger 220 with the substrate 202 can be detected. For example, infrared rays are emitted from the light-emitting device 211IR and infrared light is detected by the light-receiving device 212PS, so that a touch can be detected even in a dark place.

The display apparatus 200A can perform touch detection in a display portion with the use of the light-emitting device 211IR and the light-receiving device 212PS while displaying an image on the display portion with the use of the light-emitting device 211R, the light-emitting device 211G, and the light-emitting device 211B. In addition, the display apparatus 200A can perform image capturing on the display portion while displaying an image on the display portion.

Figure 22B:
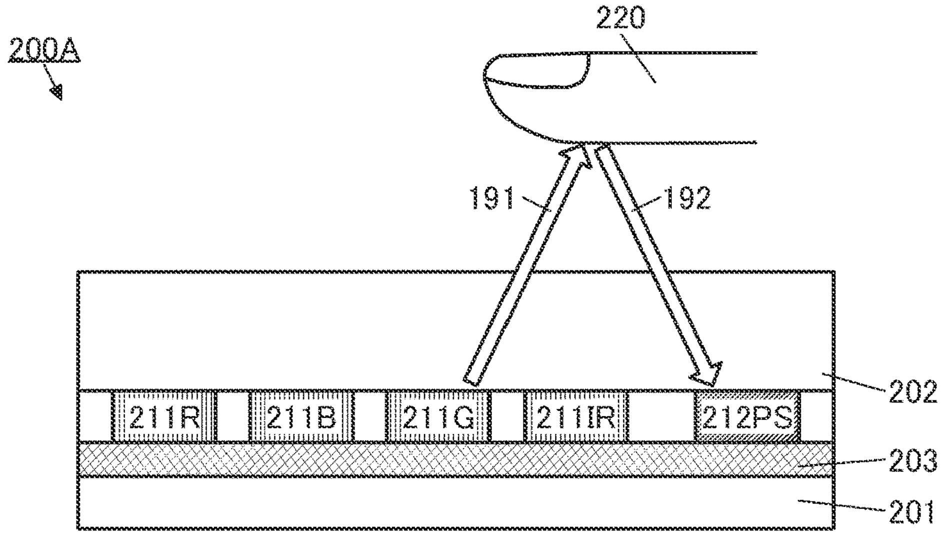
Figure 22C:
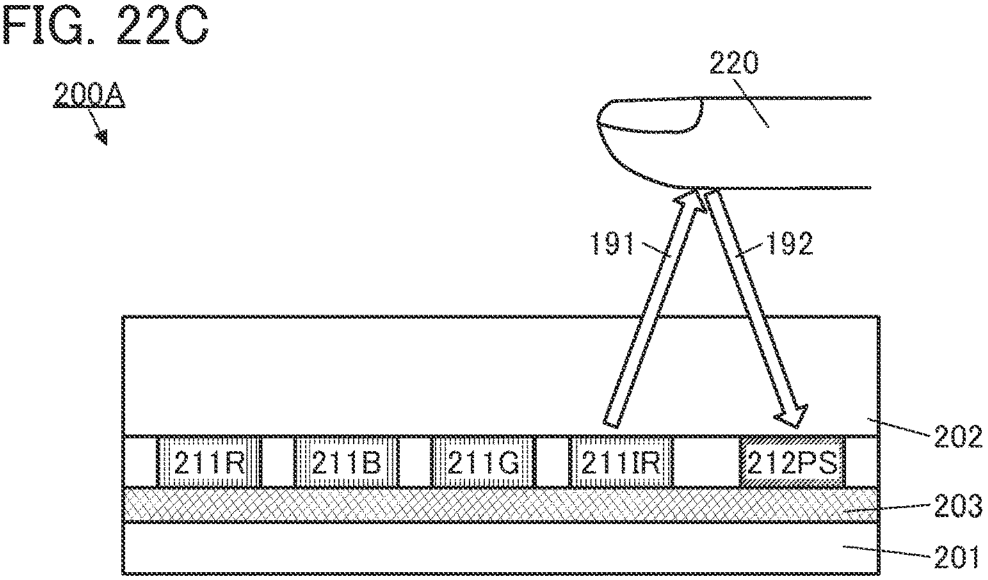

FIG. 22B illustrates a state where the light 191 emitted from the light-emitting device 211G is reflected by an object (e.g., the finger 220), and the light 192 that is reflected light is incident on the light-receiving device 212PS. FIG. 22C illustrates a state where the light 191 emitted from the light-emitting device 211IR is reflected by an object (e.g., the finger 220), and the light 192 that is reflected light is incident on the light-receiving device 212PS. The object is not in contact with the display apparatus 200A; however, the object can be detected with the use of the light-receiving device 212PS.

Figure 23A:
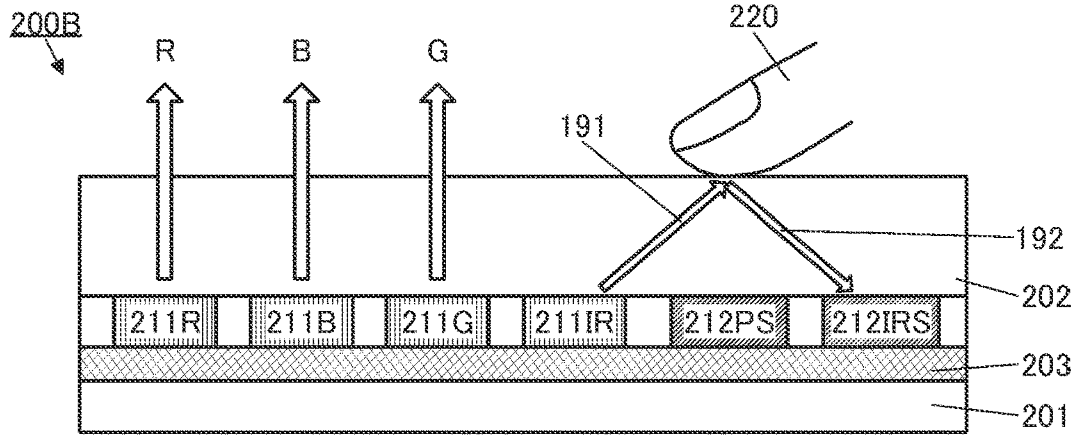
FIG. 23A to FIG. 23C are cross-sectional views illustrating an example of a display apparatus.

FIG. 23A illustrates a structure example different from that of the above-described display apparatus 200A. A display apparatus 200B illustrated in FIG. 23A includes the substrate 201, the substrate 202, the light-emitting device 211R, the light-emitting device 211G, the light-emitting device 211B, the light-emitting device 211IR, the light-receiving device 212PS, a light-receiving device 212IRS, the functional layer 203, and the like. The display apparatus 200B is different from the above-described display apparatus 200A mainly in the structure of the light-receiving device.

The light-emitting device 211R, the light-emitting device 211G, the light-emitting device 211B, the light-receiving device 212PS, and the light-receiving device 212IRS are provided between the substrate 201 and the substrate 202. The light-receiving device 212PS receives visible light. The light-receiving device 212IRS receives infrared light. The above-described light-receiving devices can be used as the light-receiving device 212PS and the light-receiving device 212IRS.

FIG. 23A illustrates a state where a finger 220 is in contact with a surface of the substrate 202. Part of light emitted from the light-emitting device (e.g., the light-emitting device 211IR) is reflected by a contact portion between the substrate 202 and the finger 220. In the case where part of the reflected light is incident on the light-receiving device 212IRS, the contact of the finger 220 with the substrate 202 can be detected.

Figure 23B:
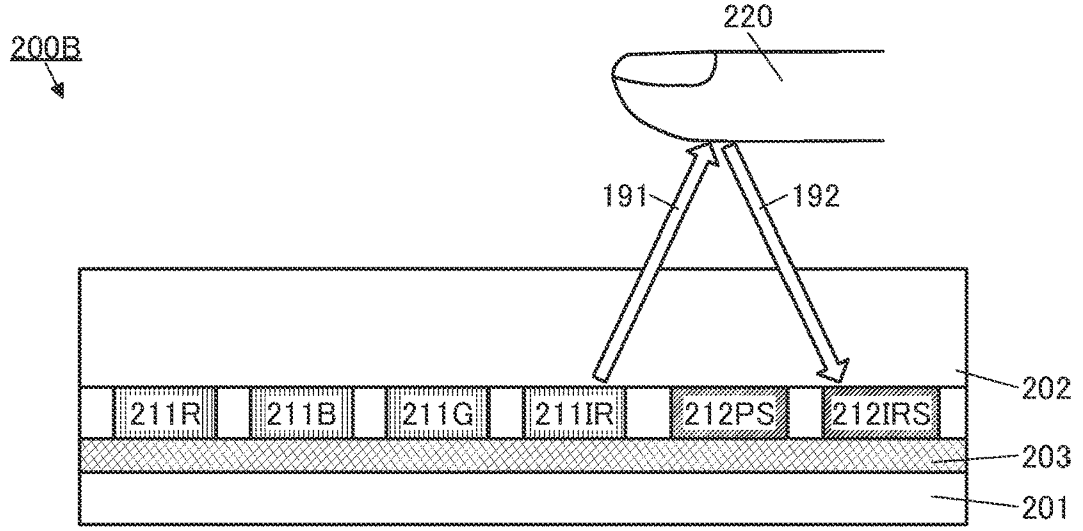
Figure 23C:
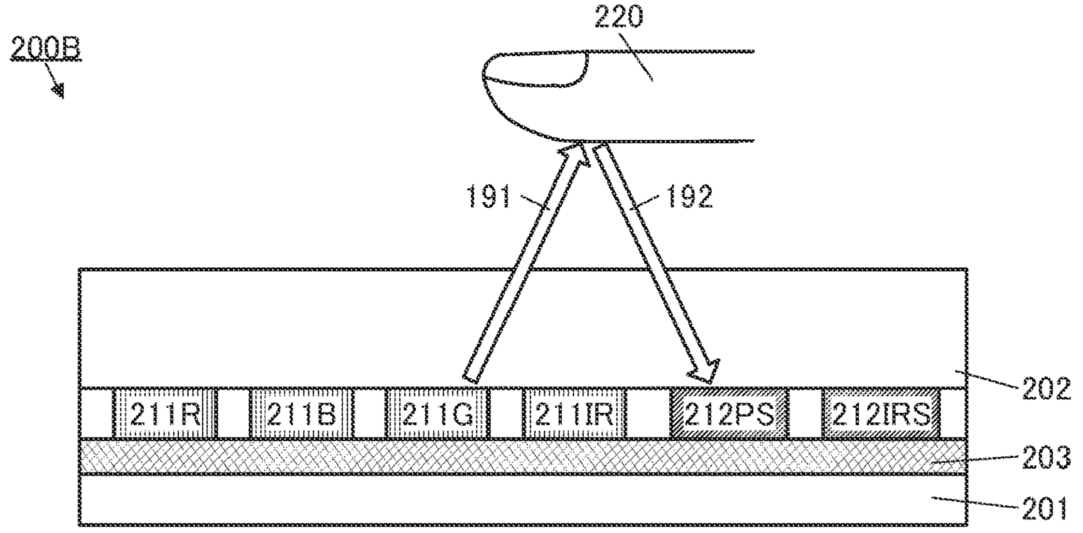

FIG. 23B illustrates a state where the light 191 emitted from the light-emitting device 211IR is reflected by an object (e.g., the finger 220), and the light 192 that is reflected light is incident on the light-receiving device 212IRS. FIG. 23C illustrates a state where the light 191 emitted from the light-emitting device 211G is reflected by an object (e.g., the finger 220), and the light 192 that is reflected light is incident on the light-receiving device 212PS. The object is not in contact with the display apparatus 200B; however, the object can be detected with the use of the light-receiving device 212PS or the light-receiving device 212IRS.

The area of a light-receiving region (hereinafter, also referred to as a light-receiving area) of the light-receiving device 212PS is preferably smaller than the light-receiving area of the light-receiving device 212IRS. When the light-receiving area of the light-receiving device 212PS is made small, that is, the image capturing range is made small, the light-receiving device 212PS can perform higher-definition image capturing than the light-receiving device 212IRS. In this case, the light-receiving device 212PS can be used to capture an image for personal authentication using a fingerprint, a palm print, the iris, the shape of a blood vessel (including the shape of a vein and the shape of an artery), a face, or the like. Note that the wavelength of light detected by the light-receiving device 212PS may be determined as appropriate depending on the intended use.

Since the light-receiving device 212PS and the light-receiving device 212IRS have difference in the detection accuracy, methods for detecting an object may be selected depending on the functions. For example, a function of scrolling a display screen may be achieved by a near touch sensor function using the light-receiving device 212IRS, and an input function with a keyboard displayed on a screen may be achieved by a high-definition touch sensor function using the light-receiving device 212PS.

When one pixel includes two kinds of light-receiving devices, the display apparatus can have two additional functions as well as a display function, enabling a multi-functional display apparatus.

For high-definition image capturing, the light-receiving device 212PS is preferably provided in all of the pixels included in the display apparatus. Meanwhile, the light-receiving device 212IRS used for a touch sensor, a near touch sensor, or the like may be provided in some of the pixels included in the display apparatus because detection with the light-receiving device 212IRS is not required to have high accuracy as compared to detection with the light-receiving device 212PS. When the number of the light-receiving devices 212IRS included in the display apparatus is smaller than the number of the light-receiving devices 212PS, the detection speed can be increased.

As described above, the display apparatus of this embodiment can be a multifunctional display apparatus by including a light-emitting device and a light-receiving device in one pixel. For example, a display apparatus with a high-definition image capturing function and a sensing function of a touch sensor, a near touch sensor, or the like can be achieved.

Figure 24A:
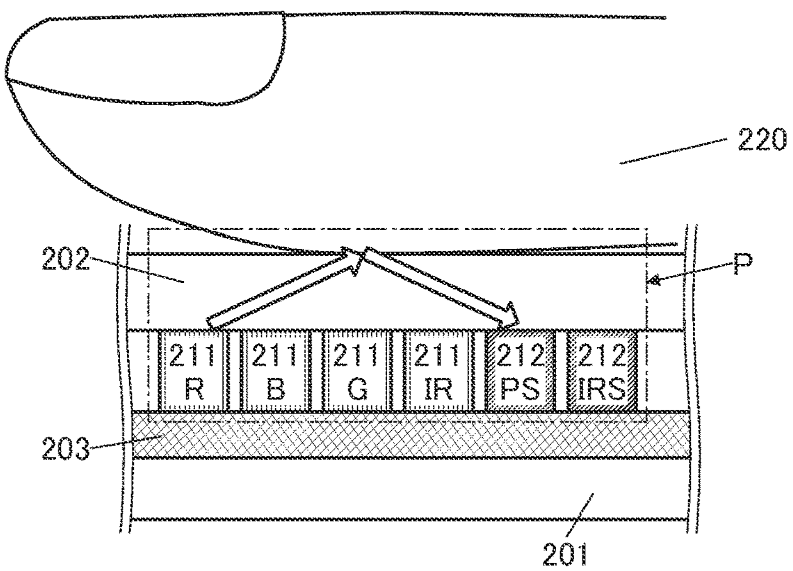
FIG. 24A to FIG. 24C are diagrams illustrating examples of display devices.
Figure 24B:
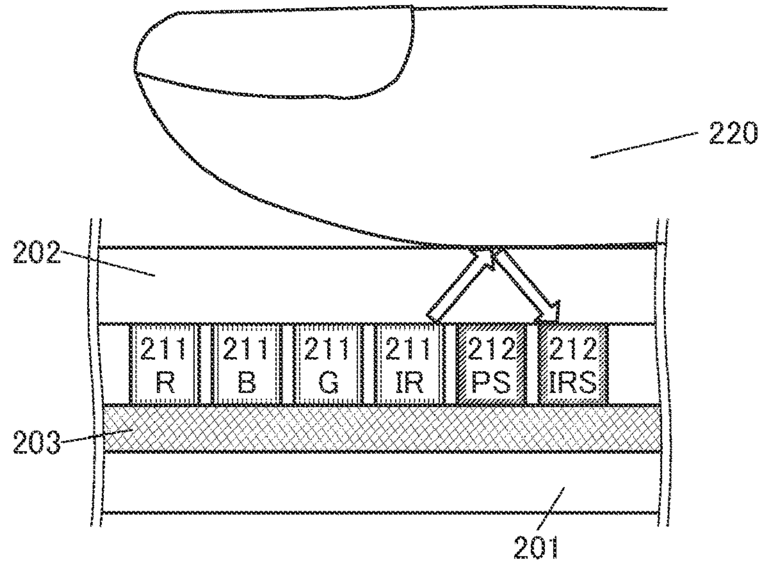

The display apparatus of one embodiment of the present invention may emit light of a particular color and receive reflected light that has been reflected by an object. In FIG. 24A, red light emitted from the display apparatus and the red light incident on the display apparatus after being reflected by an object (here, the finger 220) are schematically indicated by arrows. In FIG. 24B, infrared light emitted from the display apparatus and the infrared light incident on the display apparatus after being reflected by an object (here, the finger 220) are schematically indicated by arrows.

Red light is emitted with an object being in contact with or approaching the display apparatus, and light reflected by the object is incident on the display apparatus, so that the red light transmittance of the object can be measured. Similarly, infrared light is emitted with an object being in contact with or approaching the display apparatus, and light reflected by the object is incident on the display apparatus, so that the infrared light transmittance of the object can be measured.

Figure 24C:
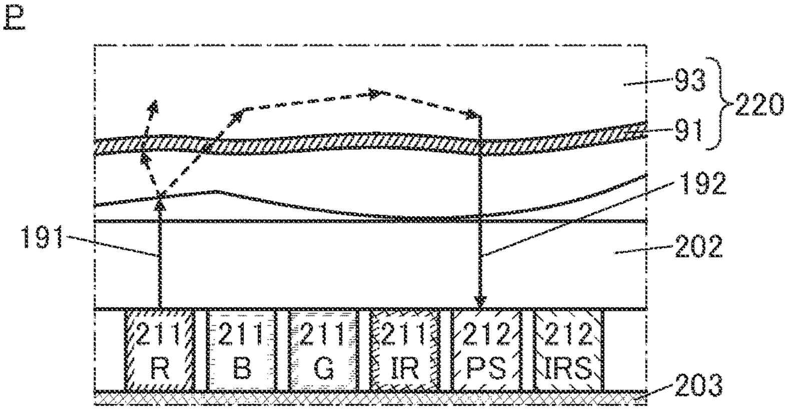

FIG. 24C shows an enlarged view of a region P indicated by the dashed-dotted line in FIG. 24A. The light 191 emitted from the light-emitting device 211R is scattered by biological tissue on the surface or at the inside of the finger 220, and part of the scattered light advances from the inside of the living body toward the light-receiving device 212PS. The scattered light passes through a blood vessel 91, and the light 192 having passed through the blood vessel 91 is incident on the light-receiving device 212PS.

Similarly, infrared light emitted from the light-emitting device 211IR is scattered by biological tissue on the surface or at the inside of the finger 220, and part of the scattered infrared light advances from the inside of the living body toward the light-receiving device 212IRS. The scattered infrared light passes through the blood vessel 91, and the infrared light having passed through the blood vessel 91 is incident on the light-receiving device 212IRS.

Here, the light 192 is light having passed through biological tissue 93 and the blood vessel 91 (an artery and a vein). Since an arterial blood pulses by heartbeat, light absorption by the artery fluctuates depending on the heartbeat. In contrast, the biological tissue 93 and the vein are not influenced by the heartbeat, and thus light absorption by the biological tissue 93 and light absorption by the vein are constant. Therefore, light transmittance of the artery can be calculated by subtracting the components that are constant over time from the light 192 that is incident on the display apparatus. The red light transmittance of oxygen-unbound hemoglobin (also referred to as reduced hemoglobin) is lower than that of oxygen-bound hemoglobin (also referred to as oxyhemoglobin). Oxyhemoglobin and reduced hemoglobin have substantially the same infrared light transmittance. Measuring the red light transmittance of the artery and the infrared light transmittance of the artery enables the ratio of oxyhemoglobin to the total amount of oxyhemoglobin and reduced hemoglobin, that is, the oxygen saturation (hereinafter, also referred to as percutaneous oxygen saturation ($SpO_2$: Peripheral Oxygen Saturation)), to be calculated. In this way, the display apparatus of one embodiment of the present invention can have a function of a reflective pulse oximeter.

For example, when a finger is in contact with a display portion of a display apparatus, positional information of a region that the finger is in contact with is obtained. Then, red light is emitted from pixels in and around the region that the finger is in contact with to measure the red light transmittance of the artery. After that, infrared light is emitted to measure the infrared light transmittance of the artery, whereby the oxygen saturation can be calculated. Note that the order of measuring the red light transmittance and measuring the infrared light transmittance is not particularly limited. After the infrared light transmittance is measured, the red light transmittance may be measured. Furthermore, although an example of calculating the oxygen saturation using the finger is described here, one embodiment of the present invention is not limited thereto. The oxygen saturation can be calculated using a part other than the finger. For example, the oxygen saturation can be calculated by measuring the red light transmittance of an artery and the infrared light transmittance of the artery while a palm is in contact with the display portion of the display apparatus.

Figure 25A:
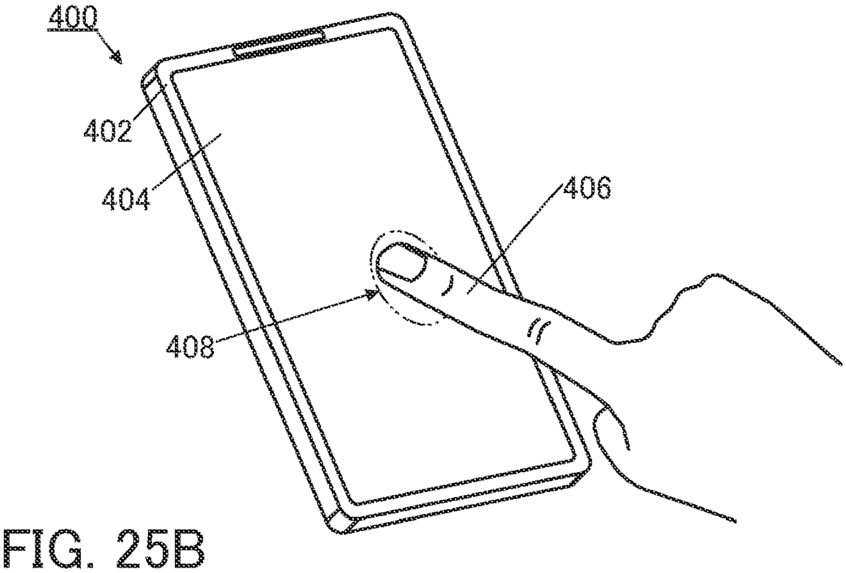
FIG. 25A to FIG. 25C are drawings showing examples of an electronic device.

FIG. 25A illustrates an example of an electronic device including the display apparatus of one embodiment of the present invention. A portable information terminal 400 illustrated in FIG. 25A can be used as a smartphone, for example. The portable information terminal 400 includes a housing 402 and a display portion 404. Any of the above-described display apparatuses can be used for the display portion 404. For example, the above-described display apparatus 200B can be suitably used for the display portion 404.

FIG. 25A illustrates a state where a finger 406 is in contact with the display portion 404 of the portable information terminal 400. In FIG. 25A, a region 408 including a region where a touch is detected and the vicinity thereof is indicated by a dashed double-dotted line.

Figure 25B:
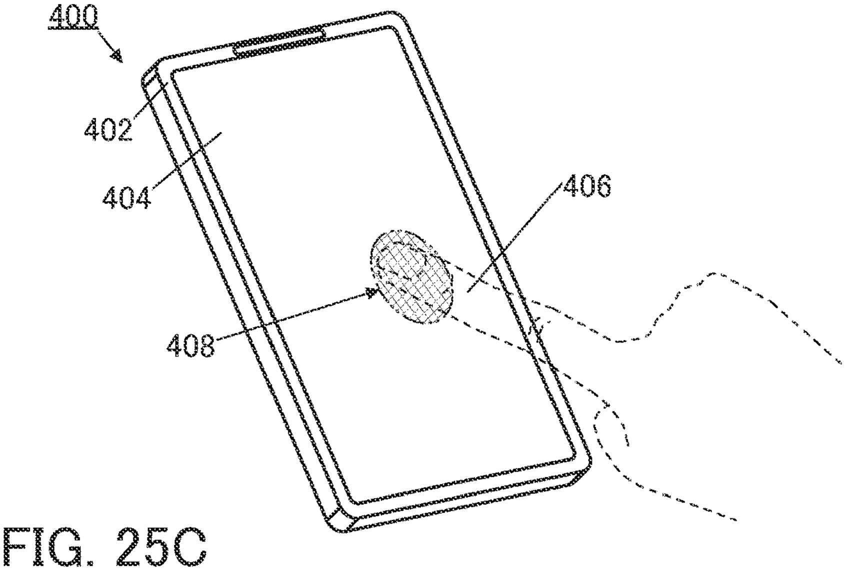

The portable information terminal 400 emits red light from pixels in the region 408 and detects red light incident on the display portion 404. Similarly, the portable information terminal 400 can measure the oxygen saturation of the finger 406 by emitting infrared light from pixels in the region 408 and detecting infrared light incident on the display portion 404. FIG. 25B illustrates a state where the pixels in the region 408 are lit. In FIG. 25B, the finger 406 is illustrated to be transparent with only the outline indicated by a dashed line, and the region 408 is shown with a hatch pattern. As illustrated in FIG. 25B, the region 408 where pixels are lit is hidden by the finger 406 and thus is less likely to be recognized by a user. Therefore, the oxygen saturation can be measured without causing stress to the user. In addition, the portable information terminal 400 can measure the oxygen saturation at any position in the display portion 404.

Figure 25C:
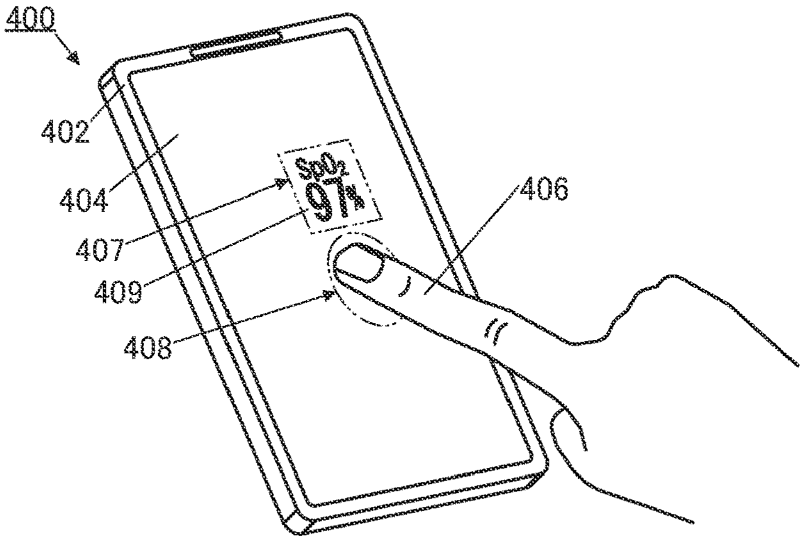

The obtained oxygen saturation may be displayed on the display portion 404. FIG. 25C illustrates a state where an image 409 showing the oxygen saturation is displayed in a region 407. FIG. 25C illustrates characters of "$SpO_2$ 97%" as an example of the image 409. Note that the image 409 may be an image or may include an image and a character. The region 407 is provided at a given position in the display portion 404.

This embodiment can be combined with any of the other embodiments as appropriate. In this specification, in the case where a plurality of structure examples are described in one embodiment, the structure examples can be combined as appropriate.

Embodiment 4

In this embodiment, a display apparatus of one embodiment of the present invention and a manufacturing method thereof are described with reference to FIG. 26 to FIG. 33.

In the case of manufacturing a display apparatus including a light-emitting device and a light-receiving device, a light-emitting layer and an active layer each need to be formed into an island-like shape.

For example, an island-shaped light-emitting layer and an island-shaped active layer can be formed by a vacuum evaporation method using a metal mask (also referred to as a shadow mask). However, this method causes a deviation from the designed shape and position of an island-shaped light-emitting layer and an island-shaped active layer due to various influences such as the accuracy of the metal mask, the positional deviation between the metal mask and a substrate, a warp of the metal mask, and expansion of the outline of a deposited film due to vapor scattering or the like; accordingly, it is difficult to achieve high definition and a high aperture ratio of the display apparatus.

In a manufacturing method of a display apparatus of one embodiment of the present invention, an island-shaped pixel electrode (also can be referred to as a lower electrode) is formed, a first layer to be an EL layer is formed over the entire surface, and then a first mask layer is formed over the first layer. After that, a first resist mask is formed over the first mask layer and the first layer and the first mask layer are processed using the first resist mask, whereby an island-shaped EL layer is formed. Similarly, a second layer to be a light-receiving layer is formed into an island-shaped light-receiving layer using a second mask layer and a second resist mask.

As described above, in the manufacturing method of the display apparatus of one embodiment of the present invention, the island-shaped EL layer is formed not by using a pattern of a metal mask but by processing a layer to be an EL layer deposited over the entire surface. Similarly, the island-shaped light-receiving layer is formed by processing the layer to be the light-receiving layer formed over the entire surface, not with a pattern of a metal mask. Accordingly, a display apparatus with high definition or a display apparatus with a high aperture ratio, which has been difficult to achieve so far, can be obtained. Moreover, EL layers can be formed separately for the respective colors, enabling the display apparatus to perform extremely clear display with high contrast and high display quality. Furthermore, a light-receiving device can be provided in the pixel, enabling the display apparatus to have a high-definition image capturing function and a sensing function of a touch sensor, a near touch sensor, or the like. In addition, a mask layer provided over an EL layer and a light-receiving layer can reduce damage to the EL layer and the light-receiving layer in the manufacturing process of the display apparatus, increasing the reliability of the light-emitting device and the light-receiving device.

It is difficult to set the distance between adjacent devices among the light-emitting devices and the light-receiving device to be less than 10 μm with a formation method using a metal mask, for example; however, with the above method, the distance can be decreased to less than or equal to 3 μm, less than or equal to 2 μm, or less than or equal to 1 μm. For example, with the use of a light exposure apparatus for LSI, the distance can be decreased to less than or equal to 500 nm, less than or equal to 200 nm, less than or equal to 100 nm, or less than or equal to 50 nm. Thus, the area of a light-emitting region (hereinafter, also referred to as a light-emitting area) and the light-receiving area in a pixel can be increased and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, patterns of the EL layer and the light-receiving layer themselves can be made extremely smaller than those in the case of using a metal mask. For example, in the case of using a metal mask for separate formation of an EL layer and a light-receiving layer, the thickness varies between the center and the edge of the pattern, which causes a reduction in an effective area that can be used as a light-emitting region or a light-receiving region with respect to the whole area of the pattern. In contrast, in the above formation method, a pattern is formed by processing a film deposited to a uniform thickness, which enables a uniform thickness in the pattern; thus, even in a fine pattern, almost the entire area can be used as a light-emitting region or a light-receiving region. Thus, a display apparatus having both high definition and a high aperture ratio can be manufactured.

<Structure Example of Display Apparatus>

Figure 26A:
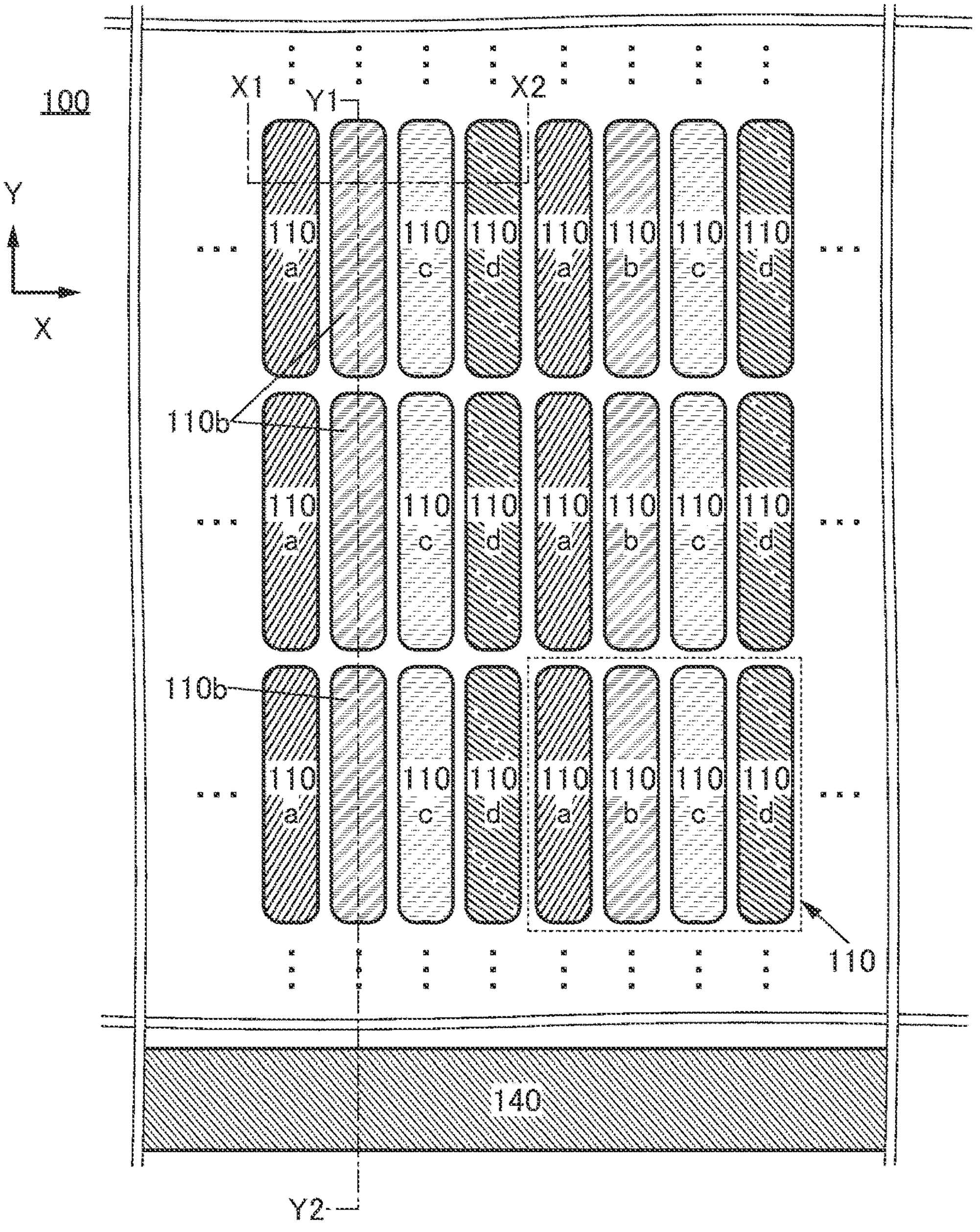
FIG. 26A is a top view illustrating an example of a display apparatus.
Figure 26B:
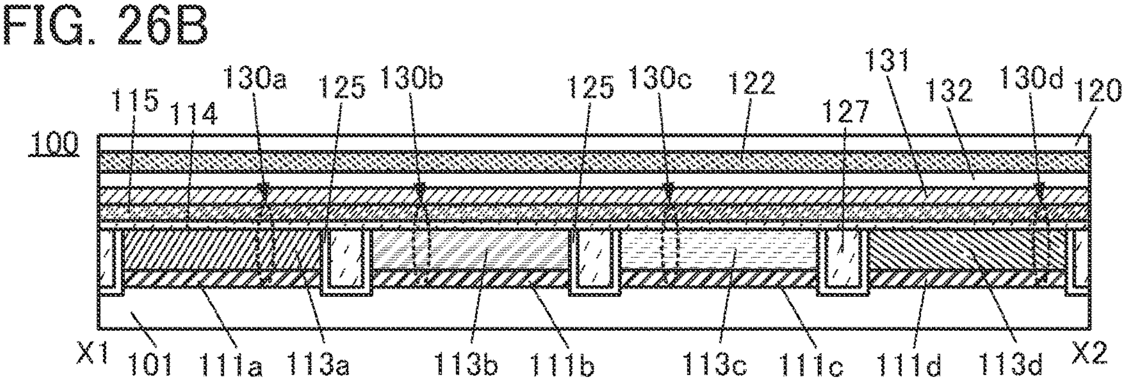
FIG. 26B is a cross-sectional view illustrating an example of a display apparatus.

FIG. 26A and FIG. 26B illustrate the display apparatus of one embodiment of the present invention.

FIG. 26A is a top view of the display apparatus 100. The display apparatus 100 includes a display portion in which a plurality of pixels 110 are arranged in a matrix and a connection portion 140 outside the display portion.

The pixel 110 illustrated in FIG. 26A employs stripe arrangement. The pixel 110 illustrated in FIG. 26A is composed of four subpixels: a subpixel 110*a*, a subpixel 110*b*, a subpixel 110*c*, and a subpixel 110*d*. The subpixel 110*a*, the subpixel 110*b*, and the subpixel 110*c* include light-emitting devices that emit light in different wavelength ranges. The above-described light-emitting device can be used as the light-emitting device. The subpixel 110*a*, the subpixel 110*b*, and the subpixel 110*c* can be subpixels of three colors of red (R), green (G), and blue (B) or subpixels of three colors of yellow (Y), cyan (C), and magenta (M), for example. The subpixel 110*d* includes a light-receiving device. The above-described light-receiving device can be used as the light-receiving device.

FIG. 26A illustrates an example where subpixels are arranged to be aligned in the X direction and subpixels of the same kind are arranged to be aligned in the Y direction. Note that subpixels of different kinds may be arranged to be aligned in the Y direction, and subpixels of the same kind may be arranged to be aligned in the X direction.

Although the top view in FIG. 26A illustrates an example where the connection portion 140 is positioned in the lower side of the display portion, one embodiment of the present invention is not particularly limited thereto. The connection portion 140 is provided in at least one of the upper side, the right side, the left side, and the lower side of the display portion in the top view, or may be provided so as to surround the four sides of the display portion. The number of the connection portions 140 can be one or more.

FIG. 26B is a cross-sectional view along a dashed-dotted line X1-X2 in FIG. 26A.

As illustrated in FIG. 26B, the display apparatus 100 includes a light-emitting device 130*a*, a light-emitting device 130*b*, a light-emitting device 130*c*, and a light-receiving device 130*d* over a layer 101 including transistors. Furthermore, a protective layer 131 and a protective layer 132 are provided to cover these light-emitting devices and the light-receiving device. A substrate 120 is bonded onto the protective layer 132 with a resin layer 122. In a region between adjacent devices among the light-emitting devices and the light-receiving device, an insulating layer 125 and an insulating layer 127 over the insulating layer 125 are provided.

The display apparatus of one embodiment of the present invention can have any of the following structures: a top-emission structure where light is emitted in a direction opposite to the substrate where the light-emitting device is formed, a bottom-emission structure where light is emitted toward the substrate where the light-emitting device is formed, and a dual-emission structure where light is emitted toward both surfaces.

The layer 101 including transistors can employ a stacked-layer structure where a plurality of transistors are provided over a substrate and an insulating layer is provided to cover these transistors, for example. The layer 101 including transistors may have a depressed portion between adjacent light-emitting devices. For example, an insulating layer positioned on the outermost surface of the layer 101 including transistors may have a depressed portion.

The light-emitting device 130*a*, the light-emitting device 130*b*, and the light-emitting device 130*c* emit light in different wavelength ranges. The light-emitting device 130*a*, the light-emitting device 130*b*, and the light-emitting device 130*c* preferably emit light of three colors, red (R), green (G), and blue (B) as a combination, for example.

The light-emitting device 130*a* includes a conductive layer 111*a* over the layer 101 including transistors, an island-shaped EL layer 113*a* over the conductive layer 111*a*, a layer 114 over the island-shaped EL layer 113*a*, and a common electrode 115 over the layer 114.

The light-emitting device 130*b* includes a conductive layer 111*b* over the layer 101 including transistors, an island-shaped EL layer 113*b* over the conductive layer 111*b*, the layer 114 over the island-shaped EL layer 113*b*, and the common electrode 115 over the layer 114.

The light-emitting device 130*c* includes a conductive layer 111*c* over the layer 101 including transistors, an island-shaped EL layer 113*c* over the conductive layer 111*c*, the layer 114 over the island-shaped EL layer 113*c*, and the common electrode 115 over the layer 114.

The light-receiving device 130*d* includes a conductive layer 111*d* over the layer 101 including transistors, an island-shaped light-receiving layer 113*d* over the conductive layer 111*d*, the layer 114 over the island-shaped light-receiving layer 113*d*, and the common electrode 115 over the layer 114.

The light-emitting devices of different colors and the light-receiving device share the same film as the common electrode. The common electrode is electrically connected to a conductive layer provided in the connection portion 140. Thus, the same potential is supplied to the common electrode included in the light-emitting devices of different colors and the light-receiving device.

For the pair of electrodes (the pixel electrode and the common electrode) of the light-emitting devices and the light-receiving device, a metal, an alloy, an electrically conductive compound, a mixture thereof, and the like can be used as appropriate. Specific examples include an indium tin oxide (also referred to as an In—Sn oxide or ITO), an In—Si—Sn oxide (also referred to as ITSO), an indium zinc oxide (In—Zn oxide), an In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) and an alloy containing an appropriate combination of any of these metals. It is also possible to use an element belonging to Group 1 or Group 2 of the periodic table, which is not mentioned above (e.g., lithium (Li), cesium (Cs), calcium (Ca), or strontium (Sr)), a rare earth metal such as europium (Eu) or ytterbium (Yb), an alloy containing an appropriate combination of any of these, graphene, or the like.

The light-emitting devices preferably employ a microcavity structure. Therefore, one of the pair of electrodes of the light-emitting devices preferably includes an electrode having a transmitting property and a reflecting property with respect to visible light (a semi-transmissive and semi-reflective electrode), and the other preferably includes an electrode having a reflecting property with respect to visible light (a reflective electrode). When the light-emitting devices have a microcavity structure, light emitted from the light-emitting layers can be resonated between the electrodes, whereby light emitted from the light-emitting devices can be intensified.

Note that the semi-transmissive and semi-reflective electrode can have a stacked-layer structure of an electrode having a reflecting property with respect to visible light and an electrode having a transmitting property with respect to visible light (also referred to as a transparent electrode).

The transparent electrode has a light transmittance higher than or equal to 40%. For example, an electrode having a visible light transmittance higher than or equal to 40% is preferably used in light-emitting devices. The semi-transmissive and semi-reflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 100%. These electrodes each preferably have a resistivity lower than or equal to $1\times10^{-2}$ Ωcm. Note that in the case where any of the light-emitting devices emits infrared light, the infrared light transmittance and reflectance of these electrodes preferably satisfy the above-described numerical ranges, like the visible light transmittance and reflectance.

The EL layer 113*a*, the EL layer 113*b*, the EL layer 113*c*, and the light-receiving layer 113*d* are formed in island-like shapes. The EL layer 113*a*, the EL layer 113*b*, and the EL layer 113*c* include light-emitting layers. The EL layer 113*a*, the EL layer 113*b*, and the EL layer 113*c* preferably include light-emitting layers that emit light in different wavelength ranges. The light-receiving layer 113*d* includes an active layer.

The light-emitting layer is a layer containing a light-emitting substance. The light-emitting layer can contain one or more kinds of light-emitting substances. As the light-emitting substance, a substance that exhibits an emission color of blue, violet, blue violet, green, yellow green, yellow, orange, red, or the like is appropriately used. As the light-emitting substance, a substance that emits infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (especially, an iridium complex) having a 4H-triazole skeleton, a 1H-triazole skeleton, an imidazole skeleton, a pyrimidine skeleton, a pyrazine skeleton, or a pyridine skeleton; an organometallic complex (especially, an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of a hole-transport material and an electron-transport material can be used. Alternatively, as one or more kinds of organic compounds, a bipolar material or a TADF material may be used.

The light-emitting layer preferably contains, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected to form an exciplex that exhibits light emission having a wavelength overlapping with the wavelength of a lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

In the combination of materials for forming an exciplex, the HOMO level (highest occupied molecular orbital level) of the hole-transport material is preferably higher than or equal to the HOMO level of the electron-transport material. The LUMO level (lowest unoccupied molecular orbital level) of the hole-transport material is preferably higher than or equal to the LUMO level of the electron-transport material. The LUMO levels and the HOMO levels of the materials can be derived from the electrochemical characteristics (reduction potentials and oxidation potentials) of the materials that are measured by cyclic voltammetry (CV).

The formation of an exciplex can be confirmed, for example, in the following manners: when the emission spectrum of the hole-transport material, the emission spectrum of the electron-transport material, and the emission spectrum of a mixed film of these materials are compared, it is observed that the emission spectrum of the mixed film is shifted to the longer wavelength than the emission spectrum of each of the materials (or has another peak on the longer wavelength side). Alternatively, when the transient photoluminescence (PL) of the hole-transport material, the transient PL of the electron-transport material, and the transient PL of the mixed film of the materials are compared, a difference in transient response is observed, for example, the transient PL lifetime of the mixed film has a longer lifetime component or has a delayed component at a higher proportion than that of each of the materials. The transient PL can be rephrased as transient electroluminescence (EL). That is, the formation of an exciplex can also be confirmed by a difference in transient response observed in comparison between the transient EL of the hole-transport material, the transient EL of the electron-transport material and the transient EL of the mixed film of these materials.

In addition to the light-emitting layer, the EL layer 113*a*, the EL layer 113*b*, and the EL layer 113*c* may further include a layer containing any of a substance with a high hole-injection property, a substance with a high hole-transport property, a hole-blocking material, a substance with a high electron-transport property, a substance with a high electron-injection property, an electron-blocking material, a substance with a bipolar property (a substance with a high electron-transport property and a high hole-transport property), and the like.

Either a low molecular compound or a high molecular compound can be used for the light-emitting device, and an inorganic compound may also be included. Each layer included in the light-emitting device can be formed by an evaporation method (including a vacuum evaporation method), a transfer method, a printing method, an inkjet method, a coating method, or the like.

For example, the EL layer 113*a*, the EL layer 113*b*, and the EL layer 113*c* may each include one or more of a hole-injection layer, a hole-transport layer, a hole-blocking layer, an electron-blocking layer, an electron-transport layer, and an electron-injection layer.

In the EL layer, one or more of a hole-injection layer, a hole-transport layer, a hole-blocking layer, an electron-blocking layer, an electron-transport layer, and an electron-injection layer can be formed as a layer common to the light-emitting devices of the respective colors. For example, a carrier-injection layer (a hole-injection layer or an electron-injection layer) may be formed as the layer 114. Note that all the layers in the EL layer may be separately formed for the respective colors. That is, the EL layer does not necessarily include a layer common to the light-emitting devices of the respective colors.

The EL layer 113*a*, the EL layer 113*b*, and the EL layer 113*c* each preferably include a light-emitting layer and a carrier-transport layer over the light-emitting layer. Accordingly, the light-emitting layer is inhibited from being exposed on the outermost surface in the manufacturing process of the display apparatus 100, so that damage to the light-emitting layer can be reduced. Thus, the reliability of the light-emitting device can be increased.

The hole-injection layer is a layer injecting holes from an anode to the hole-transport layer, and a layer containing a material with a high hole-injection property. Examples of the material with a high hole-injection property include an aromatic amine compound and a composite material containing a hole-transport material and an acceptor material (electron-accepting material).

The hole-transport layer is a layer transporting holes, which are injected from the anode by the hole-injection layer, to the light-emitting layer. The hole-transport layer is a layer containing a hole-transport material. As the hole-transport material, a substance having a hole mobility greater than or equal to $1\times10^{-6}$ $cm^2/Vs$ is preferable. Note that other substances can also be used as long as they have a property of transporting more holes than electrons. As the hole-transport material, a material with a high hole-transport property, such as a T-electron rich heteroaromatic compound (e.g., a carbazole derivative, a thiophene derivative, or a furan derivative) or an aromatic amine (a compound having an aromatic amine skeleton), is preferable.

The electron-transport layer is a layer transporting electrons, which are injected from a cathode by the electron-injection layer, to the light-emitting layer. The electron-transport layer is a layer containing an electron-transport material. As the electron-transport material, a material having an electron mobility greater than or equal to $1\times10^{-6}$ $cm^2/Vs$ is preferable. Note that other substances can also be used as long as they have a property of transporting more electrons than holes. For the electron-transport material, it is possible to use a substance having a high electron-transport property, such as an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound, as well as a metal complex having a quinoline skeleton, a metal complex having a benzoquinoline skeleton, a metal complex having an oxazole skeleton, or a metal complex having a thiazole skeleton.

The electron-injection layer is a layer injecting electrons from the cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

For the electron-injection layer, for example, an alkali metal, an alkaline earth metal, or a compound thereof, such as lithium, cesium, ytterbium, lithium fluoride (LiF), cesium fluoride (CsF), calcium fluoride ($CaF_x$, X is a given number), 8-(quinolinolato) lithium (abbreviation: Liq), 2-(2-pyridyl) phenolatolithium (abbreviation: LiPP), 2-(2-pyridyl)-3-pyridinolatolithium (abbreviation: LiPPy), 4-phenyl-2-(2-pyridyl) phenolatolithium (abbreviation: LiPPP), lithium oxide ($LiO_x$), or cesium carbonate can be used. The electron-injection layer may have a stacked-layer structure of two or more layers. The stacked-layer structure can be, for example, a structure where lithium fluoride is used for a first layer and ytterbium is provided for a second layer.

Alternatively, for the electron-injection layer, an electron-transport material may be used. For example, a compound having an unshared electron pair and an electron deficient heteroaromatic ring can be used as the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) level of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino<2,3-a:2',3'-c>phenazine (abbreviation: HATNA), 2,4,6-tris<3'-(pyridin-3-yl) biphenyl-3-yl>-1,3,5-triazine (abbreviation: TmPPPyTz), or the like can be used as the organic compound having an unshared electron pair. Note that NBPhen has a higher glass transition temperature (Tg) than BPhen and thus has high heat resistance.

In the case of manufacturing a light-emitting device with a tandem structure, an intermediate layer is provided between two light-emitting units. The intermediate layer has a function of injecting electrons into one of the two light-emitting units and injecting holes to the other when a voltage is applied between the pair of electrodes.

For the intermediate layer, for example, a material that can be used for the electron-injection layer, such as lithium, can be suitably used. For the intermediate layer, for example, a material that can be used for the hole-injection layer can be suitably used. For the intermediate layer, a layer containing a hole-transport material and an acceptor material (electron-accepting material) can be used. For the intermediate layer, a layer containing an electron-transport material and a donor material can be used. Forming the intermediate layer including such a layer can suppress an increase in the driving voltage that would be caused by stacking light-emitting units.

The active layer includes a semiconductor. Examples of the semiconductor include an inorganic semiconductor such as silicon and an organic semiconductor including an organic compound. This embodiment shows an example where an organic semiconductor is used as the semiconductor contained in the active layer. The use of an organic semiconductor is preferable because the light-emitting layer and the active layer can be formed by the same method (e.g., a vacuum evaporation method) and thus a common manufacturing apparatus can be used.

Examples of an n-type semiconductor material contained in the active layer include electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). In general, when π-electron conjugation (resonance) spreads in a plane as in benzene, an electron-donating property (donor property) becomes high; however, since fullerene has a spherical shape, fullerene has a high electron-accepting property even when π-electron conjugation widely spreads. The high electron-accepting property efficiently causes rapid charge separation and thus is useful for a light-receiving device. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of the fullerene derivative include [6,6]-phenyl-C71-butyric acid methyl ester (abbreviation: PC70BM), [6,6]-phenyl-C61-butyric acid methyl ester (abbreviation: PC60BM), and 1',1",4',4"-tetrahydro-di[1,4]methanonaphthaleno[1,2:2',3',56,60:2",3"][5,6]fullerene-C60 (abbreviation: ICBA). Another example of an n-type semiconductor material includes a perylenetetracarboxylic derivative such as N,N'-dimethyl-3,4,9,10-perylenetetracarboxylic diimide (abbreviation: Me-PTCDI) and 2,2'-(5,5'-(thieno[3,2-b]thiophene-2,5-diyl)bis(thiophene-5,2-diyl))bis(methan-1-yl-1-ylidene)dimalononitrile (abbreviation: FT2TDMN).

Examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper (II) phthalocyanine (CuPc), tetraphenyldibenzoperiflanthene (DBP), zinc phthalocyanine (ZnPc), tin phthalocyanine (SnPc), quinacridone, and rubrene.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can improve the carrier-transport property.

For example, the active layer is preferably formed by co-evaporation of an n-type semiconductor and a p-type semiconductor. Alternatively, the active layer may be formed by stacking an n-type semiconductor and a p-type semiconductor.

Either a low molecular compound or a high molecular compound can be used for the light-emitting device and the light-receiving device, and an inorganic compound may be contained. Each layer included in the light-emitting device and the light-receiving device can be formed by an evaporation method (including a vacuum evaporation method), a transfer method, a printing method, an inkjet method, a coating method, or the like.

As the hole-transport material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material, an inorganic compound such as zinc oxide (ZnO) can be used.

For the active layer, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the wavelength range. In this case, the third material may be a low molecular compound or a high molecular compound.

The side surfaces of the conductive layer 111*a*, the conductive layer 111*b*, the conductive layer 111*c*, the conductive layer 111*d*, the EL layer 113*a*, the EL layer 113*b*, the EL layer 113*c*, and the light-receiving layer 113*d* are covered with the insulating layer 125 and the insulating layer 127. This can inhibit contact between the layer 114 (or the common electrode 115) and the side surface of any of the conductive layer 111*a*, the conductive layer 111*b*, the conductive layer 111*c*, the conductive layer 111*d*, the EL layer 113*a*, the EL layer 113*b*, the EL layer 113*c*, and the light-receiving layer 113*d*, thereby inhibiting a short circuit of the light-emitting devices and the light-receiving device.

The insulating layer 125 preferably covers at least the side surfaces of the conductive layer 111*a*, the conductive layer 111*b*, the conductive layer 111*c*, and the conductive layer 111*d*. It is further preferable that the insulating layer 125 cover the side surfaces of the EL layer 113*a*, the EL layer 113*b*, the EL layer 113*c*, and the light-receiving layer 113*d*. The insulating layer 125 can be in contact with the side surfaces of the conductive layer 111*a*, the conductive layer 111*b*, the conductive layer 111*c*, the conductive layer 111*d*, the EL layer 113*a*, the EL layer 113*b*, the EL layer 113*c*, and the light-receiving layer 113*d*.

The insulating layer 127 is provided over the insulating layer 125 to fill a depressed portion formed by the insulating layer 125. The insulating layer 127 can overlap with the side surfaces of the conductive layer 111*a*, the conductive layer 111*b*, the conductive layer 111*c*, the conductive layer 111*d*, the EL layer 113*a*, the EL layer 113*b*, the EL layer 113*c*, and the light-receiving layer 113*d* with the insulating layer 125 therebetween.

Note that one of the insulating layer 125 and the insulating layer 127 is not necessarily provided. For example, in the case where the insulating layer 125 is not provided, the insulating layer 127 can be in contact with the side surfaces of the EL layer 113*a*, the EL layer 113*b*, the EL layer 113*c*, and the light-receiving layer 113*d*. The insulating layers 127 can be provided over the layer 101 so as to fill spaces between the EL layers included in the light-emitting devices and the light-receiving layer included in the light-receiving device.

The layer 114 and the common electrode 115 are provided over the EL layer 113*a*, the EL layer 113*b*, the EL layer 113*c*, the light-receiving layer 113*d*, the insulating layer 125, and the insulating layer 127. Before the insulating layer 125 and the insulating layer 127 are provided, a level difference is generated between a region where the pixel electrode is provided and a region where the pixel electrode is not provided (a region between the light-emitting devices and the light-receiving device). In the display apparatus of one embodiment of the present invention, the level difference can be eliminated with use of the insulating layer 125 and the insulating layer 127, and the coverage with the layer 114 and the common electrode 115 can be improved. Consequently, a connection defect due to disconnection of the common electrode 115 can be inhibited. Alternatively, an increase in electric resistance due to local thinning of the common electrode 115 by the level difference can be inhibited.

In order to improve the planarity of the formation surfaces of the layer 114 and the common electrode 115, the levels of the top surface of the insulating layer 125 and the top surface of the insulating layer 127 are each preferably the same or substantially the same as the level of the top surface of at least one of the EL layer 113*a*, the EL layer 113*b*, the EL layer 113*c*, and the light-receiving layer 113*d*. The top surface of the insulating layer 127 preferably has a flat shape and may have a projected portion or a depressed portion.

The insulating layer 125 includes regions in contact with the side surfaces of the EL layer 113*a*, the EL layer 113*b*, the EL layer 113*c*, and the light-receiving layer 113*d*, and functions as a protective insulating layer for the EL layer 113*a*, the EL layer 113*b*, the EL layer 113*c*, and the light-receiving layer 113*d*. With the insulating layer 125, entry of impurities (e.g., oxygen or moisture) through the side surfaces of the EL layer 113*a*, the EL layer 113*b*, the EL layer 113*c*, and the light-receiving layer 113*d* into their insides can be inhibited, and thus a highly reliable display apparatus can be obtained.

When the width (thickness) of the insulating layer 125 in the regions in contact with the side surfaces of the EL layer 113*a*, the EL layer 113*b*, the EL layer 113*c*, and the light-receiving layer 113*d* is large in a cross-sectional view; spaces between the EL layer 113*a*, the EL layer 113*b*, the EL layer 113*c*, and the light-receiving layer 113*d* increase, which might result in a lower aperture ratio. In addition, when the width (thickness) of the insulating layer 125 is small, the effect of inhibiting entry of impurities through the side surfaces of the EL layer 113*a*, the EL layer 113*b*, the EL layer 113*c*, and the light-receiving layer 113*d* into their insides might be weakened.

The width (thickness) of the insulating layer 125 in the regions in contact with the side surfaces of the EL layer 113*a*, the EL layer 113*b*, the EL layer 113*c*, and the light-receiving layer 113*d* is preferably greater than or equal to 3 nm and less than or equal to 200 nm, further preferably greater than or equal to 3 nm and less than or equal to 150 nm, further preferably greater than or equal to 5 nm and less than or equal to 150 nm, still further preferably greater than or equal to 5 nm and less than or equal to 100 nm, still further preferably greater than or equal to 10 nm and less than or equal to 100 nm, yet further preferably greater than or equal to 10 nm and less than or equal to 50 nm. When the width (thickness) of the insulating layer 125 is within the above-described range, a highly reliable display apparatus with a high aperture ratio can be obtained.

The insulating layer 125 can contain an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure.

The insulating layer 125 can be formed by a sputtering method, a chemical vapor deposition (CVD) method, a vacuum evaporation method, a pulsed laser deposition (PLD) method, an atomic layer deposition (ALD) method, or the like. The insulating layer 125 is preferably formed by an ALD method that can provide good coverage. An ALD method causes less deposition damage to a formation surface, and thus can be suitably used.

Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film.

Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferable because it has high selectivity with respect to the EL layer in etching and has a function of protecting the EL layer in forming the insulating layer 127 which is to be described later. In particular, when an inorganic insulating 30) film such as an aluminum oxide film, a hafnium oxide film, or a silicon oxide film formed by an ALD method is used as the insulating layer 125, the insulating layer 125 including few pinholes and having an excellent function of protecting the EL layer can be formed.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

The insulating layer 127 provided over the insulating layer 125 has a planarization function for the depressed portion of the insulating layer 125, which is formed between adjacent light-emitting devices. In other words, the insulating layer 127 has an effect of improving the planarity of the formation surface of the common electrode 115. An insulating layer containing an organic material can be suitably used as the insulating layer 127. For the insulating layer 127, an acrylic resin, a polyimide resin, an epoxy resin, an imide resin, a polyamide resin, a polyimide-amide resin, a silicone resin, a siloxane resin, a benzocyclobutene-based resin, a phenol resin, a precursor of any of these resins, or the like can be used, for example. For the insulating layer 127, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin may be used. Moreover, a photosensitive resin can be used for the insulating layer 127. A photoresist may be used for the photosensitive resin. As the photosensitive resin, a positive material or a negative material can be used.

A difference between the top surface level of the insulating layer 127 and the top surface level of any of the EL layer 113*a*, the EL layer 113*b*, the EL layer 113*c*, and the light-receiving layer 113*d* is preferably less than or equal to 0.5 times, further preferably less than or equal to 0.3 times the thickness of the insulating layer 127, for example. As another example, the insulating layer 127 may be provided such that the top surface level of any of the EL layer 113*a*, the EL layer 113*b*, the EL layer 113*c*, and the light-receiving layer 113*d* is higher than the top surface level of the insulating layer 127. As another example, the insulating layer 127 may be provided such that the top surface level of the insulating layer 127 is higher than the top surface levels of the light-emitting layers included in the EL layer 113*a*, the EL layer 113*b*, and the EL layer 113*c*, and higher than the top surface level of the active layer included in the light-receiving layer 113*d*.

The protective layer 131 and the protective layer 132 are preferably provided over the light-emitting device 130*a*, the light-emitting device 130*b*, the light-emitting device 130*c*, and the light-receiving device 130*d*. Providing the protective layer 131 and the protective layer 132 can improve the reliability of the light-emitting devices and the light-receiving device.

There is no limitation on the conductivity of the protective layer 131 and the protective layer 132. As the protective layer 131 and the protective layer 132, at least one kind of insulating films, semiconductor films, and conductive films can be used.

The protective layer 131 and the protective layer 132 each including an inorganic film can inhibit deterioration of the light-emitting devices and the light-receiving device by preventing oxidation of the common electrode 115 and inhibiting entry of impurities (e.g., moisture and oxygen) into the light-emitting device 130*a*, the light-emitting device 130*b*, the light-emitting device 130*c*, and the light-receiving device 130*d*, for example; thus, the reliability of the display apparatus can be improved.

For each of the protective layer 131 and the protective layer 132, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

Each of the protective layers 131 and 132 preferably includes a nitride insulating film or a nitride oxide insulating film, and further preferably includes a nitride insulating film.

For each of the protective layer 131 and the protective layer 132, an inorganic film containing an In—Sn oxide (also referred to as ITO), an In—Zn oxide, a Ga—Zn oxide, an Al—Zn oxide, an indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When extraction of light emitted from the light-emitting device and incidence of light on the light-receiving device are performed through the protective layer 131 and the protective layer 132, the protective layer 131 and the protective layer 132 each preferably have a high transmitting property with respect to visible light. For example, ITO, IGZO, and aluminum oxide are preferable because they are each an inorganic material having a high property of transmitting visible light.

The protective layer 131 and the protective layer 132 can each have, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (e.g., water and oxygen) into the EL layer.

Furthermore, the protective layer 131 and the protective layer 132 may each include an organic film. For example, the protective layer 132 may include both an organic film and an inorganic film.

The protective layer 131 and the protective layer 132 may be formed by different deposition methods. Specifically, the protective layer 131 may be formed by an ALD method, and the protective layer 132 may be formed by a sputtering method.

The end portions of the top surfaces of the conductive layer 111*a*, the conductive layer 111*b*, the conductive layer 111*c*, and the conductive layer 111*d* are not covered with an insulating layer. This allows the distance between adjacent devices among the light-emitting devices and the light-emitting device to be extremely short. Accordingly, the display apparatus can have high definition or high resolution.

In this specification and the like, a device manufactured using a metal mask or an FMM (fine metal mask or a high-resolution mask) may be referred to as a device having an MM (metal mask) structure. In this specification and the like, a device manufactured without using a metal mask or an FMM may be referred to as a device having an MML (metal maskless) structure.

In this specification and the like, a structure where light-emitting layers in light-emitting devices of different colors (here, blue (B), green (G), and red (R)) are separately formed or separately patterned is sometimes referred to as an SBS (Side By Side) structure. The SBS structure can optimize materials and structures of light-emitting devices and thus can extend freedom of choice of materials and structures, whereby the luminance and the reliability can be easily improved.

In this specification and the like, a light-emitting device capable of emitting white light is sometimes referred to as a white-light-emitting device. Note that a combination of white-light-emitting devices with coloring layers (e.g., color filters) enables a full-color display apparatus.

Note that structures of light-emitting devices can be classified roughly into a single structure and a tandem structure. A device having a single structure includes one light-emitting unit between a pair of electrodes, and the light-emitting unit preferably includes one or more light-emitting layers. To obtain white light emission, two or more of light-emitting layers are selected such that their emission colors are complementary. For example, when an emission color of a first light-emitting layer and an emission color of a second light-emitting layer are complementary, the light-emitting device can be configured to emit white light as a whole. In the case of a light-emitting device including three or more light-emitting layers, white light emission can be obtained by mixing emission colors of the light-emitting layers.

A device having a tandem structure includes two or more light-emitting units between a pair of electrodes, and each light-emitting unit preferably includes one or more light-emitting layers. To obtain white light emission, the structure is made so that light from light-emitting layers of the plurality of light-emitting units can be combined to be white light. Note that the structure for obtaining white light emission is similar to that in the case of a single structure. In 20) the device having a tandem structure, an intermediate layer such as a charge generation layer is suitably provided between the plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is suitably used. Meanwhile, the white-light-emitting device is preferable in terms of lower manufacturing cost or higher manufacturing yield because the manufacturing process of the white-light-emitting device is simpler than that of the light-emitting device having an SBS structure.

In the display apparatus of this embodiment, the distance between the light-emitting devices can be short. Specifically, the distance between the light-emitting devices, the distance between the EL layers, or the distance between the pixel electrodes can be less than 10 μm, less than or equal to 5 μm, less than or equal to 3 μm, less than or equal to 2 μm, less than or equal to 1 μm, less than or equal to 500 nm, less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus includes a region where the distance between the side surface of the EL layer 113*a* and the side surface of the EL layer 113*b* or the distance between the side surface of the EL layer 113*b* and the side surface of the EL layer 113*c* is less than or equal to 1 μm, preferably less than or equal to 0.5 μm (500 nm), further preferably less than or equal to 100 nm.

Similarly, in the display apparatus of this embodiment, the distance between the light-receiving devices can be short. Specifically, the distance between the light-receiving devices, the distance between the light-receiving layers, or the distance between the pixel electrodes can be less than 10 μm, less than or equal to 5 μm, less than or equal to 3 μm, less than or equal to 2 μm, less than or equal to 1 μm, less than or equal to 500 nm, less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus includes a region where a distance between a side surface of a light-receiving layer and a side surface of a light-receiving layer that are adjacent to each other is less than or equal to 1 μm, preferably less than or equal to 0.5 μm (500 nm), further preferably less than or equal to 100 nm.

In the display apparatus of this embodiment, the distance between the light-emitting device and the light-receiving device can be short. Specifically, the distance between the light-emitting device and the light-receiving device, the distance between the EL layer and the light-receiving layer, or the distance between the pixel electrodes can be less than 20 μm, less than or equal to 10 μm, less than or equal to 5 μm, less than or equal to 3 μm, less than or equal to 2 μm, less than or equal to 1 μm, less than or equal to 500 nm, less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus includes a region where the distance 30) between the side surface of the EL layer 113*a* and the side surface of the light-receiving layer 113*d*, the distance between the side surface of the EL layer 113*b* and the side surface of the light-receiving layer 113*d*, or the distance between the side surface of the EL layer 113*c* and the light-receiving layer 113*d* is less than or equal to 1 μm, preferably less than or equal to 0.5 μm (500 nm), further preferably less than or equal to 100 nm.

A light-blocking layer may be provided on the surface of the substrate 120 on the resin layer 122 side. A variety of optical members can be arranged on the outer surface of the substrate 120. Examples of the optical members include a polarizing plate, a retardation plate, a light diffusion layer (a diffusion film or the like), an anti-reflective layer, and a light-condensing film. Furthermore, an antistatic film to inhibit attachment of dust, a water repellent film to reduce attachment of stain, a hard coat film to inhibit generation of a scratch caused by the use, an impact-absorbing layer, or the like may be arranged on the outer side of the substrate 120.

For the substrate 120, glass, quartz, ceramics, sapphire, a resin, a metal, an alloy, a semiconductor, or the like can be used. The substrate on the side from which light from the light-emitting device is extracted is formed using a material that transmits the light. When the substrate 120 is formed using a flexible material, the flexibility of the display apparatus can be increased. Furthermore, a polarizing plate may be used as the substrate 120.

For the substrate 120, any of the following can be used: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for the substrate 120.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic resin film.

When a film is used for the substrate and the film absorbs water, the shape of the display panel might be changed, e.g., creases are generated. Thus, for the substrate, a film with a low water absorption rate is preferably used. For example, the water absorption rate of the film to be used is preferably lower than or equal to 1%, further preferably lower than or equal to 0.1%, still further preferably lower than or equal to 0.01%.

For the resin layer 122, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. Alternatively, a two-component resin may be used. An adhesive sheet or the like may be used.

As materials that can be used for a gate, a source, and a drain of a transistor and conductive layers such as a variety of wirings and electrodes included in a display apparatus, metals such as aluminum, titanium, chromium, nickel, copper, yttrium, zirconium, molybdenum, silver, tantalum, or tungsten, an alloy containing any of these metals as its main component, and the like can be given. A single layer or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), it is preferably thinned so as to have a light-transmitting property. A stacked film of any of the above materials can be used as a conductive layer. For example, a stacked film of indium tin oxide and an alloy of silver and magnesium, or the like is preferably used to increase the conductivity. Such materials can also be used for conductive layers such as wirings and electrodes included in the display apparatus, and conductive layers (e.g., a conductive layer functioning as a pixel electrode or a common electrode) included in a light-emitting device.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

Note that the display apparatus of one embodiment of the present invention can have a structure including the OS transistor and the light-emitting device having a metal maskless (MML) structure. With this structure, the leakage current that might flow through the transistor and the leakage current that might flow between adjacent light-emitting devices (also referred to as a lateral leakage current, a side leakage current, or the like) can become extremely low. With the structure, a viewer can notice any one or more of the image crispness, the image sharpness, and a high contrast ratio in an image displayed on the display apparatus. Note that when the leakage current that might flow through the transistor and the lateral leakage current between the light-emitting devices are extremely low, light leakage or the like that might occur in black display can be reduced as much as possible (such display is also referred to as completely black display).

<Pixel Layout>

Pixel layouts will be described below. There is no particular limitation on the arrangement of subpixels, and a variety of methods can be employed. Examples of the arrangement of subpixels include stripe arrangement, S stripe arrangement, matrix arrangement, delta arrangement, Bayer arrangement, and PenTile arrangement.

Examples of a top surface shape of the subpixel include polygons such as a triangle, a quadrangle (including a rectangle and a square), and a pentagon; polygons with rounded corners; an ellipse; and a circle. Here, the top surface shape of the subpixel corresponds to the top surface shape of a light-emitting region of a light-emitting device or a light-receiving region of a light-receiving device.

Figure 27A:
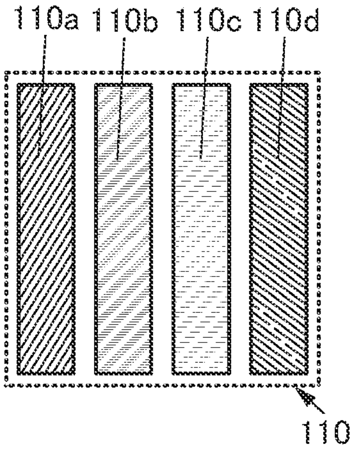
FIG. 27A to FIG. 27I are top views each illustrating an example of a pixel.
Figure 27B:
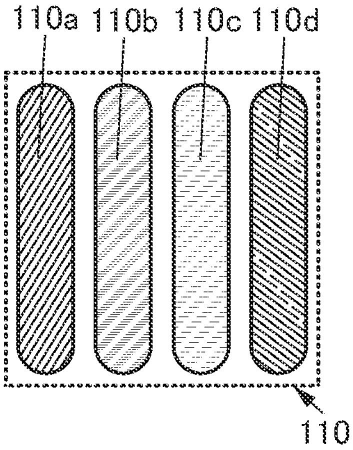
Figure 27C:
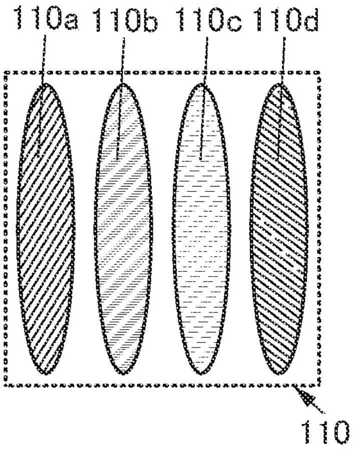

The pixels 110 illustrated in FIG. 27A to FIG. 27C employ stripe arrangement.

The display portion of the display apparatus of one embodiment of the present invention includes a plurality of pixels, and the pixels are arranged in the row direction and the column direction in a matrix. A display portion employing the pixel layout illustrated in FIG. 27A to FIG. 27C includes a first arrangement where the subpixels 110*a*, the subpixels 110*b*, the subpixel 110*c*, and the subpixels 110*d* are repeatedly arranged in this order in the row direction. Furthermore, the first arrangement is repeated in the column direction.

The display portion includes a second arrangement where the subpixels 110*a* are repeatedly arranged in the column direction, a third arrangement where the subpixels 110*b* are repeatedly arranged in the column direction, a fourth arrangement where the subpixels 110*c* are repeatedly arranged in the column direction, and a fifth arrangement where the subpixels 110*d* are repeatedly arranged in the column direction. Furthermore, the second arrangement, the third arrangement, the fourth arrangement, and the fifth arrangement are repeated in this order in the row direction.

In this embodiment and the like, for clear explanation of the pixel layout, the horizontal direction is the row direction and the vertical direction is the column direction in the drawing; however, one embodiment of the present invention is not limited thereto and the row direction and the column direction can be interchangeable with each other. Thus, in this specification and the like, one of the row direction and the column direction is referred to as a first direction and the other of the row direction and the column direction is referred to as a second direction in some cases. The second direction is orthogonal to the first direction. Note that in the case where the top surface shape of the display portion is a rectangular shape, each of the first direction and the second direction is not necessarily parallel to a straight line portion of the outline of the display portion. The top surface shape is not limited to a rectangular shape, and may be a polygonal shape or a shape with curve (e.g., circle or ellipse). The first direction and the second direction may be a given direction with respect to the display portion.

In this specification and the like, for clear explanation of pixel layout, the subpixels are illustrated in the order from the left of a diagram; however, without limitation thereto, the order can be changed into the order from the right. Similarly, the subpixels are illustrated in the order from the top of a diagram; however, without limitation thereto, the order can be changed into the order from the bottom.

In this specification and the like, “repeatedly arranged” means that a minimum unit of ordered subpixels is arranged twice or more.

FIG. 27A illustrates an example where each subpixel has a rectangular top surface shape, FIG. 27B illustrates an example where each subpixel has a top surface shape formed by combining two half circles and a rectangle, and FIG. 27C illustrates an example where each subpixel has an elliptical top surface shape.

In a photolithography method, as a pattern to be processed becomes finer, the influence of light diffraction becomes more difficult to ignore; thus, the fidelity in transferring a photomask pattern by light exposure is degraded, and it becomes difficult to process a resist mask into a desired shape. Thus, a pattern with rounded corners is likely to be formed even with use of a rectangular photomask pattern. Consequently, the top surface shape of a subpixel becomes a polygon with rounded corners, an ellipse, a circle, or the like in some cases.

Furthermore, in the manufacturing method of the display apparatus of one embodiment of the present invention, the EL layer or the light-receiving layer is processed into an island-like shape with the use of a resist mask. A resist film formed over the EL layer or the light-receiving layer needs to be cured at a temperature lower than the upper temperature limit of the EL layer or the light-receiving layer. Thus, the resist film is insufficiently cured in some cases depending on the upper temperature limit of the material of the EL layer, the upper temperature limit of the material of the light-receiving layer, or the curing temperature of the resist material. An insufficiently cured resist film may have a shape different from a desired shape at the time of processing. As a result, the top surface shapes of the EL layer and the light-receiving layer each become a polygon with rounded corners, an ellipse, a circle, or the like in some cases. For example, when a resist mask with a square top surface shape is intended to be formed, a resist mask with a circular top surface shape may be formed, and the EL layer and the light-receiving layer each have a circular top surface shape in some cases.

To obtain a desired top surface shapes of the EL layer and the light-receiving layer, a technique of correcting a mask pattern in advance so that a transferred pattern agrees with a design pattern (an OPC (Optical Proximity Correction) technique) may be used. Specifically, with the OPC technique, a pattern for correction is added to a corner portion or the like of a figure on a mask pattern.

Figure 27D:
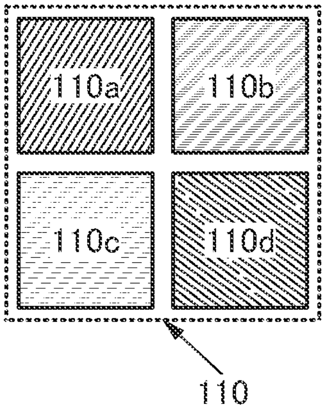
Figure 27E:
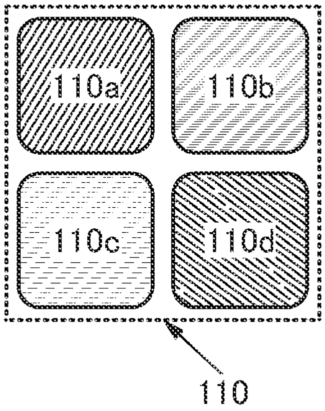
Figure 27F:
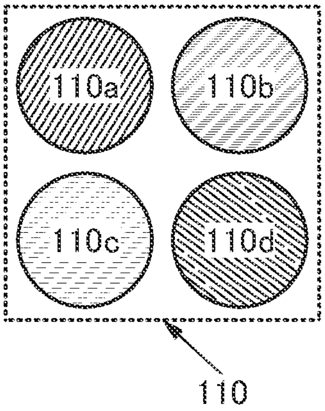

The pixels 110 illustrated in FIG. 27D to FIG. 27F employ matrix arrangement.

A display portion of a display apparatus employing the pixel layout illustrated in FIG. 27D to FIG. 27F includes a first arrangement where the subpixel 110*a* and the subpixel 110*b* are alternately arranged repeatedly in the row direction and a second arrangement where the subpixel 110*c* and the subpixel 110*d* are alternately arranged repeatedly in the row direction. Furthermore, the first arrangement and the second arrangement are repeated in this order in the column direction.

The display portion includes a third arrangement where the subpixel 110*a* and the subpixel 110*c* are alternately arranged repeatedly in the column direction and a fourth arrangement where the subpixel 110*b* and the subpixel 110*d* are alternately arranged repeatedly in the column direction. Furthermore, the third arrangement and the fourth arrangement are alternately repeated in the row direction.

FIG. 27D illustrates an example where each subpixel has a square top surface shape, FIG. 27E illustrates an example where each subpixel has a substantially square top surface shape with rounded corners, and FIG. 27F illustrates an example where each subpixel has a circular top surface shape.

Figure 27G:
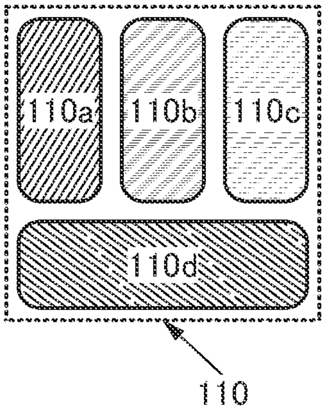

FIG. 27G illustrates an example where one the pixel 110 is composed of two rows and three columns. The pixel 110 includes three subpixels (the subpixels 110*a*, 110*b*, and 110*c*) in the upper row (first row) and one subpixel (the subpixel 110*d*) in the lower row (second row). In other words, the pixel 110 includes the subpixel 110*a* in the left column (first column), the subpixel 110*b* in the center column (second column), the subpixel 110*c* in the right column (third column), and the subpixel 110*d* across these three columns.

Figure 27H:
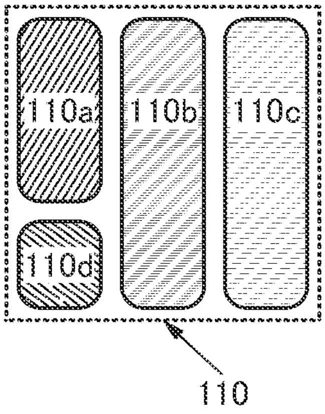

As illustrated in FIG. 27G, the subpixels may have different sizes. FIG. 27G illustrates a structure where the subpixel 110*d* is larger than the subpixel 110*a* to the subpixel 110*c*. FIG. 27H illustrates a structure where the subpixel 110*b* and the subpixel 110*c* are larger than the subpixel 110*a*, and the subpixel 110*a* is larger than the subpixel 110*d*. The pixel 110 illustrated in FIG. 27H includes two subpixels (the subpixels 110*a* and 110*d*) in the left column (first column), the subpixel 110*b* in the center column (second column), and the subpixel 110*c* in the right column (third column).

A display portion of a display apparatus employing the pixel layout illustrated in FIG. 27G includes a first arrangement where the subpixels 110*a*, the subpixels 110*b*, and the subpixels 110*c* are repeatedly arranged in this order in the row direction and a second arrangement where the subpixels 110*d* are repeatedly arranged in the row direction. Furthermore, the first arrangement and the second arrangement are alternately repeated in the column direction.

The display portion includes a third arrangement where the subpixels 110*a* and the subpixels 110*d* are alternately arranged repeatedly in the column direction, a fourth arrangement where the subpixels 110*b* and the subpixels 110*d* are alternately arranged repeatedly in the column direction, and a fifth arrangement where the subpixels 110*c* and the subpixels 110*d* are alternately arranged repeatedly in the column direction. Furthermore, the third arrangement, the fourth arrangement, and the fifth arrangement are repeated in this order in the row direction.

A display portion of a display apparatus employing the pixel layout illustrated in FIG. 27H includes a first arrangement where the subpixels 110*a*, the subpixels 110*b*, and the subpixels 110*c* are repeatedly arranged in this order in the row direction and a second arrangement where the subpixels 110*d*, the subpixels 110*b*, and the subpixels 110*c* are repeatedly arranged in this order in the row direction. Furthermore, the first arrangement and the second arrangement are alternately repeated in the column direction.

The display portion includes a third arrangement where the subpixels 110*a* and the subpixels 110*d* are alternately arranged repeatedly in the column direction, a fourth arrangement where the subpixels 110*b* are repeatedly arranged in the column direction, and a fifth arrangement where the subpixels 110*c* are repeatedly arranged in the column direction. Furthermore, the third arrangement, the fourth arrangement, and the fifth arrangement are repeated in this order in the row direction.

Figure 27I:
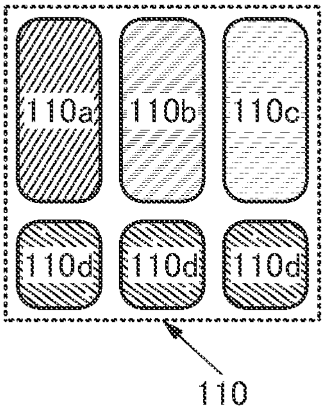

FIG. 27I illustrates an example where one pixel 110 is composed of two rows and three columns. The pixel 110 includes the subpixel 110*a*, the subpixel 110*b*, the subpixel 110*c*, and three subpixels 110*d*. The pixel 110 includes three subpixels (the subpixels 110*a*, 110*b*, and 110*c*) in the upper row (first row) and three subpixels (the three subpixels 110*d*) in the lower row (second row). In other words, the pixel 110 includes two subpixels (the subpixels 110*a* and 110*d*) in the left column (first column), two subpixels (the subpixels 110*b* and 110*d*) in the center column (second column), and two subpixels (the subpixels 110*c* and 110*d*) in the right column (third column).

A display portion of a display apparatus employing the pixel layout illustrated in FIG. 27I includes a first arrangement where the subpixels 110*a*, the subpixels 110*b*, and the subpixels 110*c* are repeatedly arranged in this order in the row direction and a second arrangement where the subpixels 110*d* are repeatedly arranged in the row direction. Furthermore, the first arrangement and the second arrangement are alternately repeated in the column direction.

The display portion includes a third arrangement where the subpixels 110*a* and the subpixels 110*d* are alternately arranged repeatedly in the column direction, a fourth arrangement where the subpixels 110*b* and the subpixels 110*d* are alternately arranged repeatedly in the column direction, and a fifth arrangement where the subpixels 110*c* and the subpixels 110*d* are alternately arranged repeatedly in the column direction. Furthermore, the third arrangement, the fourth arrangement, and the fifth arrangement are repeated in this order in the row direction.

The pixels 110 illustrated in FIG. 27A to FIG. 27I are each composed of four subpixels: the subpixel 110*a*, the subpixel 110*b*, the subpixel 110*c*, and the subpixel 110*d*. The subpixels 110*a*, 110*b*, 110*c*, and 110*d* each include a light-emitting device emitting light in a different wavelength range or a light-receiving device. For example, as illustrated in FIG. 28A to FIG. 28E, the subpixel 110*a* can be a subpixel (R) having a function of emitting red light, the subpixel 110*b* can be a subpixel (G) having a function of emitting green light, the subpixel 110*c* can be a subpixel (B) having a function of emitting blue light, and the subpixel 110*d* can be a subpixel (PS) having a light-receiving function.

Figure 28A:
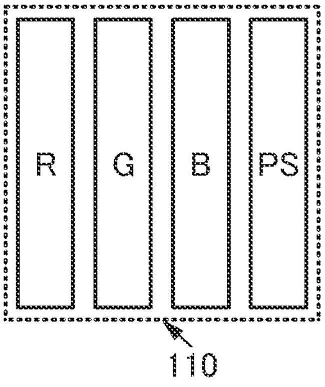
FIG. 28A to FIG. 28E are top views each illustrating an example of a pixel.

A pixel portion employing the pixel layout illustrated in FIG. 28A includes a first arrangement where the subpixel (R), the subpixel (G), the subpixel (B), and the subpixel (PS) are repeatedly arranged in this order in the row direction. Furthermore, the first arrangement is repeated in the column direction.

The display portion includes a second arrangement where the subpixels (R) are repeatedly arranged in the column direction, a third arrangement where the subpixels (G) are repeatedly arranged in the column direction, a fourth arrangement where the subpixels (B) are repeatedly arranged in the column direction, and a fifth arrangement where the subpixels (PS) are repeatedly arranged in the column direction. Furthermore, the second arrangement, the third arrangement, the fourth arrangement, and the fifth arrangement are repeated in this order in the row direction.

Figure 28B:
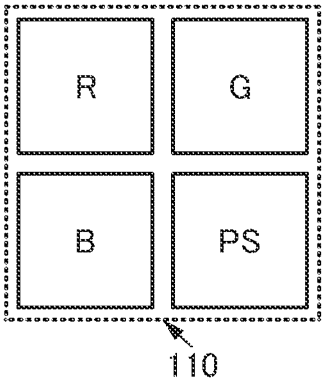

A display portion of a display apparatus employing the pixel layout illustrated in FIG. 28B includes a first arrangement where the subpixels (R) and the subpixels (G) are alternately arranged repeatedly in the row direction and a second arrangement where the subpixels (B) and the subpixels (PS) are alternately arranged repeatedly in the row direction. Furthermore, the first arrangement and the second arrangement are repeated in this order in the column direction.

The display portion includes a third arrangement where the subpixels (R) and the subpixels (B) are alternately arranged repeatedly in the column direction and a fourth arrangement where the subpixels (G) and the subpixels (PS) are alternately arranged repeatedly in the column direction. Furthermore, the third arrangement and the fourth arrangement are alternately repeated in the row direction.

Figure 28C:
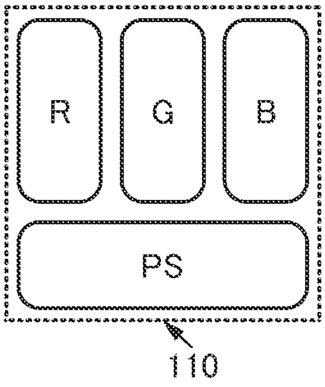

A display portion of a display apparatus employing the pixel layout illustrated in FIG. 28C includes a first arrangement where the subpixels (R), the subpixels (G), and the subpixels (B) are repeatedly arranged in this order in the row direction and a second arrangement where the subpixels (PS) are repeatedly arranged in the row direction. Furthermore, the first arrangement and the second arrangement are alternately repeated in the column direction.

The display portion includes a third arrangement where the subpixels (R) and the subpixels (PS) are alternately arranged repeatedly in the column direction, a fourth arrangement where the subpixels (G) and the subpixels (PS) are alternately arranged repeatedly in the column direction, and a fifth arrangement where the subpixels (B) and the subpixels (PS) are alternately arranged repeatedly in the column direction. Furthermore, the third arrangement, the fourth arrangement, and the fifth arrangement are repeated in this order in the row direction.

Figure 28D:
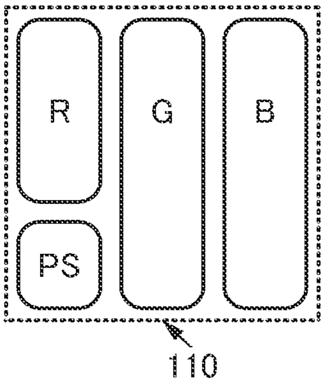

A display portion of a display apparatus employing the pixel layout illustrated in FIG. 28D includes a first arrangement where the subpixels (R), the subpixels (G), and the subpixels (B) are repeatedly arranged in this order in the row direction, and a second arrangement where the subpixels (PS), the subpixels (G), and the subpixels (B) are repeatedly arranged in this order in the row direction. Furthermore, the first arrangement and the second arrangement are alternately repeated in the column direction.

The display portion includes a third arrangement where the subpixels (R) and the subpixels (PS) are alternately arranged repeatedly in the column direction, a fourth arrangement where the subpixels (G) are repeatedly arranged in the column direction, and a fifth arrangement where the subpixels (B) are repeatedly arranged in the column direction. Furthermore, the third arrangement, the fourth arrangement, and the fifth arrangement are repeated in this order in the row direction.

Figure 28E:
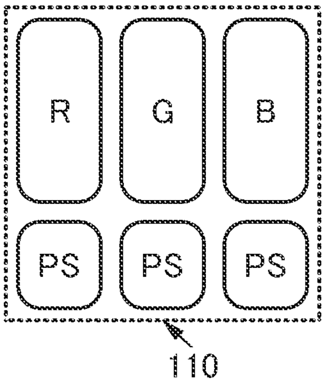

A display portion of a display apparatus employing the pixel layout illustrated in FIG. 28E includes a first arrangement where the subpixels (R), the subpixels (G), and the subpixels (B) are repeatedly arranged in this order in the row direction, and a second arrangement where the subpixels (PS) are repeatedly arranged in the row direction. Furthermore, the first arrangement and the second arrangement are alternately repeated in the column direction.

The display portion includes a third arrangement where the subpixels (R) and the subpixels (PS) are alternately arranged repeatedly in the column direction, a fourth arrangement where the subpixels (G) and the subpixels (PS) are alternately arranged repeatedly in the column direction, and a fifth arrangement where the subpixels (B) and the subpixels (PS) are alternately arranged repeatedly in the column direction. Furthermore, the third arrangement, the fourth arrangement, and the fifth arrangement are repeated in this order in the row direction.

The light-emitting areas of the subpixel (R), the subpixel (G), and the subpixel (B) including the light-emitting devices may be the same or different from each other. For example, the light-emitting area of the subpixel including the light-emitting device can be determined depending on the lifetime of the light-emitting device. The light-emitting area of a subpixel including the light-emitting device with a short lifetime is preferably made larger than the light-emitting areas of the other subpixels.

FIG. 28D illustrates an example where the light-emitting areas of the subpixel (G) and the subpixel (B) are larger than the light-emitting area of the subpixel (R). This structure can be suitably used in the case where the lifetimes of the light-emitting device emitting green light and the light-emitting device emitting blue light are shorter than the lifetime of the light-emitting device emitting red light. In the subpixel (G) and the subpixel (B) each having a large light-emitting area, the current densities of the light-emitting device emitting green light and the light-emitting device emitting blue light included in the subpixels are low, enabling longer lifetimes of the light-emitting devices. That is, the display apparatus can have high reliability.

Figure 29A:
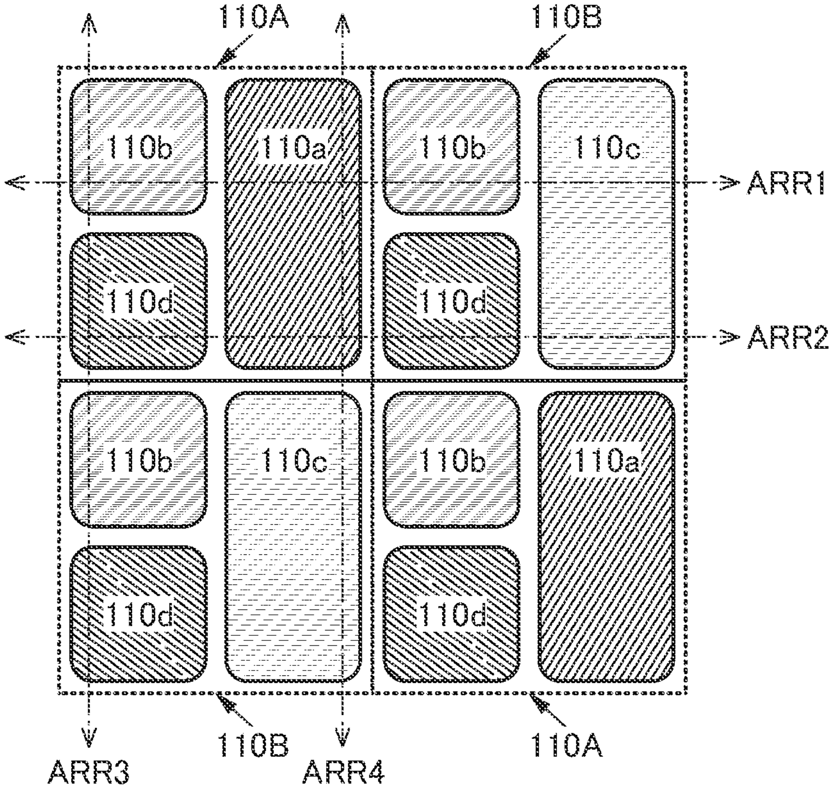
FIG. 29A and FIG. 29B are top views each illustrating an example of a pixel.
Figure 29B:
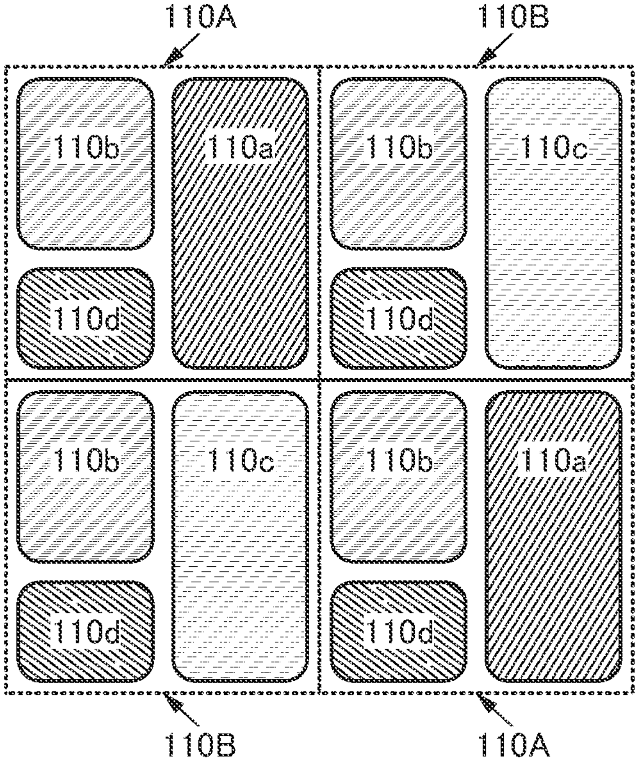

FIG. 29A and FIG. 29B illustrate pixel layout examples different from those in FIG. 27A to FIG. 27I and FIG. 28A to FIG. 28E.

FIG. 29A illustrates four pixels; in the illustrated structure, two adjacent pixels, a pixel 110A and a pixel 110B, include different subpixels. The pixel 110A includes three subpixels of the subpixel 110*a*, the subpixel 110*b*, and the subpixel 110*d*, and the pixel 110B adjacent to the pixel 110A includes the subpixel 110*b*, the subpixel 110*c*, and the subpixel 110*d*. That is, the pixels 110A including the subpixel 110*a* and the pixel 110B not including the subpixels 110*a* are alternately arranged repeatedly in the column direction and the row direction. Similarly, the pixels 110A not including the subpixel 110*c* and the pixels 110B including the subpixel 110*c* are alternately arranged repeatedly in the column direction and the row direction.

The pixel 110A is composed of two rows and two columns, and includes two subpixels (the subpixels 110*b* and 110*d*) in the left column (first column) and one subpixel (the subpixel 110*a*) in the right column (second column). In other words, the pixel 110A includes two subpixels (the subpixels 110*a* and 110*b*) in the upper row (first row), two subpixels (the subpixels 110*a* and 110*d*) in the lower row (second row), and the subpixel 110*a* across these two rows.

The pixel 110B is composed of two rows and two columns, and includes two subpixels (the subpixels 110*b* and 110*d*) in the left column (first column) and one subpixel (the subpixel 110*c*) in the right column (second column). In other words, the pixel 110A includes two subpixels (the subpixels 110*b* and 110*c*) in the upper row (first row), two subpixels (the subpixels 110*c* and 110*d*) in the lower row (second row), and the subpixel 110*c* across these two rows.

The pixels illustrated in FIG. 29A have a structure where two pixels of the pixel 110A and the pixel 110B include four kinds of subpixels of the subpixel 110*a*, the subpixel 110*b*, the subpixel 110*c*, and the subpixel 110*d*. The two pixels of the pixel 110A and the pixel 110B include one subpixel 110*a*, two subpixels 110*b*, one subpixel 110*c*, and two subpixels 110*d*. Such a structure can increase the areas of the subpixels while maintaining a pseudo-high definition, thereby lowering the required processing accuracy. That is, when comparison is made with the same processing accuracy, a display apparatus having a higher definition can be manufactured. In addition, the number of transistors per area can be reduced, whereby the productivity can be increased. Accordingly, a display apparatus having a pseudo-high definition can be manufactured with high productivity.

A display portion of a display apparatus employing the pixel layout illustrated in FIG. 29A includes a first arrangement ARR1 where the subpixels 110*b*, the subpixels 110*a*, the subpixels 110*b*, and the subpixels 110*c* are repeatedly arranged in this order in the row direction, and a second arrangement ARR2 where the subpixels 110*d*, the subpixels 110*a*, the subpixels 110*d*, and the subpixels 110*c* are repeatedly arranged in this order in the row direction. Furthermore, the first arrangement ARR1 and the second arrangement ARR2 are alternately repeated in the column direction.

The display portion includes a third arrangement ARR3 where the subpixels 110*b* and the subpixels 110*d* are alternately arranged repeatedly in the column direction, and a fourth arrangement ARR4 where the subpixels 110*a* and the subpixels 110*c* are alternately arranged repeatedly in the column direction. Furthermore, the third arrangement ARR3 and the fourth arrangement ARR4 are alternately repeated in the row direction.

It is preferable that the subpixel 110*a* have a larger area than both the subpixel 110*b* and the subpixel 110*d* in the pixel 110A, and the subpixel 110*c* have a larger area than both the subpixel 110*b* and the subpixel 110*d* in the pixel 110B. Furthermore, the subpixel having the largest area in the pixel 110A (here, the subpixel 110*a*) is preferably different from the subpixel having the largest area in the pixel 110B (here, the subpixel 110*c*).

Note that in this specification and the like, the light-emitting area in a subpixel including a light-emitting device is sometimes referred to as an area of the subpixel. Similarly, the light-receiving area in a subpixel including a light-receiving device is sometimes referred to as an area of the subpixel.

Although FIG. 29A illustrates the subpixel 110*a* and the subpixel 110*c* having the same area and the subpixel 110*b* and the subpixel 110*d* having the same area, one embodiment of the present invention is not limited thereto. The subpixel 110*a* and the subpixel 110*c* may have different areas. The subpixel 110*b* and the subpixel 110*d* may have different areas. FIG. 29B illustrates an example where the area of the subpixel 110*b* is larger than the area of the subpixel 110*d*. Note that between the pixel 110A and the pixel 110B, the area of the subpixel 110*b* may be different or the area of the subpixel 110*d* may be different.

Figure 30A:
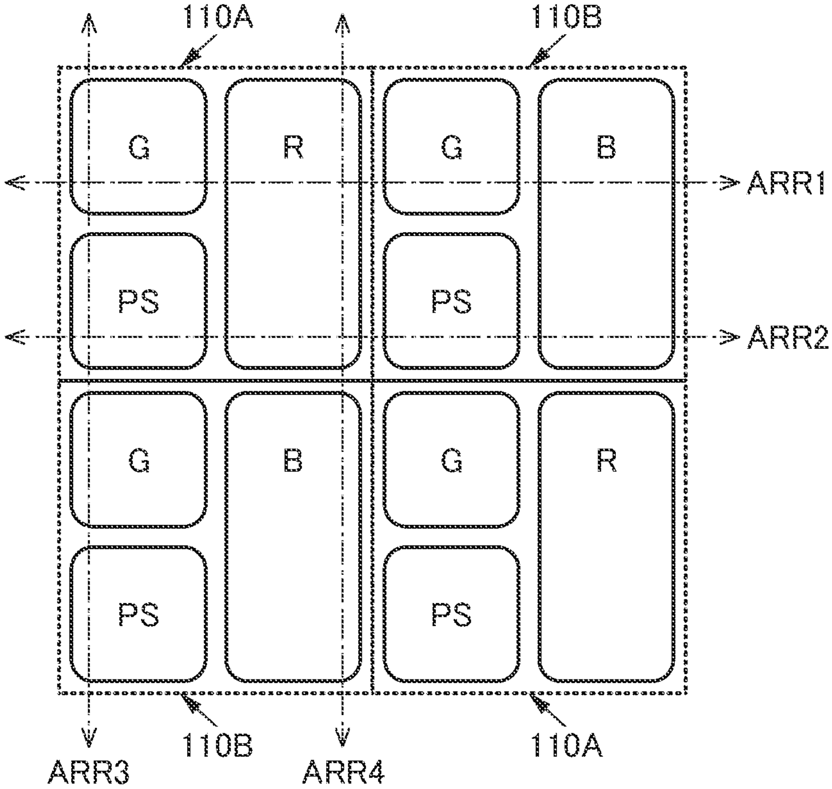
FIG. 30A and FIG. 30B are top views each illustrating an example of a pixel.
Figure 30B:
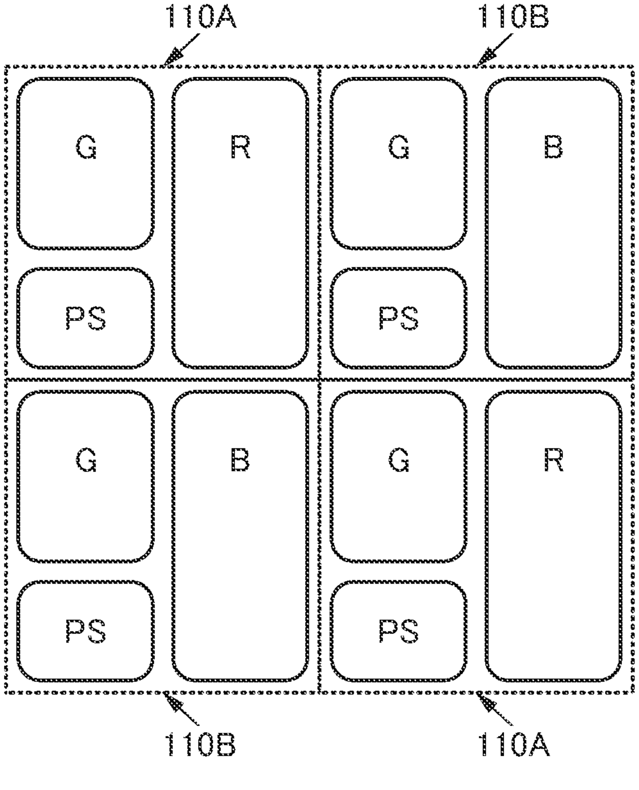

It is preferable that the subpixel 110*a*, the subpixel 110*b*, and the subpixel 110*c* include light-emitting devices emitting light in different wavelength ranges, and the subpixel 110*d* include a light-receiving device. For example, as illustrated in FIG. 30A and FIG. 30B, the subpixel 110*a* can be the subpixel (R) having a function of emitting red light, the subpixel 110*b* can be the subpixel (G) having a function of emitting green light, the subpixel 110*c* can be the subpixel (B) having a function of emitting blue light, and the subpixel 110*d* can be the subpixel (PS) having a light-receiving function. Note that the difference between FIG. 30A and FIG. 30B lies in the area of the subpixel (G) and the area of the subpixel (PS).

One pixel can include light-emitting devices of two colors among the light-emitting devices of three colors of red (R), green (G), and blue (B). The light-receiving device can be provided in any of the pixels. FIG. 30A and FIG. 30B each illustrate a structure where the pixel 110A includes the subpixel (R) having a function of emitting red light, the subpixel (G) having a function of emitting green light, and the subpixel (PS) having a light-receiving function, and the pixel 110B includes the subpixel (B) having a function of emitting blue light, the subpixel (G) having a function of emitting green light, and the subpixel (PS) having a light-receiving function.

A display portion of a display apparatus employing the pixel layout illustrated in FIG. 30A and FIG. 30B includes the first arrangement ARR1 where the subpixels (G), the subpixels (R), the subpixels (G), and the subpixels (B) are repeatedly arranged in this order in the row direction, and the second arrangement ARR2 where the subpixel (PS), the subpixel (R), the subpixel (PS), and the subpixel (B) are repeatedly arranged in this order in the row direction. Furthermore, the first arrangement ARR1 and the second arrangement ARR2 are alternately repeated in the column direction.

The display portion includes the third arrangement ARR3 where the subpixels (G) and the subpixels (PS) are alternately arranged repeatedly in the column direction, and the fourth arrangement ARR4 where the subpixels (R) and the subpixels (B) are alternately arranged repeatedly in the column direction. Furthermore, the third arrangement ARR3 and the fourth arrangement ARR4 are alternately repeated in the row direction.

Although FIG. 30A and FIG. 30B each illustrate an example where the pixel 110A and the pixel 110B are each provided with the subpixel (PS) including the light-receiving device, one embodiment of the present invention is not limited thereto. In the case where the light-receiving function does not need high accuracy, a pixel not including the subpixel (PS) may be provided. That is, a structure may be employed where a pixel including the subpixel (PS) and a pixel not including the subpixel (PS) are provided.

As illustrated in FIG. 30A and FIG. 30B, the area of the subpixel (G) having a function of emitting green light is preferably smaller than the areas of both the subpixel (R) having a function of emitting red light and the subpixel (B) having a function of emitting blue light. The luminous efficiency function of human with respect to green is higher than that with respect to red and blue; thus, when the area of the subpixel (G) is smaller than the areas of the subpixel (R) and the subpixel (B), a display apparatus with high visibility and a good balance of red (R), green (G), and blue (B) can be obtained.

Although FIG. 30A and FIG. 30B each illustrate a structure where the area of the subpixel (G) is smaller than the areas of the subpixel (R) and the subpixel (B), one embodiment of the present invention is not limited thereto. For example, a structure may be employed where the area of the subpixel (R) is smaller than the areas of the subpixel (G) and the subpixel (B). Note that as described above, the areas of the subpixels including the light-emitting devices may be determined depending on the lifetimes of the light-emitting devices of different colors.

Figure 31A:
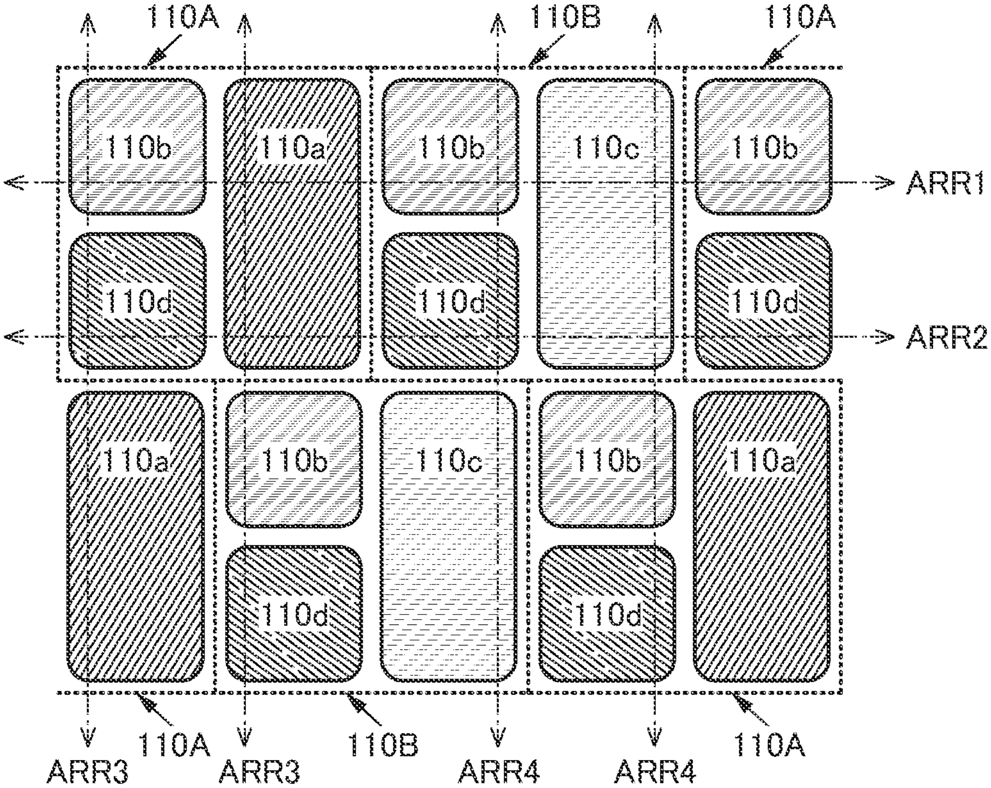
FIG. 31A and FIG. 31B are top views each illustrating an example of a pixel.
Figure 31B:
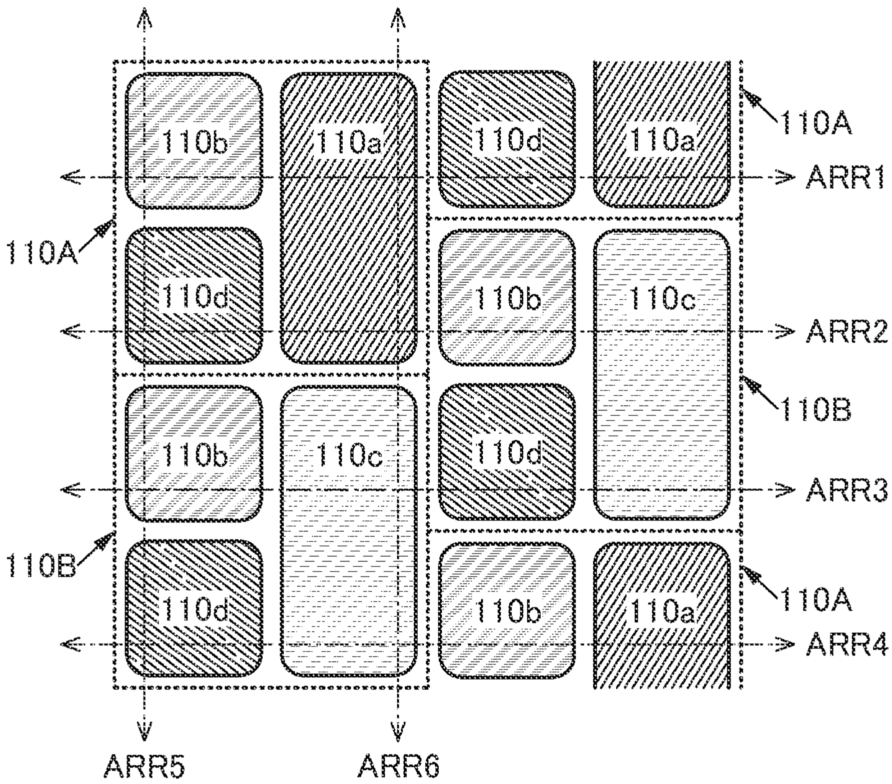

FIG. 31A and FIG. 31B illustrate modification examples of FIG. 29A.

A display portion of a display apparatus employing the pixel layout illustrated in FIG. 31A includes the first arrangement ARR1 where the subpixels 110*b*, the subpixels 110*a*, the subpixels 110*b*, and the subpixels 110*c* are repeatedly arranged in this order in the row direction, and the second arrangement ARR2 where the subpixels 110*d*, the subpixels 110*a*, the subpixels 110*d*, and the subpixels 110*c* are repeatedly arranged in this order in the row direction. Furthermore, the first arrangement ARR1 and the second arrangement ARR2 are alternately repeated in the column direction.

The display portion includes the third arrangement ARR3 where the subpixels 110*b*, the subpixels 110*d*, and the subpixels 110*a* are repeatedly arranged in this order in the column direction, and the fourth arrangement ARR4 where the subpixels 110*b*, the subpixels 110*d*, and the subpixels 110*c* are repeatedly arranged in this order in the column direction. Furthermore, the third arrangement ARR3, the third arrangement ARR3, the fourth arrangement ARR4, and the fourth arrangement ARR4 are repeated in this order in the row direction.

A display portion of a display apparatus employing the pixel layout illustrated in FIG. 31B includes the first arrangement ARR1 where the subpixels 110*b*, the subpixels 110*a*, the subpixels 110*d*, and the subpixels 110*a* are repeatedly arranged in this order in the row direction, the second arrangement ARR2 where the subpixels 110*d*, the subpixels 110*a*, the subpixels 110*b*, and the subpixels 110*c* are repeatedly arranged in this order in the row direction, the third arrangement ARR3 where the subpixels 110*b*, the subpixels 110*c*, the subpixels 110*d*, and the subpixels 110*c* are repeatedly arranged in this order in the row direction, and the fourth arrangement ARR4 where the subpixels 110*d*, the subpixels 110*c*, the subpixels 110*b*, and the subpixels 110*a* are repeatedly arranged in this order in the row direction. Furthermore, the first arrangement ARR1, the second arrangement ARR2, the third arrangement ARR3, and the fourth arrangement ARR4 are repeated in this order in the column direction.

The display portion includes a fifth arrangement ARR5 where the subpixels 110*b* and the subpixels 110*d* are alternately arranged repeatedly in the column direction, and a sixth arrangement ARR6 where the subpixels 110*a* and the subpixels 110*c* are alternately arranged repeatedly in the column direction. Furthermore, the fifth arrangement ARR5 and the sixth arrangement ARR6 are alternately repeated in the row direction.

Figure 32A:
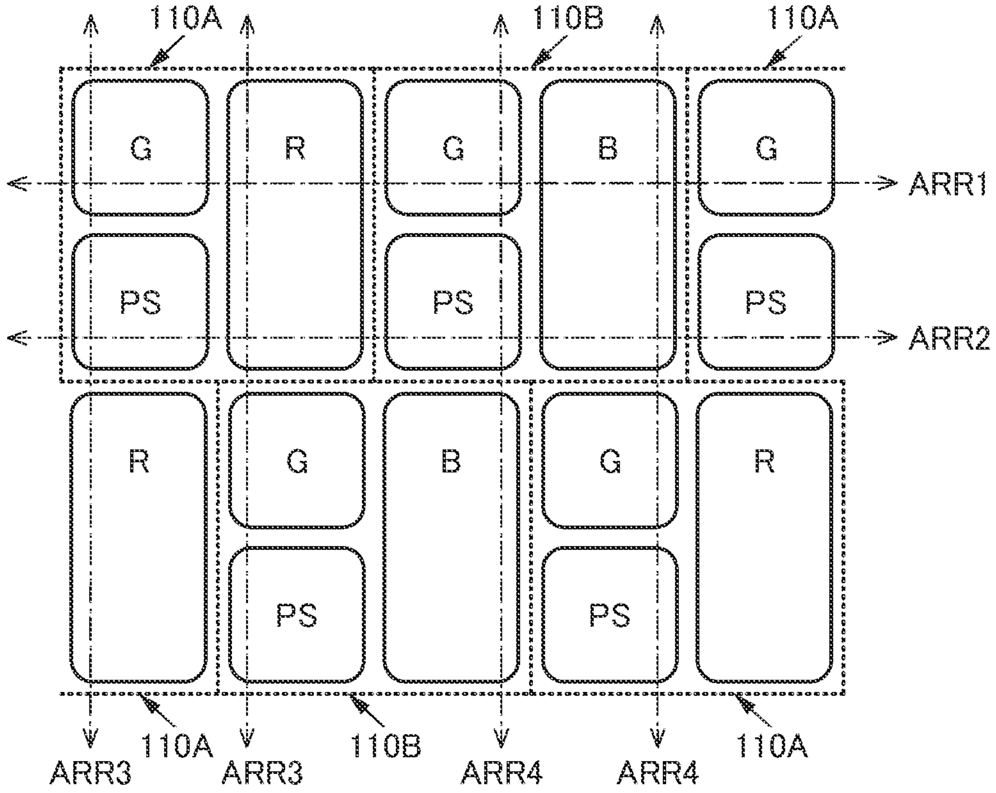
FIG. 32A and FIG. 32B are top views each illustrating an example of a pixel.
Figure 32B:
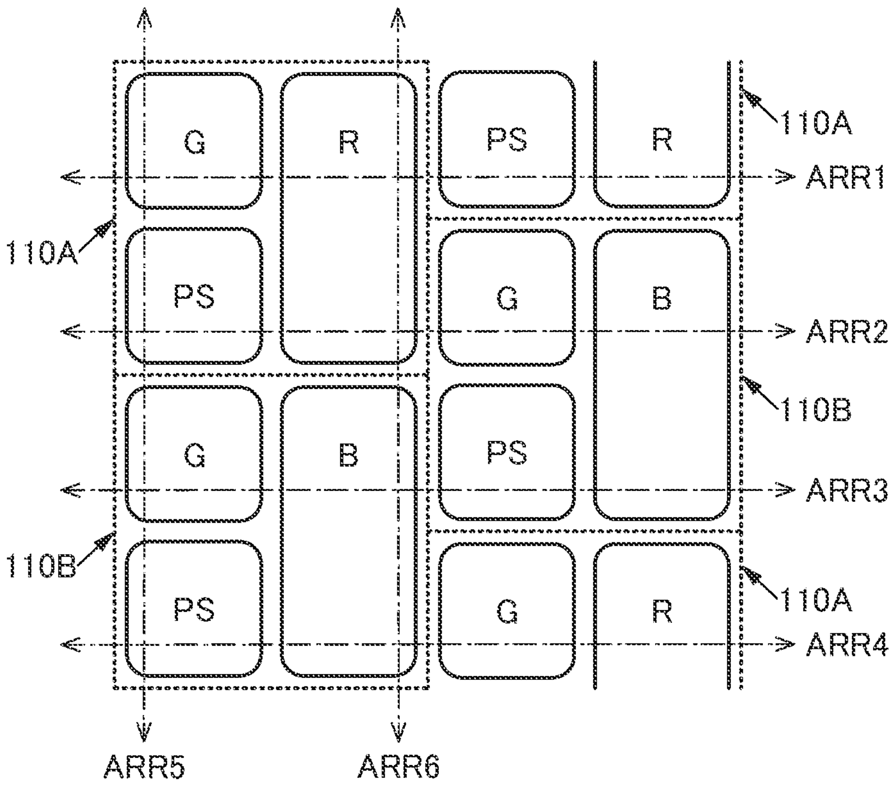

FIG. 32A and FIG. 32B illustrate structure examples where the subpixel (R) having a function of emitting red light is used as the subpixel 110*a*, the subpixel (G) having a function of emitting green light is used as the subpixel 110*b*, the subpixel (B) having a function of emitting blue light is used as the subpixel 110*c*, and the subpixel (PS) having a light-receiving function is used as the subpixel 110*d* in FIG. 31A and FIG. 31B.

A display portion of a display apparatus employing the pixel layout illustrated in FIG. 32A includes the first arrangement ARR1 where the subpixels (G), the subpixels (R), the subpixels (G), and the subpixels (B) are repeatedly arranged in this order in the row direction, and the second arrangement ARR2 where the subpixels (PS), the subpixels (R), the subpixels (PS), and the subpixels (B) are repeatedly arranged in this order in the row direction. Furthermore, the first arrangement ARR1 and the second arrangement ARR2 are alternately repeated in the column direction.

The display portion includes the third arrangement ARR3 where the subpixels (G), the subpixels (PS), and the subpixels (R) are repeatedly arranged in this order in the column direction, and the fourth arrangement ARR4 where the subpixels (G), the subpixels (PS), and the subpixels (B) are repeatedly arranged in this order in the column direction. Furthermore, the third arrangement ARR3, the third arrangement ARR3, the fourth arrangement ARR4, and the fourth arrangement ARR4 are repeated in this order in the row direction.

A display portion of a display apparatus employing the pixel layout illustrated in FIG. 32B includes the first arrangement ARR1 where the subpixels (G), the subpixels (R), the subpixels (PS), and the subpixels (R) are repeatedly arranged in this order in the row direction, the second arrangement ARR2 where the subpixels (PS), the subpixels (R), the subpixels (G), and the subpixels (B) are repeatedly arranged in this order in the row direction, the third arrangement ARR3 where the subpixels (G), the subpixels (B), the subpixels (PS), and the subpixels (B) are repeatedly arranged in this order in the row direction, and the fourth arrangement ARR4 where the subpixels (PS), the subpixels (B), the subpixels (G), and the subpixels (R) are repeatedly arranged in this order in the row direction. Furthermore, the first arrangement ARR1, the second arrangement ARR2, the third arrangement ARR3, and the fourth arrangement ARR4 are repeated in this order in the column direction.

The display portion includes the fifth arrangement ARR5 where the subpixels (G) and the subpixels (PS) are alternately arranged repeatedly in the column direction, and the sixth arrangement ARR6 where the subpixels (R) and the subpixels (B) are alternately arranged repeatedly in the column direction. Furthermore, the fifth arrangement ARR5 and the sixth arrangement ARR6 are alternately repeated in the row direction.

Figure 33A:
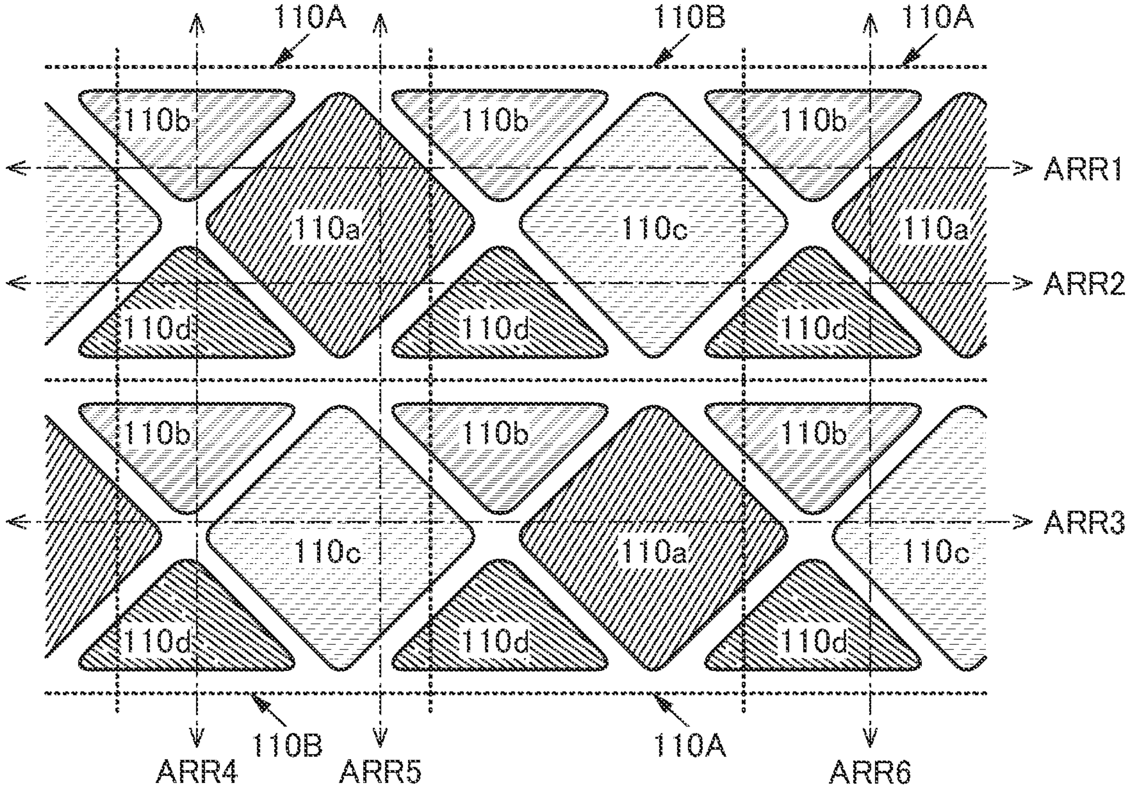
FIG. 33A and FIG. 33B are top views each illustrating an example of a pixel.

FIG. 33A illustrates a modification example of FIG. 32A.

A display portion of a display apparatus employing the pixel layout illustrated in FIG. 33A includes the first arrangement ARR1 where the subpixels 110*b*, the subpixels 110*a*, the subpixels 110*b*, and the subpixels 110*c* are repeatedly arranged in this order in the row direction and the second arrangement ARR2 where the subpixels 110*d*, the subpixels 110*a*, the subpixels 110*d*, and the subpixels 110*c* are repeatedly arranged in this order in the row direction. Furthermore, the first arrangement ARR1 and the second arrangement ARR2 are alternately repeated in the column direction. The display portion may further include the third arrangement ARR3 where the subpixels 110*a* and the subpixels 110*c* are alternately arranged repeatedly in the row direction. Note that the pixel layout illustrated in FIG. 33A may be referred to as a diamond layout.

The display portion includes the fourth arrangement ARR4 where the subpixels 110*b* and the subpixels 110*d* are alternately arranged repeatedly in the column direction, and the fifth arrangement ARR5 where the subpixels 110*a* and the subpixels 110*c* are alternately arranged repeatedly in the column direction. Furthermore, the fourth arrangement ARR4 and the fifth arrangement ARR5 are alternately repeated in the row direction. The display portion may further include the sixth arrangement ARR6 where the subpixels 110*b*, the subpixels 110*a*, the subpixels 110*d*, the subpixels 110*b*, the subpixels 110*c*, and the subpixels 110*d* are repeatedly arranged in this order in the column direction.

Although FIG. 33A illustrates a structure where the top surface shapes of the subpixel 110*a* and the subpixel 110*c* are quadrangles with rounded corners and the top surface shapes of the subpixel 110*b* and the subpixel 110*d* are triangles with rounded corners, there is no particular limitation on the top surface shapes of the subpixels. For example, the top surface shapes of the subpixel 110*b* and the subpixel 110*d* may be quadrangles with rounded corners or may be circles.

Figure 33B:
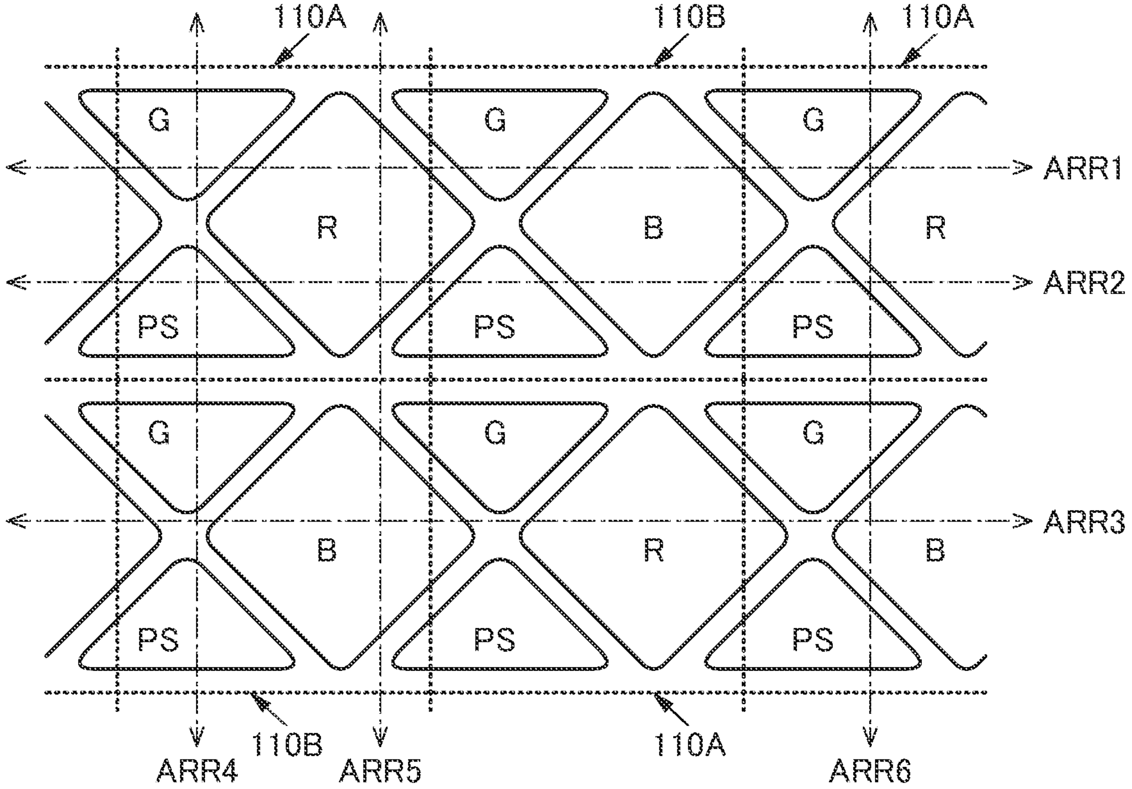

FIG. 33B illustrates a structure example where the subpixel (R) having a function of emitting red light is used as the subpixel 110*a*, the subpixel (G) having a function of emitting green light is used as the subpixel 110*b*, the subpixel (B) having a function of emitting blue light is used as the subpixel 110*c*, and the subpixel (PS) having a light-receiving function is used as the subpixel 110*d* in FIG. 33A.

A display portion of a display apparatus employing the pixel layout illustrated in FIG. 33B includes the first arrangement ARR1 where the subpixels (G), the subpixels (R), the subpixels (G), and the subpixels (B) are repeatedly arranged in this order in the row direction, and the second arrangement ARR2 where the subpixels (PS), the subpixels (R), the subpixels (PS), and the subpixels (B) are repeatedly arranged in this order in the row direction. The display portion may include the third arrangement ARR3 where the subpixels (R) and the subpixels (B) are alternately arranged repeatedly in the row direction.

The display portion includes the fourth arrangement ARR4 where the subpixels (G), the subpixels (R), the subpixels (PS), the subpixels (G), the subpixels (B), and the subpixels (PS) are repeatedly arranged in this order in the column direction. The display portion may include the fifth arrangement ARR5 where the subpixels (R) and the subpixels (B) are alternately arranged repeatedly in the column direction, and may include the sixth arrangement ARR6 where the subpixels (G) and the subpixels (PS) are alternately arranged repeatedly in the column direction.

This embodiment can be combined with any of the other embodiments as appropriate. In this specification, in the case where a plurality of structure examples are described in one embodiment, the structure examples can be combined as appropriate.

Embodiment 5

In this embodiment, a display apparatus of one embodiment of the present invention is described with reference to FIG. 34 to FIG. 36.

The display apparatus of this embodiment can be a high-resolution display apparatus or large-sized display apparatus. Accordingly, the display apparatus of this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or notebook personal computer, a monitor of a computer or the like, digital signage, and a large game machine such as a pachinko machine.

In this specification and the like, a display panel that is one embodiment of a display apparatus has a function of displaying (outputting) an image or the like on (to) a display surface. Therefore, the display panel is one mode of an output device.

In this specification and the like, a display apparatus to which a connector such as a flexible printed circuit (FPC) or a TCP (Tape Carrier Package) is attached, or a display apparatus on which an integrated circuit (IC) is mounted by a COG (Chip On Glass) method, a COF (Chip On Film) method, or the like is referred to as a display panel module, a display module, or simply a display panel or the like in some cases.

<Display Apparatus 100A>

Figure 34:
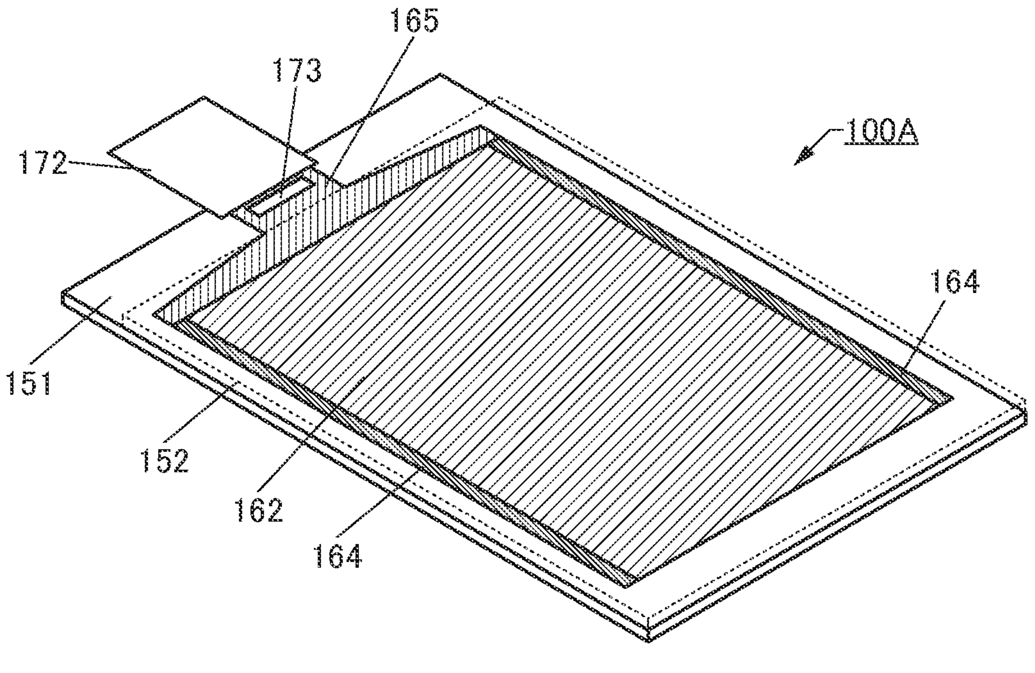
FIG. 34 is a perspective view illustrating an example of a display apparatus.
Figure 35A:
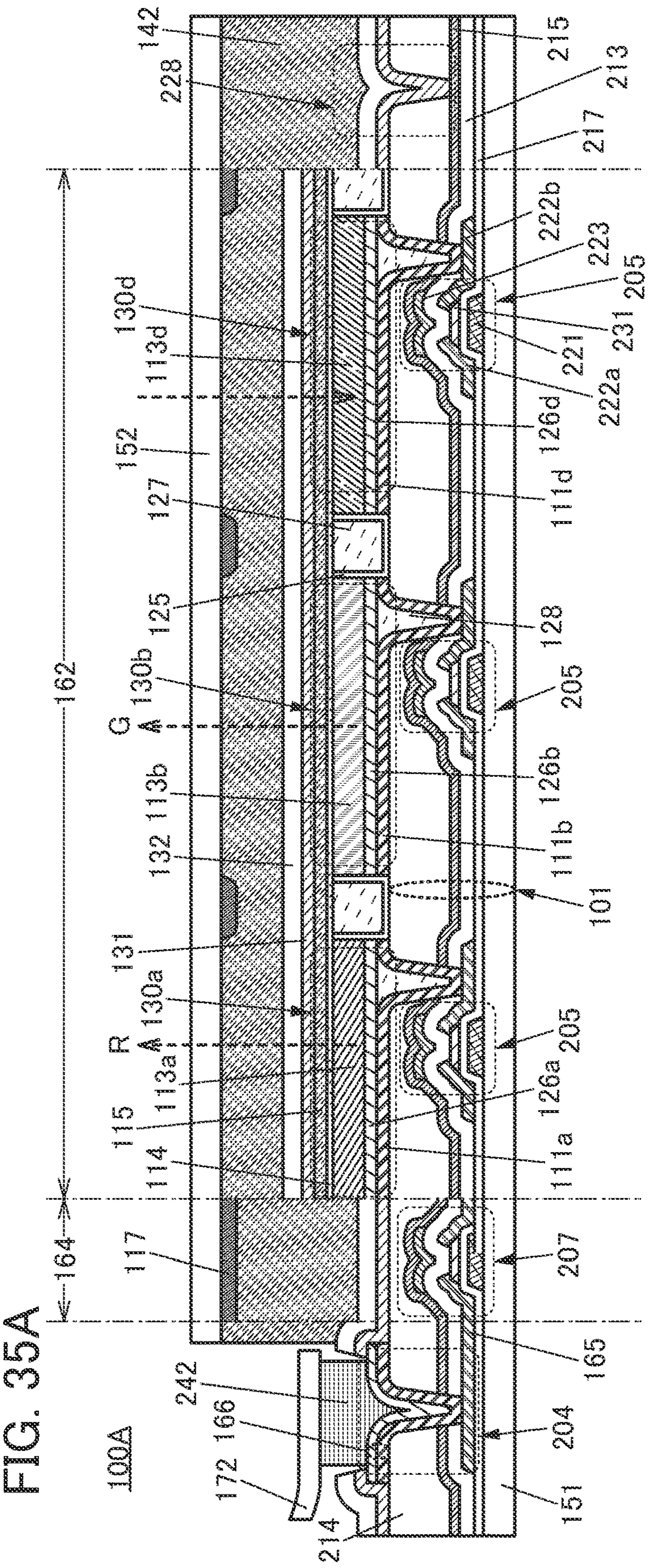
FIG. 35A is a cross-sectional view illustrating an example of a display apparatus.

FIG. 34 illustrates a perspective view of the display apparatus 100A, and FIG. 35A illustrates a cross-sectional view of the display apparatus 100A.

The display apparatus 100A has a structure where a substrate 152 and a substrate 151 are bonded to each other. In FIG. 34, the substrate 152 is denoted by a dashed line.

The display apparatus 100A includes a display portion 162, a circuit 164, a wiring 165, and the like. FIG. 34 illustrates an example where an IC 173 and an FPC 172 are mounted on the display apparatus 100A. Thus, the structure illustrated in FIG. 34 can be regarded as a display module including the display apparatus 100A, the IC (integrated circuit), and the FPC.

As the circuit 164, for example, a scan line driver circuit can be used.

The wiring 165 has a function of supplying a signal and power to the display portion 162 and the circuit 164. The signal and power are input to the wiring 165 from the IC 173 or from the outside through the FPC 172.

FIG. 34 illustrates an example where the IC 173 is provided over the substrate 151 by a COG (Chip On Glass) method, a COF (Chip on Film) method, or the like. An IC including a scan line driver circuit, a signal line driver circuit, or the like can be used as the IC 173, for example. Note that the display apparatus 100A and the display module are not necessarily provided with an IC. The IC may be mounted on the FPC by a COF method or the like.

FIG. 35A illustrates an example of cross sections of part of a region including the FPC 172, part of the circuit 164, part of the display portion 162, and part of a region including an end portion of the display apparatus 100A.

The display apparatus 100A includes light-emitting devices, a light-receiving device, a transistor 207, a transistor 205, and the like between the substrate 151 and the substrate 152. FIG. 35A illustrates, as the light-emitting devices and the light-receiving device, the light-emitting device 130*a* emitting red light, the light-emitting device 130*b* emitting green light, and the light-receiving device 130*d*.

In the case where a pixel of the display apparatus includes three kinds of subpixels including light-emitting devices emitting different colors, the three subpixels can be subpixels of three colors of R, G, and B or subpixels of three colors of yellow (Y), cyan (C), and magenta (M). In the case where four subpixels are included, the four subpixels can be subpixels of four colors of R, G, B, and white (W) or subpixels of four colors of R, G, B, and Y, for example.

The light-emitting device 130*a* and the light-emitting device 130*b* each include an optical adjustment layer between a pixel electrode and an EL layer, and the light-receiving device 130*d* includes an optical adjustment layer between a pixel electrode and a light-receiving layer. As the optical adjustment layer, the light-emitting device 130*a* includes a conductive layer 126*a*, the light-emitting device 130*b* includes a conductive layer 126*b*, and the light-receiving device 130*d* includes a conductive layer 126*d*. Embodiment 1 can be referred to for the details of the light-emitting devices and the light-receiving device. The side surfaces of the conductive layer 111*a*, the conductive layer 111*b*, the conductive layer 111*d*, the conductive layers 126*a*, 126*b*, and 126*d*, the EL layer 113*a*, the EL layer 113*b*, and the light-receiving layer 113*d* are covered with the insulating layers 125 and 127. The layer 114 is provided over the EL layer 113*a*, the EL layer 113*b*, the light-receiving layer 113*d*, and the insulating layers 125 and 127, and the common electrode 115 is provided over the layer 114. The protective layer 131 is provided over the light-emitting device 130*a*, the light-emitting device 130*b*, and the light-receiving device 130*d*. The protective layer 132 is provided over the protective layer 131.

The protective layer 132 and the substrate 152 are bonded to each other with an adhesive layer 142. A solid sealing structure, a hollow sealing structure, or the like can be employed to seal the light-emitting devices. In FIG. 35A, a solid sealing structure is employed in which a space between the substrate 152 and the substrate 151 is filled with the adhesive layer 142. Alternatively, a hollow sealing structure where the space is filled with an inert gas (e.g., nitrogen or argon) may be employed. The adhesive layer 142 may be provided not to overlap with the light-emitting device. The space may be filled with a resin different from that of the frame-like adhesive layer 142.

The conductive layer 111*a*, the conductive layer 111*b*, and the conductive layer 111*d* are each connected to a conductive layer 222*b* included in the transistor 205 through an opening provided in an insulating layer 214.

Depressed portions are formed in the conductive layer 111*a*, the conductive layer 111*b*, and the conductive layer 111*d* to cover the openings provided in the insulating layer 214. A layer 128 is preferably embedded in the depressed portion. It is preferable that the conductive layer 126*a* be formed over the conductive layer 111*a* and the layer 128, the conductive layer 126*b* be formed over the conductive layer 111*b* and the layer 128, and the conductive layer 126*d* be formed over the conductive layer 111*d* and the layer 128. The conductive layer 126*a*, the conductive layer 126*b*, and the conductive layer 126*d* can also be referred to as pixel electrodes.

The layer 128 has a planarization function for the depressed portions of the conductive layer 111*a*, the conductive layer 111*b*, and the conductive layer 111*d*. The formation of the layer 128 can reduce unevenness of the formation surfaces of the EL layers and the light-receiving layer, and accordingly can improve the coverage. When the conductive layer 126*a*, the conductive layer 126*b*, and the conductive layer 126*d* electrically connected to the conductive layer 111*a*, the conductive layer 111*b*, and the conductive layer 111*d* are provided over the conductive layer 111*a*, the conductive layer 111*b*, the conductive layer 111*d*, and the layer 128, regions overlapping with the depressed portions of the conductive layer 111*a*, the conductive layer 111*b*, and the conductive layer 111*d* can also be used as the light-emitting regions in some cases. Thus, the aperture ratio of a pixel can be increased.

The layer 128 may be an insulating layer or a conductive layer. Any of a variety of inorganic insulating materials, organic insulating materials, and conductive materials can be used for the layer 128 as appropriate. In particular, the layer 128 is preferably formed using an insulating material.

An insulating layer containing an organic material can be suitably used for the layer 128. As the layer 128, an acrylic resin, a polyimide resin, an epoxy resin, a polyamide resin, a polyimide-amide resin, a siloxane resin, a benzocyclobutene-based resin, a phenol resin, a precursor of any of these resins, or the like can be used, for example. A photosensitive resin can also be used for the layer 128. As the photosensitive resin, a positive photosensitive material or a negative photosensitive material can be used.

When a photosensitive resin is used, the layer 128 can be formed through only light-exposure and development steps, reducing the influence of dry etching, wet etching, or the like on the surfaces of the conductive layer 111*a*, the conductive layer 111*b*, and the conductive layer 111*d*. When the layer 128 is formed using a negative photosensitive resin, the layer 128 can sometimes be formed using the photomask (light-exposure mask) used for forming the opening in the insulating layer 214.

The conductive layer 126*a* is provided over the conductive layer 111*a* and the layer 128. The conductive layer 126*a* includes a first region in contact with the top surface of the conductive layer 111*a* and a second region in contact with the top surface of the layer 128. The top surface level of the conductive layer 111*a* in contact with the first region and the top surface level of the layer 128 in contact with the second region are preferably the same or substantially the same.

Similarly, the conductive layer 126*b* is provided over the conductive layer 111*b* and the layer 128. The conductive layer 126*b* includes a first region in contact with the top surface of the conductive layer 111*b* and a second region in contact with the top surface of the layer 128. The top surface level of the conductive layer 111*b* in contact with the first region and the top surface level of the layer 128 in contact with the second region are preferably the same or substantially the same.

The conductive layer 126*d* is provided over the conductive layer 111*d* and the layer 128. The conductive layer 126*d* includes a first region in contact with the top surface of the conductive layer 111*d* and a second region in contact with the top surface of the layer 128. The top surface level of the conductive layer 111*d* in contact with the first region and the top surface level of the layer 128 in contact with the second region are preferably the same or substantially the same.

The pixel electrode contains a material reflecting visible light, and a counter electrode contains a material transmitting visible light.

The display apparatus 100A is of a top emission type. Light from the light-emitting device is emitted toward the substrate 152 side. For the substrate 152, a material having a high transmitting property with respect to visible light is preferably used. For the substrate 152, a material having a high transmitting property with respect to visible light and infrared light is further preferably used. Light is incident on the light-receiving device through the substrate 152.

A stacked-layer structure from the substrate 151 to the insulating layer 214 corresponds to the layer 101 including transistors described in Embodiment 3 and the like.

The transistor 207 and the transistor 205 are each formed over the substrate 151. These transistors can be manufactured using the same materials through the same process.

An insulating layer 217, an insulating layer 213, an insulating layer 215, and the insulating layer 214 are provided in this order over the substrate 151. Parts of the insulating layer 217 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may be a single layer or include two or more layers.

A material through which impurities such as water and hydrogen do not easily diffuse is preferably used for at least one of the insulating layers covering the transistors. Thus, such an insulating layer can function as a barrier layer. Such a structure can effectively inhibit diffusion of impurities into the transistors from the outside and increase the reliability of the display apparatus.

An inorganic insulating film is preferably used as each of the insulating layer 217, the insulating layer 213, and the insulating layer 215. As the inorganic insulating film, for example, a silicon nitride film, a silicon oxynitride film, a silicon oxide film, a silicon nitride oxide film, an aluminum oxide film, or an aluminum nitride film, or the like can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the display apparatus 100A. This can inhibit entry of impurities from the end portion of the display apparatus 100A through the organic insulating film. Alternatively, the organic insulating film may be formed so that its end portion is positioned inward from the end portion of the display apparatus 100A, to prevent the organic insulating film from being exposed at the end portion of the display apparatus 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. Alternatively, the insulating layer 214 may have a stacked-layer structure of an organic insulating film and an inorganic insulating film. The outermost layer of the insulating layer 214 preferably functions as an etching protective film. Accordingly, a depressed portion can be inhibited from being formed in the insulating layer 214 at the time of processing the conductive layer 111*a*, the conductive layer 126*a*, or the like. Alternatively, a depressed portion may be formed in the insulating layer 214 at the time of processing the conductive layer 111*a*, the conductive layer 126*a*, or the like.

In a region 228 illustrated in FIG. 35A, an opening is formed in the insulating layer 214. This can inhibit entry of impurities into the display portion 162 from the outside through the insulating layer 214 even when an organic insulating film is used as the insulating layer 214. Consequently, the reliability of the display apparatus 100A can be increased.

Each of the transistor 207 and the transistors 205 includes a conductive layer 221 functioning as a gate, the insulating layer 217 functioning as the gate insulating layer, a conductive layer 222*a* and the conductive layer 222*b* functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 217 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, an inverted staggered transistor, or the like can be used. A top-gate or a bottom-gate transistor structure may be employed. Alternatively, gates may be provided above and below the semiconductor layer where a channel is formed.

The structure where the semiconductor layer where a channel is formed is interposed between two gates is used for the transistor 207 and the transistors 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor and a semiconductor having crystallinity (a microcrystalline semiconductor, a polycrystalline semiconductor, a single crystal semiconductor, or a semiconductor partly including crystal regions) may be used. It is preferable to use a semiconductor having crystallinity, in which case degradation of the transistor characteristics can be reduced.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display apparatus of this embodiment. Alternatively, the semiconductor layer of the transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used as the semiconductor layer. Alternatively, an oxide containing indium (In), aluminum (Al), and zinc (Zn) (also referred to as IAZO) may be used for the semiconductor layer. Alternatively, an oxide containing indium (In), aluminum (Al), gallium (Ga), and zinc (Zn) (IAGZO) may be used for the semiconductor layer.

In the case where the semiconductor layer is an In-M-Zn oxide, the atomic proportion of In is preferably greater than or equal to the atomic proportion of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 164 and the transistor included in the display portion 162 may have the same structure or different structures. The same structure or two or more types of structures may be employed for a plurality of transistors included in the circuit 164. Similarly, the same structure or two or more types of structures may be employed for a plurality of transistors included in the display portion 162.

Figure 35B:
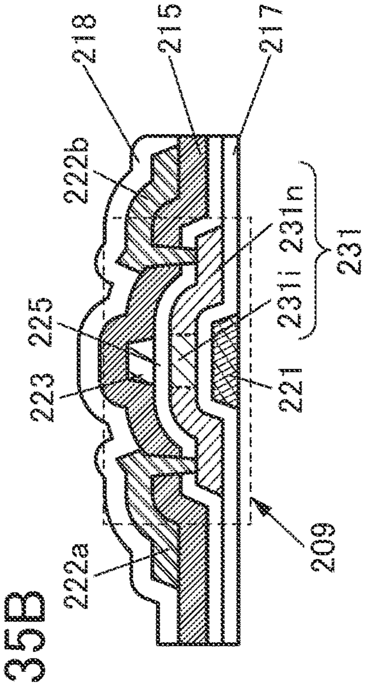
FIG. 35B and FIG. 35C are cross-sectional views illustrating examples of transistors.
Figure 35C:
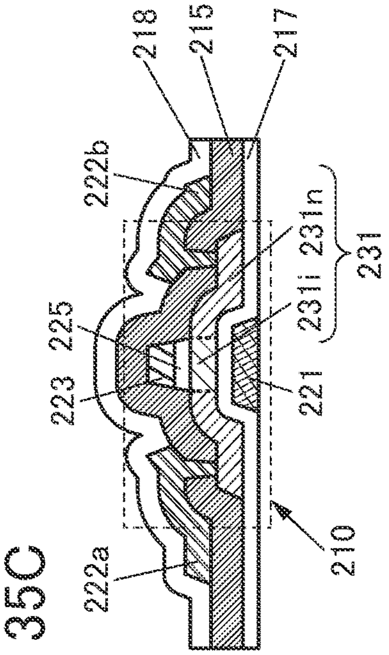

FIG. 35B and FIG. 35C illustrate other structure examples of transistors.

Each of a transistor 209 and a transistor 210 includes the conductive layer 221 functioning as a gate, the insulating layer 217 functioning as a gate insulating layer, the semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, the insulating layer 225 functioning as a gate insulating layer, the conductive layer 223 functioning as a gate, and the insulating layer 215 covering the conductive layer 223. The insulating layer 217 is positioned between the conductive layer 221 and the channel formation region 231*i*. The insulating layer 225 is positioned at least between the conductive layer 223 and the channel formation region 231*i*. Furthermore, an insulating layer 218 covering the transistor may be provided.

FIG. 35B illustrates an example of the transistor 209 where the insulating layer 225 covers the top and side surfaces of the semiconductor layer 231. The conductive layer 222*a* and the conductive layer 222*b* are connected to the respective low-resistance regions 231*n* through openings provided in the insulating layer 225 and the insulating layer 215. One of the conductive layer 222*a* and the conductive layer 222*b* functions as a source, and the other functions as a drain.

In the transistor 210 illustrated in FIG. 35C, the insulating layer 225 overlaps with the channel formation region 231*i* of the semiconductor layer 231 and does not overlap with the low-resistance regions 231*n*. The structure illustrated in FIG. 35C can be manufactured by processing the insulating layer 225 using the conductive layer 223 as a mask, for example. In FIG. 35C, the insulating layer 215 is provided to cover the insulating layer 225 and the conductive layer 223, and the conductive layer 222*a* and the conductive layer 222*b* are connected to the respective low-resistance regions 231*n* through the openings in the insulating layer 215.

A connection portion 204 is provided in a region of the substrate 151 which does not overlap with the substrate 152. In the connection portion 204, the wiring 165 is electrically connected to the FPC 172 through a conductive layer 166 and a connection layer 242. An example is illustrated where the conductive layer 166 has a stacked-layer structure of a conductive film obtained by processing the same conductive film as the conductive layer 111*a*, the conductive layer 111*b*, and the conductive layer 111*d* and a conductive film obtained by processing the same conductive film as the conductive layer 126*a*, the conductive layer 126*b*, and the conductive layer 126*d*. On the top surface of the connection portion 204, the conductive layer 166 is exposed. Thus, the connection portion 204 and the FPC 172 can be electrically connected to each other through the connection layer 242.

A light-blocking layer 117 is preferably provided on the surface of the substrate 152 on the substrate 151 side. A variety of optical members can be arranged on the outer surface of the substrate 152. Examples of the optical members include a polarizing plate, a retardation plate, a light diffusion layer (a diffusion film or the like), an anti-reflective layer, and a light-condensing film. Furthermore, an antistatic film to inhibit attachment of dust, a water repellent film to reduce attachment of stain, a hard coat film to inhibit generation of a scratch caused by the use, an impact-absorbing layer, or the like may be arranged on the outer side of the substrate 152.

The protective layer 131 and the protective layer 132 provided to cover the light-emitting device can inhibit an impurity such as water from entering the light-emitting device. As a result, the reliability of the light-emitting device can be enhanced.

In the region 228 in the vicinity of the end portion of the display apparatus 100A, the insulating layer 215 and the protective layer 131 or the protective layer 132 are preferably in contact with each other through an opening in the insulating layer 214. In particular, the inorganic insulating films are preferably in contact with each other. This can inhibit entry of impurities into the display portion 162 from the outside through the organic insulating film. Consequently, the reliability of the display apparatus 100A can be increased.

For each of the substrate 151 and the substrate 152, glass, quartz, ceramics, sapphire, a resin, a metal, an alloy, a semiconductor, or the like can be used. The substrate on the side where light from the light-emitting device is extracted is formed using a material transmitting the light. When the substrate 151 and the substrate 152 are formed using flexible materials, the flexibility of the display apparatus can be increased. Furthermore, a polarizing plate may be used as the substrate 151 or the substrate 152.

For each of the substrate 151 and the substrate 152, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 151 and the substrate 152.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic resin film.

In the case where a film is used for the substrate and the film absorbs water, the shape of the display panel might be changed, e.g., creases are generated. Thus, for the substrate, a film with a low water absorption rate is preferably used. For example, the water absorption rate of the film to be used is preferably lower than or equal to 1%, further preferably lower than or equal to 0.1%, still further preferably lower than or equal to 0.01%.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. Alternatively, a two-component resin may be used. An adhesive sheet or the like may be used.

As the connection layer 242, an anisotropic conductive film (ACF), an anisotropic conductive paste (ACP), or the like can be used.

As materials that can be used for a gate, a source, and a drain of a transistor and conductive layers such as a variety of wirings and electrodes included in a display apparatus, metals such as aluminum, titanium, chromium, nickel, copper, yttrium, zirconium, molybdenum, silver, tantalum, or tungsten, an alloy containing any of these metals as its main component, and the like can be given. A film containing any of these materials can be used as a single layer or a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), it is preferably thinned so as to have a light-transmitting property. A stacked film of any of the above materials can be used as a conductive layer. For example, a stacked film of indium tin oxide and an alloy of silver and magnesium, or the like is preferably used to increase the conductivity. Such materials can also be used for conductive layers such as wirings and electrodes included in the display apparatus, and conductive layers (e.g., a conductive layer functioning as a pixel electrode or a common electrode) included in a light-emitting device.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

<Display Apparatus 100B>

Figure 36:
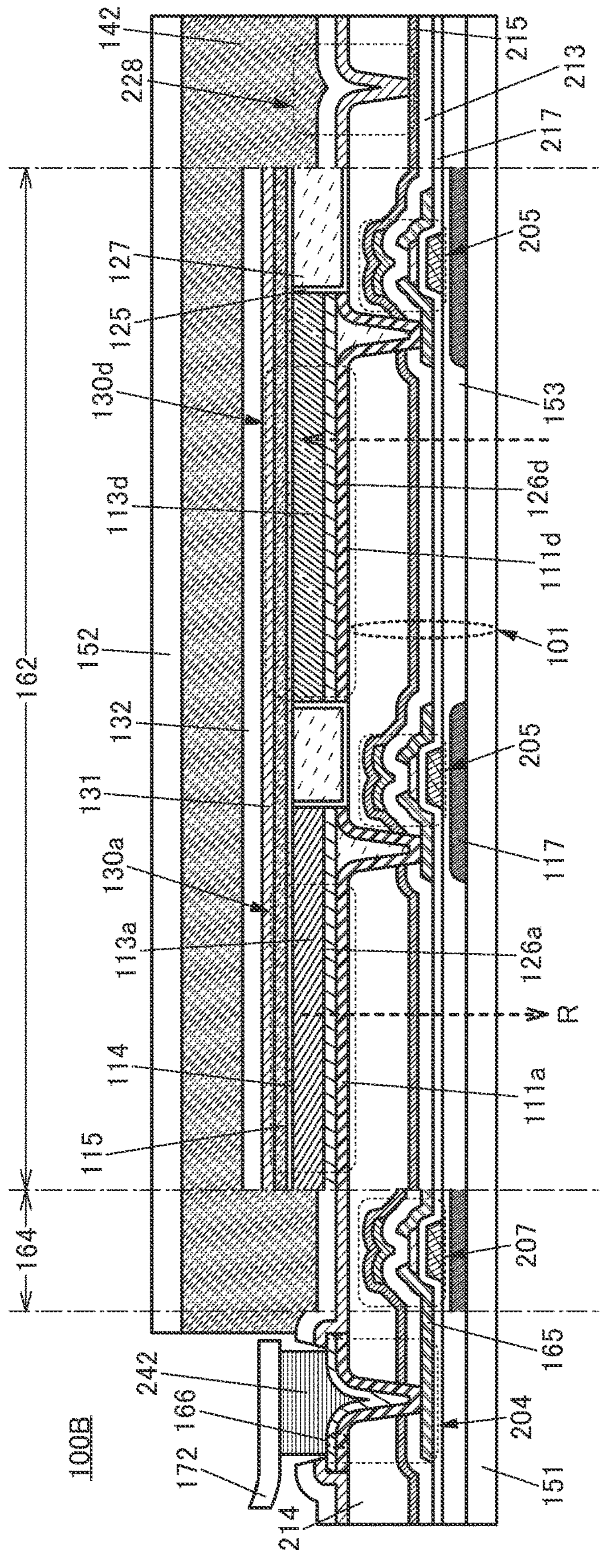
FIG. 36 is a cross-sectional view illustrating an example of a display apparatus.

A display apparatus 100B illustrated in FIG. 36 is different from the display apparatus 100A mainly in having a bottom-emission structure. Note that portions similar to those in the display apparatus 100A are not described in some cases.

Light from the light-emitting device is emitted toward the substrate 151 side. For the substrate 151, a material having a high transmitting property with respect to visible light is preferably used. For the substrate 151, a material having a high transmitting property with respect to visible light and infrared light is further preferably used. By contrast, there is no limitation on the light-transmitting property of a material used for the substrate 152. Light is incident on the light-receiving device through the substrate 151.

The light-blocking layer 117 is preferably formed between the substrate 151 and the transistor 207 and between the substrate 151 and the transistor 205. FIG. 36 illustrates an example where the light-blocking layer 117 is provided over the substrate 151, an insulating layer 153 is provided over the light-blocking layer 117, and the transistors 207 and 205 and the like are provided over the insulating layer 153.

This embodiment can be combined with any of the other embodiments as appropriate.

Embodiment 6

In this embodiment, display apparatuses of one embodiment of the present invention are described with reference to FIG. 37 to FIG. 44.

The display apparatus of this embodiment can be a high-definition display apparatus. Accordingly, the display apparatus of this embodiment can be used for display portions of information terminals (wearable devices) such as watch-type and bracelet-type information terminals and display portions of wearable devices capable of being worn on the head, such as a VR (Virtual Reality) device like a head mounted display and a glasses-type AR (Augmented Reality) device.

Figure 37A:
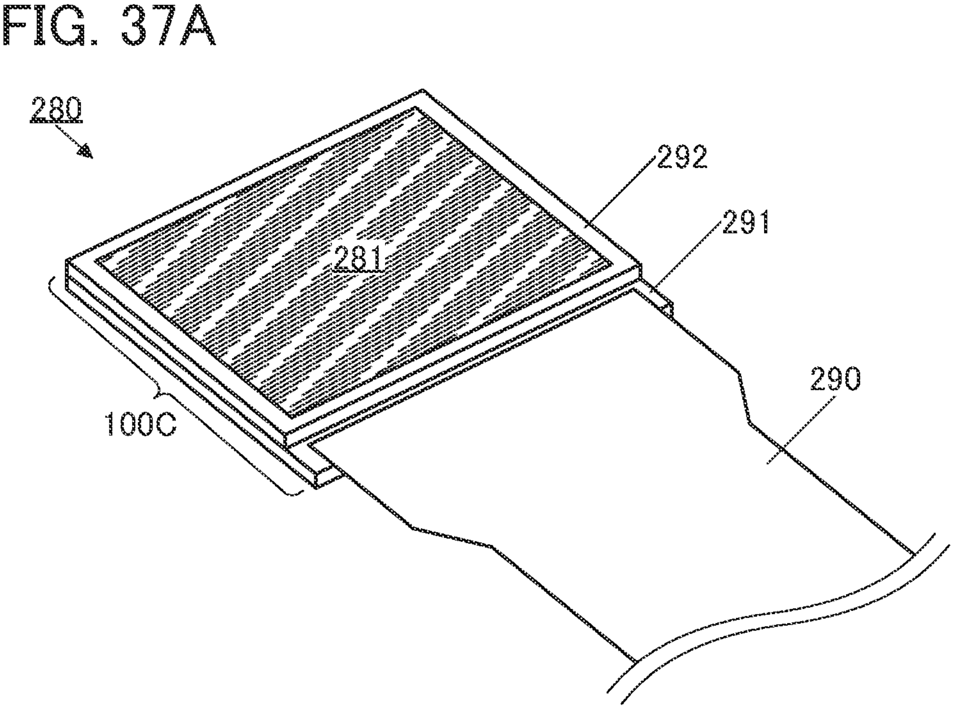
FIG. 37A and FIG. 37B are perspective views illustrating an example of a display module.

FIG. 37A is a perspective view of a display module 280. The display module 280 includes a display apparatus 100C and an FPC 290. Note that the display apparatus included in the display module 280 is not limited to the display apparatus 100C and may be a display apparatus 100D or a display apparatus 100E described later.

<Display Module>

The display module 280 includes a substrate 291 and a substrate 292. The display module 280 includes a display portion 281. The display portion 281 is a region of the display module 280 where an image is displayed, and is a region where light from pixels provided in a pixel portion 284 described later can be seen.

Figure 37B:
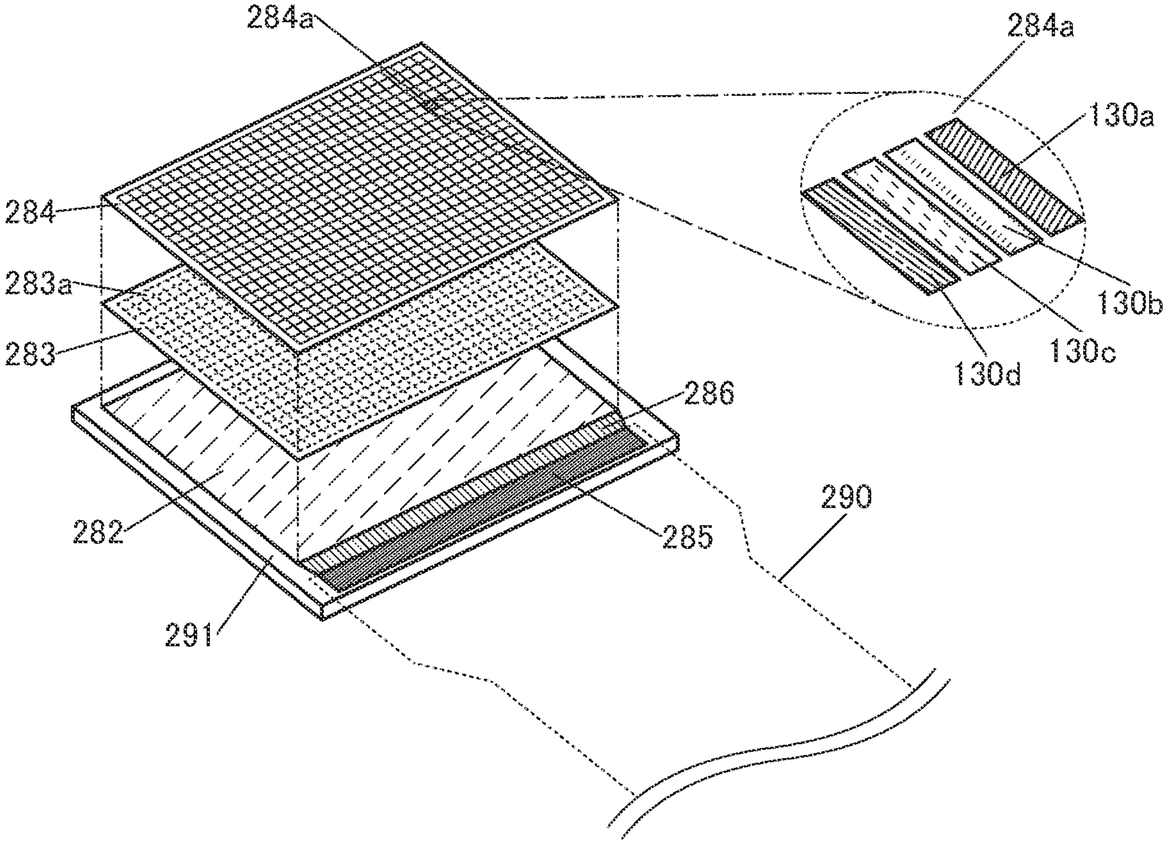

FIG. 37B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is provided in a portion not overlapping with the pixel portion 284 over the substrate 291. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 37B. The pixel 284*a* includes the light-emitting device 130*a*, the light-emitting device 130*b*, and the light-emitting device 130*c* emitting light of different colors and the light-receiving device 130*d*. The light-emitting devices and the light-receiving device can be arranged in a stripe pattern as illustrated in FIG. 37B. Alternatively, a variety of arrangement methods of light-emitting devices, such as delta arrangement or PenTile arrangement can be employed.

The pixel circuit portion 283 includes a plurality of pixel circuits 283*a* arranged periodically.

One pixel circuit 283*a* is a circuit that controls light emission of the light-emitting device and light reception of light-receiving device in one pixel 284*a*. For example, in the case where one pixel 284*a* includes three light-emitting devices and one light-receiving device, one pixel circuit 283*a* is a circuit controlling light emission of the three light-emitting devices and light reception of the one light-receiving device. One pixel circuit 283*a* may have a structure where three circuits each controlling light emission from one light-emitting device are provided and one circuit controlling light reception of one light-receiving device is provided. For example, the pixel circuit 283*a* can include at least one selection transistor, one current control transistor (driving transistor), and a capacitor for one light-emitting device. A gate signal is input to a gate of the selection transistor, and a source signal is input to one of a source and a drain of the selection transistor. With such a structure, an active-matrix display apparatus is achieved. As the pixel circuit 283*a*, the pixel circuit described in Embodiment 1 can be used, for example.

The circuit portion 282 includes a circuit for driving the pixel circuits 283*a* in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure where one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be higher than or equal to 40% and lower than 100%, preferably higher than or equal to 50% and lower than or equal to 95%, further preferably higher than or equal to 60% and lower than or equal to 95%. Furthermore, the pixels 284*a* can be arranged at very high density and thus the display portion 281 can have an extremely high definition. For example, the pixels 284*a* are preferably arranged in the display portion 281 with a definition higher than or equal to 500 ppi, preferably higher than or equal to 1000 ppi, further preferably higher than or equal to 2000 ppi, still further preferably higher than or equal to 3000 ppi, yet further preferably higher than or equal to 5000 ppi, yet still further preferably higher than or equal to 6000 ppi, and lower than or equal to 20000 ppi or lower than or equal to 30000 ppi.

Such a display module 280 has an extremely high definition, and thus can be suitably used for a VR device such as a head mounted display or a glasses-type AR device. For example, even with a structure where the display portion of the display module 280 is seen through a lens, pixels of the extremely-high-definition display portion 281 included in the display module 280 are prevented from being perceived when the display portion is enlarged by the lens, so that display providing a high sense of immersion can be performed. Without being limited thereto, the 35 display module 280 can be suitably used for electronic devices including a relatively small display portion. For example, the display module 280 can be suitably used for a display portion of a wearable electronic device, such as a wrist watch.

<Display Apparatus 100C>

Figure 38:
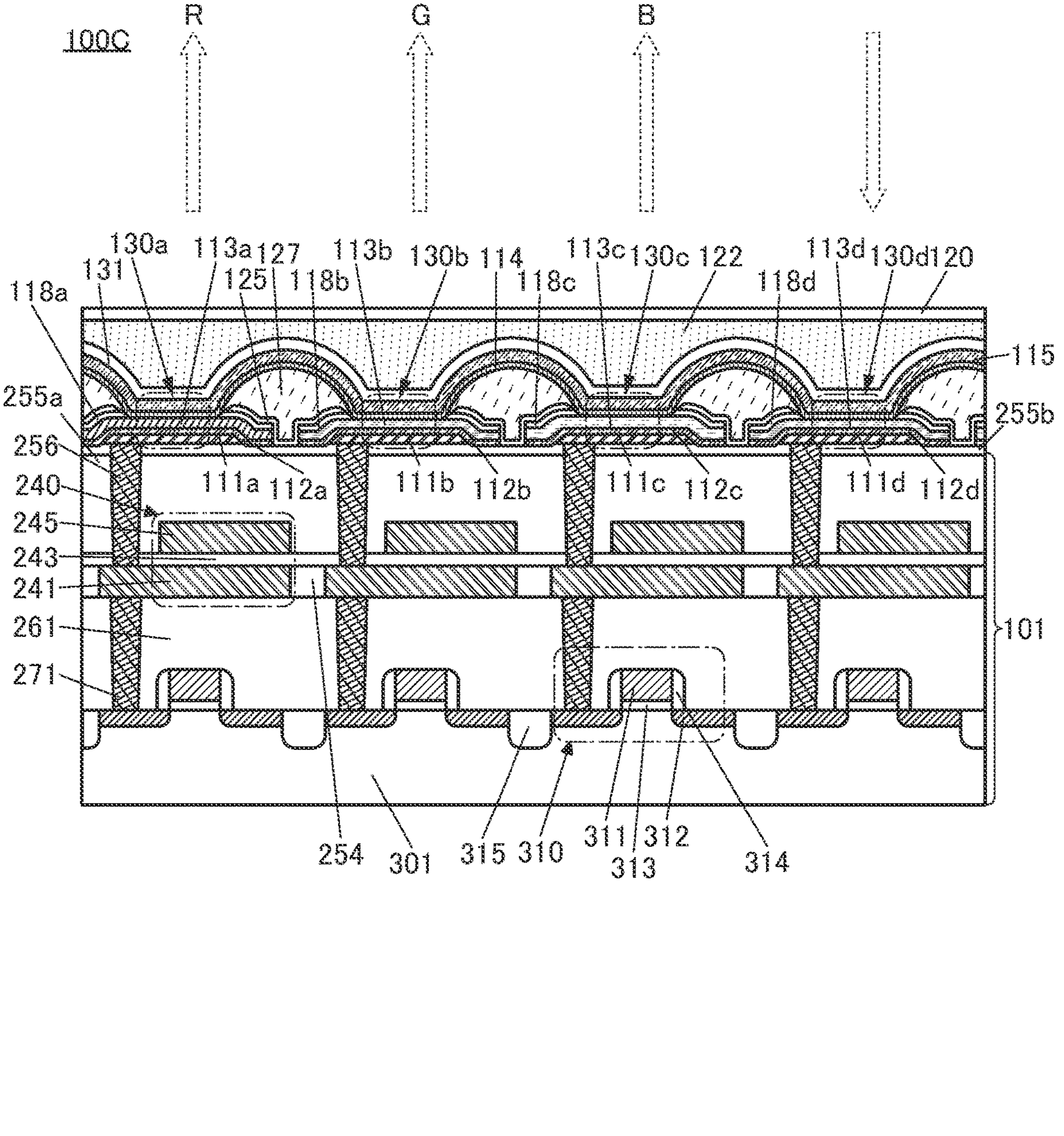
FIG. 38 is a cross-sectional view illustrating an example of a display apparatus.

The display apparatus 100C illustrated in FIG. 38 includes a substrate 301, the light-emitting device 130*a*, the light-remitting device 130*b*, the light-emitting device 130*c*, the light-receiving device 130*d*, a capacitor 240, and a transistor 310.

The substrate 301 corresponds to the substrate 291 in FIG. 37A and FIG. 37B.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region of the substrate 301 which is doped with an impurity, and functions as one of a source and a drain. The insulating layer 314 is provided to cover a side surface of the conductive layer 311 and serves as an insulating layer.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255*a* is provided to cover the capacitor 240, an insulating layer 255*b* is provided over the insulating layer 255*a*, and the light-emitting device 130*a*, the light-emitting device 130*b*, the light-emitting device 130*c*, the light-receiving device 130*d*, and the like are provided over the insulating layer 255*b*. An insulator is provided in a region between adjacent light-emitting elements. For example, in FIG. 38, the insulating layer 125 and the insulating layer 127 over the insulating layer 125 are provided in the region.

A mask layer 118*a* is positioned over the EL layer 113*a* included in the light-emitting device 130*a*, a mask layer 118*b* is positioned over the EL layer 113*b* included in the light-emitting device 130*b*, a mask layer 118*c* is positioned over the EL layer 113*c* included in the light-emitting device 130*c*, and a mask layer 118*d* is positioned over the light-receiving layer 113*d* included in the light-receiving device 130*d*.

The conductive layer 111*a*, the conductive layer 111*b*, the conductive layer 111*c*, and the conductive layer 111*d* are each electrically connected to one of the source and the drain of the transistor 310 through a plug 256 embedded in the insulating layer 243, the insulating layer 255*a*, and the insulating layer 255*b*, the conductive layer 241 embedded in the insulating layer 254, and the plug 271 embedded in the insulating layer 261. The top surface level of the insulating layer 255*b* and the top surface level of the plug 256 are the same or substantially the same. Any of a variety of conductive materials can be used for the plugs.

In the display apparatus of one embodiment of the present invention, the pixel electrode of the light-emitting element has a stacked-layer structure of a plurality of layers. For example, in the example illustrated in FIG. 38, the pixel electrode of the light-emitting device has a stacked-layer structure of the conductive layer 111*a*, the conductive layer 111*b*, the conductive layer 111*c*, and the conductive layer 111*d* and a conductive layer 112*a*, a conductive layer 112*b*, a conductive layer 112*c*, and a conductive layer 112*d*. For example, in the case where the display apparatus 100C is of a top-emission type and the pixel electrode of the light-emitting device functions as an anode, the conductive layer 111*a*, the conductive layer 111*b*, the conductive layer 111*c*, and the conductive layer 111*d* can be layers having visible light reflectance higher than the conductive layer 112*a*, the conductive layer 112*b*, the conductive layer 112*c*, and the conductive layer 112*d*, and the conductive layer 112*a*, the conductive layer 112*b*, the conductive layer 112*c*, and the conductive layer 112*d* can be layers having a work function higher than that of the conductive layer 111*a*, the conductive layer 111*b*, the conductive layer 111*c*, and the conductive layer 111*d*, for example. Higher visible light reflectance of the pixel electrode can suppress transmission of light emitted from the EL layer through the pixel electrode; accordingly, the extraction efficiency of light emitted from the EL layer can be increased in the case where the display apparatus 100C is of a top-emission type. In the case where the pixel electrode functions as an anode, the higher the work function of the pixel electrode is, the higher the emission efficiency of the EL layer is. Thus, the pixel electrode of the light-emitting element has a stacked-layer structure of the conductive layer 111*a*, the conductive layer 111*b*, the conductive layer 111*c*, and the conductive layer 111*d* having high visible light reflectance and the conductive layer 112*a*, the conductive layer 112*b*, the conductive layer 112*c*, and the conductive layer 112*d* having a high work function, whereby the light-emitting element can have high light extraction efficiency and high emission efficiency.

In the case where the conductive layer 111*a*, the conductive layer 111*b*, the conductive layer 111*c*, and the conductive layer 111*d* are layers having visible light reflectance higher than that of the conductive layer 112*a*, the conductive layer 112*b*, the conductive layer 112*c*, and the conductive layer 112*d*, the visible light reflectance of the conductive layer 111*a*, the conductive layer 111*b*, the conductive layer 111*c*, and the conductive layer 111*d* is preferably higher than or equal to 40% and lower than or equal to 100%, higher than or equal to 70% and lower than or equal to 100%, for example. The conductive layer 112*a*, the conductive layer 112*b*, the conductive layer 112*c*, and the conductive layer 112*d* can be transparent electrodes and have visible light transmittance higher than or equal to 40%, for example.

Note that the conductive layer 111*a*, the conductive layer 111*b*, the conductive layer 111*c*, and the conductive layer 111*d* included in the light-emitting devices are layers having high reflectance with respect to light emitted from the EL layer. For example, in the case where the EL layer emits infrared light, the conductive layer 111*a*, the conductive layer 111*b*, the conductive layer 111*c*, and the conductive layer 111*d* can be layers having high reflectance with respect to infrared light. In the case where the pixel electrode of the light-emitting device functions as a cathode, the conductive layer 112*a*, the conductive layer 112*b*, the conductive layer 112*c*, and the conductive layer 112*d* can be, for example, layers having a lower work function than the conductive layer 111*a*, the conductive layer 111*b*, the conductive layer 111*c*, and the conductive layer 111*d*.

Meanwhile, in the case where the pixel electrode has a stacked-layer structure of a plurality of layers, the quality of the pixel electrode might change by e.g., a reaction between the plurality of layers. For example, in the case where a film formed after formation of the pixel electrode is removed by a wet etching method in manufacturing of th display apparatus 100C, a chemical solution is in contact with the pixel electrode in some cases. In the case where the pixel electrode has a stacked-layer structure of a plurality of layers, the plurality of layers are in contact with the chemical solution, so that galvanic corrosion might occur. Accordingly, the quality of at least one of the layers included in the pixel electrode is changed in some cases. Thus, the yield of the display apparatus is lowered, and the manufacturing cost of the display apparatus is increased in some cases. In addition, the reliability of the display apparatus is decreased in some cases.

Thus, in the display apparatus 100C, the conductive layer 112*a*, the conductive layer 112*b*, the conductive layer 112*c*, and the conductive layer 112*d* are formed to cover top surfaces and side surfaces of the conductive layer 111*a*, the conductive layer 111*b*, the conductive layer 111*c*, and the conductive layer 111*d*. In this manner, even in the case where a film formed after the formation of the pixel electrode including the conductive layer 111*a*, the conductive layer 111*b*, the conductive layer 111*c*, the conductive layer 111*d*, the conductive layer 112*a*, the conductive layer 112*b*, the conductive layer 112*c*, and the conductive layer 112*d* is removed by a wet etching method, it is possible to inhibit the chemical solution from being in contact with the conductive layer 111*a*, the conductive layer 111*b*, the conductive layer 111*c*, and the conductive layer 111*d*. Thus, generation of galvanic corrosion to the pixel electrode can be suppressed, for example. Thus, since the display apparatus 100C can be manufactured by a method giving a high yield, an inexpensive display apparatus can be provided. Furthermore, generation of defects in the display apparatus 100C can be suppressed, so that the display apparatus 100C can have high reliability.

For the conductive layer 111*a*, the conductive layer 111*b*, the conductive layer 111*c*, and the conductive layer 111*d*, a metal material can be used, for example. Specifically, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) and an alloy containing an appropriate combination of any of these metals, for example.

For the conductive layer 112*a*, the conductive layer 112*b*, the conductive layer 112*c*, and the conductive layer 112*d*, an oxide containing one or more selected from indium, tin, zinc, gallium, titanium, aluminum, and silicon can be used. For example, it is preferable to use a conductive oxide containing one or more of indium oxide, indium tin oxide, indium zinc oxide, zinc oxide, zinc oxide containing gallium, titanium oxide, indium zinc oxide containing gallium, indium zinc oxide containing aluminum, indium tin oxide containing silicon, indium zinc oxide containing silicon, and the like. In particular, indium tin oxide containing silicon can be suitably used for the conductive layer 112*a*, the conductive layer 112*b*, the conductive layer 112*c*, and the conductive layer 112*d* because of having a high work function, for example, a work function higher than or equal to 4.0 eV.

In the example illustrated in FIG. 38, the mask layer 118*a* is positioned over the EL layer 113*a* included in the light-emitting device 130*a*, the mask layer 118*b* is positioned over the EL layer 113*b* included in the light-emitting device 130*a*, the mask layer 118*c* is positioned over the EL layer 113*c* included in the light-emitting device 130*c*, and the mask layer 118*d* is positioned over the light-receiving layer 113*d* included in the light-receiving device 130*d*. The mask layer 118*a* is a remaining portion of the mask layer provided in contact with the top surface of the EL layer 113*a* when the EL layer 113*a* is processed. The same applies to the mask layer 118*b*, the mask layer 118*c*, and the mask layer 118*d* as to the mask layer 118*a*. In this manner, the mask layer used to protect the EL layer in manufacturing of the display apparatus 100C may partly remain. Note that hereinafter the mask layer 118*a*, the mask layer 118*b*, the mask layer 118*c* and the mask layer 118*d* may be collectively referred to as the mask layer 118.

In FIG. 38, one end portion of the mask layer 118*a* is aligned or substantially aligned with an end portion of the EL layer 113*a* and an end portion of the conductive layer 112*a*. That is, the end portion of the conductive layer 112*a* is aligned or substantially aligned with the end portion of the EL layer 113*a*. The same applies to the mask layer 118*b*, the mask layer 118*c*, and the mask layer 118*d* as to the mask layer 118*a*.

The other end portion of the mask layer 118*a* is positioned over the EL layer 113*a*. Here, the other end portion of the mask layer 118*a* preferably overlaps with the conductive layer 111*a*. In that case, the other end portion of the mask layer 118*a* is likely to be formed on a substantially flat surface of the EL layer 113*a*. The same can apply to the mask layer 118*b*, the mask layer 118*c*, and the mask layer 118*d* as to the mask layer 118*a*.

In the case where end portions are aligned or substantially aligned with each other and the case where top surface shapes are the same or substantially the same, it can be said that outlines of stacked layers at least partly overlap with each other in a top view. For example, the case of processing an upper layer and a lower layer with the use of the same mask pattern or mask patterns that are partly the same is included. However, in some cases, the outlines do not completely overlap with each other and the upper layer is positioned inward from the lower layer or the upper layer is positioned outward from the lower layer; such a case is also represented as "end portions are substantially aligned with each other" or "top surface shapes are substantially the same".

The side surfaces of the EL layer 113*a*, the EL layer 113*b*, and the EL layer 113*c* are covered with the insulating layer 125. The insulating layer 127 overlaps with the side surfaces of the EL layer 113*a*, the EL layer 113*b*, and the EL layer 113*c* with the insulating layer 125 therebetween.

Parts of the top surfaces of the EL layer 113*a*, the EL layer 113*b*, the EL layer 113*c*, and the light-receiving layer 113*d* are covered with the mask layer 118*a*, the mask layer 118*b*, the mask layer 118*c*, and the mask layer 118*d*, respectively. The insulating layer 125 and the insulating layer 127 overlap with parts of the top surfaces of the EL layer 113*a*, the EL layer 113*b*, the EL layer 113*c*, and the light-receiving layer 113*d* with the mask layer 118*a*, the mask layer 118*b*, the mask layer 118*c*, and the mask layer 118*d* therebetween.

Parts of the top surfaces and side surfaces of the EL layer 113*a*, the EL layer 113*b*, the EL layer 113*c*, and the light-receiving layer 113*d* are covered with at least one of the insulating layer 125, the insulating layer 127, and the mask layer 118 (the mask layer 118*a*, the mask layer 118*b*, the mask layer 118*c*, and the mask layer 118*d*), thereby inhibiting the contact of the layer 114 or the common electrode 115 with the side surfaces of the EL layer 113*a*, the EL layer 113*b*, the EL layer 113*c*, and the light-receiving layer 113*d* to suppress short circuits of the light-emitting device 130*a*, the light-emitting device 130*b*, the light-emitting device 130*c*, and the light-receiving device 130*d*. As a result, the reliability of the light-emitting device 130*a*, the light-emitting device 130*b*, the light-emitting device 130*c*, and the light-receiving device 130*d* can be increased.

The thicknesses of the EL layer 113*a*, the EL layer 113*b*, and the EL layer 113*c*, and the light-receiving layer 113*d* can be different from each other. For example, the thicknesses of the EL layer 113*a*, the EL layer 113*b*, and the EL layer 113*c* are preferably set to match optical path lengths that intensifies light emitted from the EL layers. Thus, a microcavity structure is achieved, and the color purity of light emitted from the subpixels 110 can be improved.

The insulating layer 125 is preferably in contact with the side surface of each of the EL layer 113*a*, the EL layer 113*b*, and the EL layer 113*c*, and the light-receiving layer 113*d*. Thus, peeling of the EL layer 113*a*, the EL layer 113*b*, the EL layer 113*c*, and the light-receiving layer 113*d* can be prevented. When the insulating layer 125 is closely attached to the EL layer 113*a*, the EL layer 113*b*, and the EL layer 113*c*, and the light-receiving layer 113*d*, the effect of fixing or bonding the adjacent EL layers 113*a* or the like by the insulating layer 125 is obtained. Thus, the reliability of the light-emitting device 130*a*, the light-emitting device 130*b*, the light-emitting device 130*c*, and the light-receiving device 130*d* can be increased. Furthermore, the manufacturing yield of the light-emitting device can be increased.

As illustrated in FIG. 38, the insulating layer 125 and the insulating layer 127 cover both the side surface and part of the top surface of each of the EL layer 113*a*, the EL layer 113*b*, the EL layer 113*c*, and the light-receiving layer 113*d*, whereby film separation of the EL layer 113*a*, the EL layer 113*b*, the EL layer 113*c*, and the light-receiving layer 113*d* can be further prevented and the reliability of the light-emitting device 130*a*, the light-emitting device 130*b*, the light-emitting device 130*c*, and the light-receiving device 130*d* can be improved. Furthermore, the manufacturing yield of the light-emitting device 130*a*, the light-emitting device 130*b*, the light-emitting device 130*c*, and the light-receiving device 130*d* can be further increased.

In the example in FIG. 38, a stacked-layer structure of the EL layer 113*a*, the mask layer 118*a*, the insulating layer 125, and the insulating layer 127 is positioned over the end portion of the conductive layer 112*a*. Similarly, a stacked-layer structure of the EL layer 113*b*, the mask layer 118*b*, the insulating layer 125, and the insulating layer 127 is positioned over the end portion of the conductive layer 112*b*, and a stacked-layer structure of the EL layer 113*c*, the mask layer 118*c*, the insulating layer 125, and the insulating layer 127 is positioned over the end portion of the conductive layer 112*c*.

The insulating layer 127 is provided over the insulating layer 125 so as to fill a depressed portion formed in the insulating layer 125. The insulating layer 127 can overlap with the side surfaces and parts of the top surfaces of the EL layer 113*a*, the EL layer 113*b*, the EL layer 113*c*, and the light-receiving layer 113*d*, with the insulating layer 125 therebetween. The insulating layer 127 preferably covers at least part of the side surface of the insulating layer 125.

The insulating layer 125 and the insulating layer 127 can fill a gap between adjacent island-shaped layers, whereby extreme unevenness in the formation surfaces of layers (e.g., the carrier-injection layer and the common electrode) provided over the island-shaped layers can be reduced to make the surfaces flatter. Consequently, the coverage with the carrier-injection layer, the common electrode, and the like can be increased.

The protective layer 131 is provided over the light-emitting device 130*a*, the light-emitting device 130*b*, the light-emitting device 130*c*, and the light-receiving device 130*d*. A substrate 120 is bonded onto the protective layer 131 with a resin layer 122. The above description can be referred to for details of the light-emitting devices and the components thereover up to the substrate 120.

As each of the insulating layer 255*a* and the insulating layer 255*b*, a variety of inorganic insulating films such as an oxide insulating film, a nitride insulating film, an oxynitride insulating film, and a nitride oxide insulating film can be suitably used. As the insulating layer 255*a*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferable that a silicon oxide film be used as the insulating layer 255*a* and a silicon nitride film be used as the insulating layer 255*b*. The insulating layer 255*b* preferably has a function of an etching protective film. Alternatively, a nitride insulating film or a nitride oxide insulating film may be used as the insulating layer 255*a*, and an oxide insulating film or an oxynitride insulating film may be used as the insulating layer 255*b*. Although this embodiment illustrates an example where a depressed portion is provided in the insulating layer 255*b*, a depressed portion is not necessarily provided in the insulating layer 255*b*.

The pixel electrode of the light-emitting device is electrically connected to one of the source and the drain of the transistor 310 through the plug 256 embedded in the insulating layers 255*a* and 255*b*, the conductive layer 241 embedded in the insulating layer 254, and the plug 271 embedded in the insulating layer 261. The top surface level of the insulating layer 255*b* and the top surface level of the plug 256 are the same or substantially the same. Any of a variety of conductive materials can be used for the plugs.

Figure 39A:
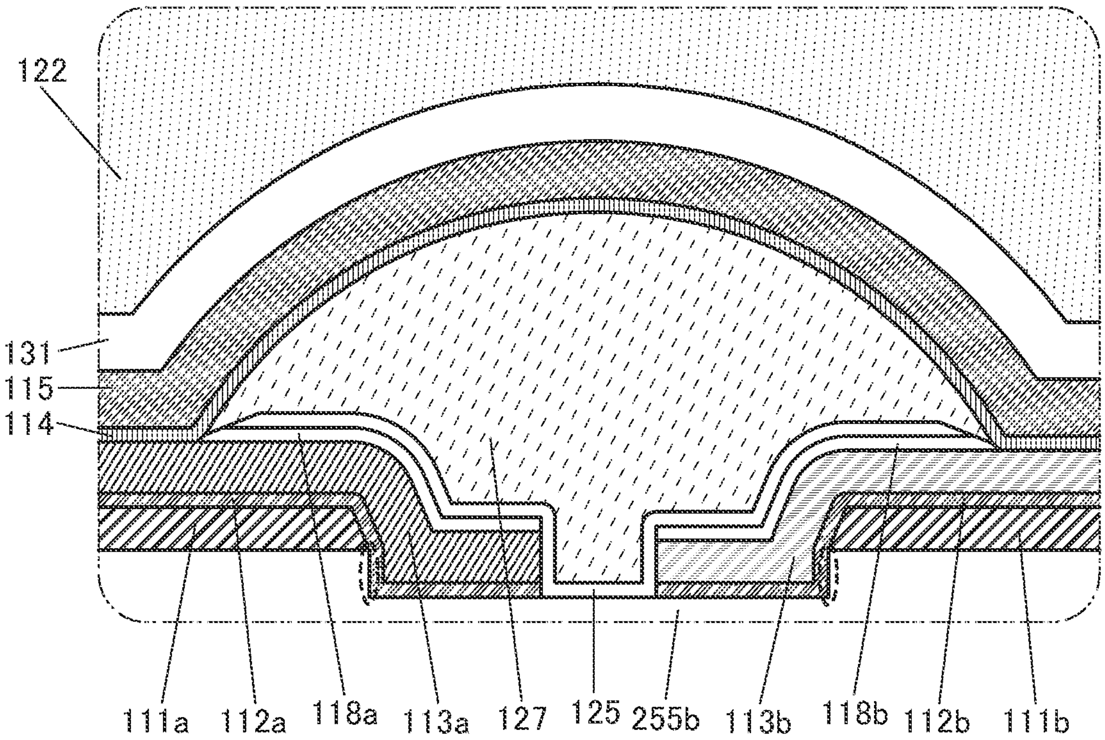
FIG. 39A and FIG. 39B are cross-sectional views each illustrating an example of a display module.
Figure 39B:
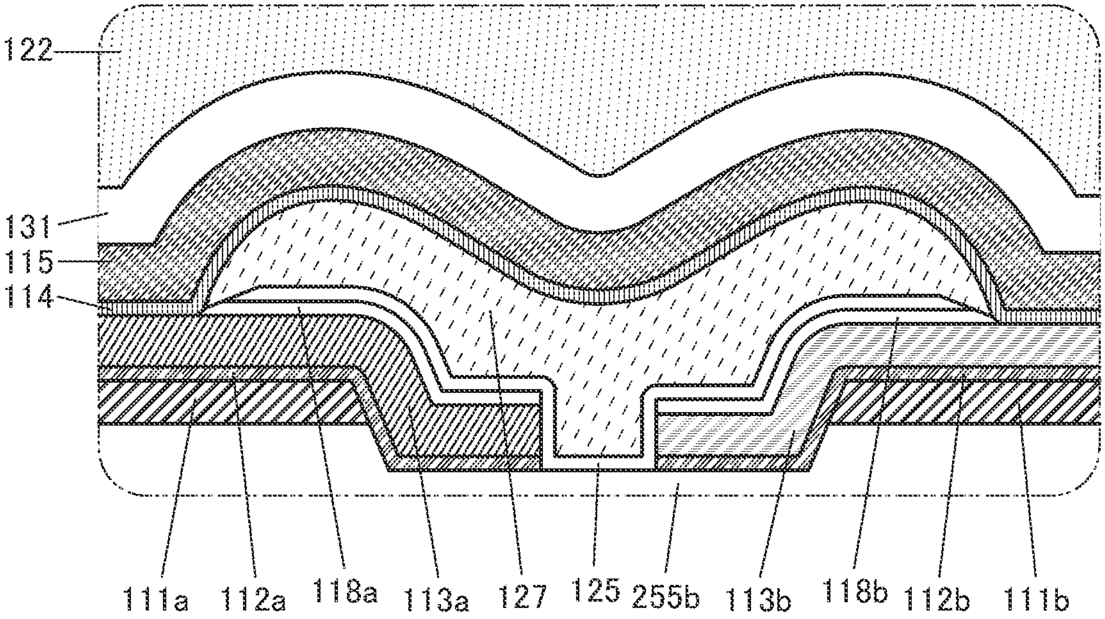

FIG. 39A illustrates an example in which the side surface of the insulating layer 255*b* (a portion surrounded by a dashed line in FIG. 39A) is perpendicular to a region overlapping with the end portion of the conductive layer 111 (111*a* to 111*d*) in FIG. 38. FIG. 39B illustrates an example in which the top surface of the insulating layer 127 has a depression shape in the center and its vicinity, i.e., has a concave surface shape in the cross-sectional view. When the insulating layer 127 has a concave surface in the center portion as illustrated in FIG. 39B, the stress of the insulating layer 127 can be reduced. Specifically, with the structure including a concave surface in the center portion of the insulating layer 127, local stress generated at the end portion of the insulating layer 127 can be reduced, whereby any one or more of film separation between the EL layers 113*a* and 113*b* and the mask layers 118*a* and 118*b*, film separation between the mask layers 118*a* and 118*b* and the insulating layer 125, and film separation between the insulating layer 125 and the insulating layer 127 can be suppressed.

For forming the insulating layer 127 including a concave surface in its center portion as illustrated in FIG. 39B, a light exposure method using a multi-tone mask (typically, a half-tone mask or a gray-tone mask) can be employed. A multi-tone mask is a mask capable of light exposure of three levels to provide an exposed portion, a half-exposed portion, and an unexposed portion, and is a light-exposure mask through which light is transmitted to have a plurality of intensities. The insulating layer 127 including regions with a plurality of (typically two kinds of) thicknesses can be formed with one photomask (one light exposure and development process). Alternatively, in order to form the structure including the concave surface in the center portion of the insulating layer 127, the insulating layer 127 including regions with a plurality of thicknesses can be formed by making the line width of a mask positioned on the concave surface smaller than the line width of the light exposure portion.

Note that a method for forming a concave surface in the center portion of the insulating layer 127 is not limited to the above method. For example, an exposed portion and a half-exposed portion may be formed separately with the use of two photomasks. Alternatively, the viscosity of the resin material used for the insulating layer 127 may be adjusted, specifically to less than or equal to 10 cP, preferably greater than or equal to 1 cP and less than or equal to 5 cP.

Although not illustrated in FIG. 39B, the concave surface in the center portion of the insulating layer 127 is not necessarily continuous, and may be disconnected between adjacent light-emitting elements. In this case, part of the insulating layer 127 in the center portion illustrated in FIG. 39B is eliminated, so that the surface of the insulating layer 125 is exposed. In the case of this structure, the insulating layer 127 preferably has a shape such that the layer 114 and the common electrode 115 can cover the insulating layer 127.

<Display Apparatus 100D>

Figure 40:
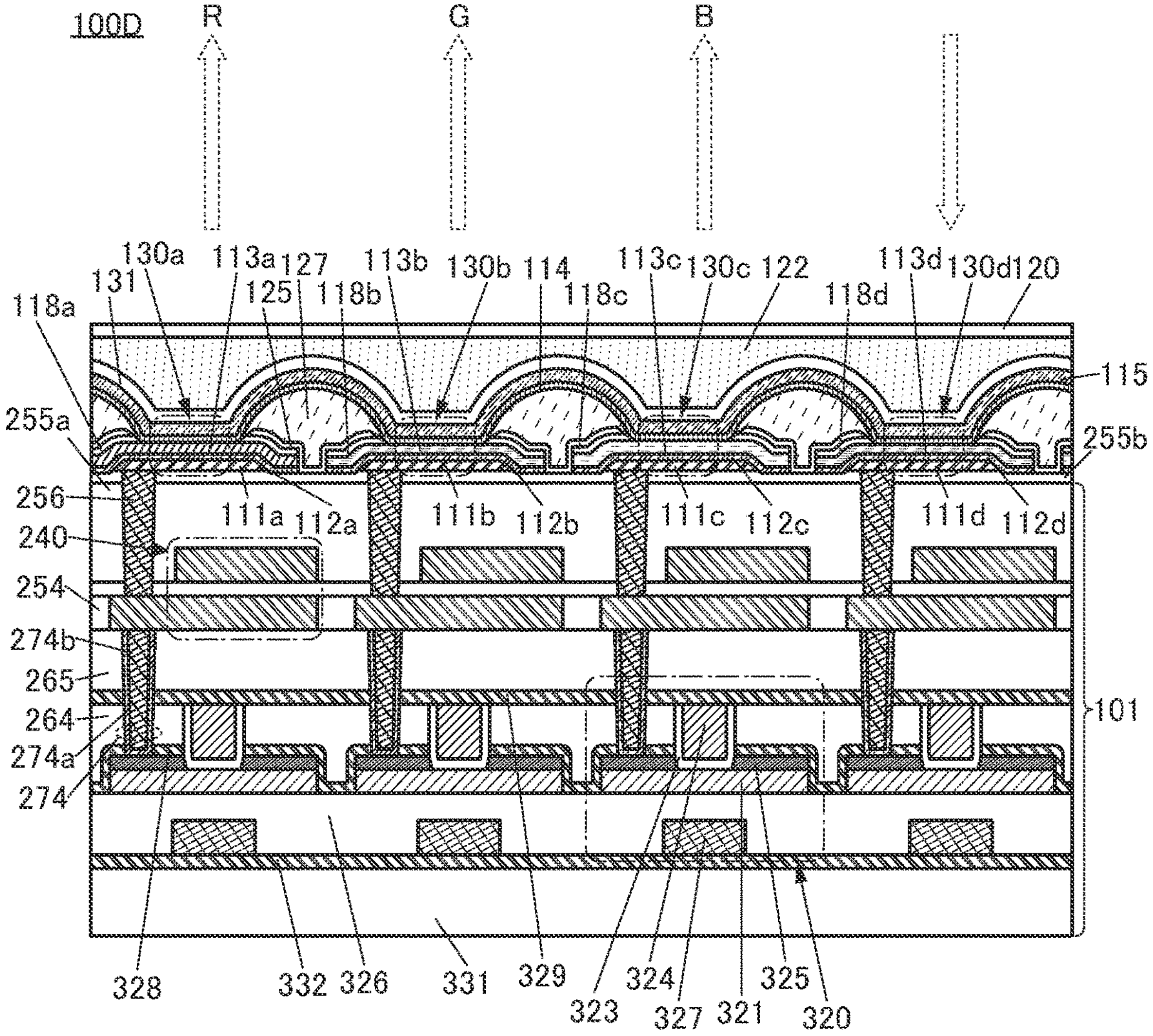
FIG. 40 is a cross-sectional view illustrating an example of a display apparatus.

The display apparatus 100D illustrated in FIG. 40 is different from the display apparatus 100C mainly in a structure of a transistor. Note that description of portions similar to those of the display apparatus 100C is omitted in some cases.

A transistor 320 is a transistor including a metal oxide (also referred to as an oxide semiconductor) in a semiconductor layer where a channel is formed (an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 37A and FIG. 37B. A stacked-layer structure including the substrate 331 and the components thereover up to the insulating layer 255*b* corresponds to the layer 101 including transistors in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film, such as an aluminum oxide film, a hafnium oxide film, or a silicon nitride film, in which hydrogen or oxygen is less likely to diffuse than in a silicon oxide film can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics.

The pair of conductive layers 325 are provided over and in contact with the semiconductor layer 321 and function as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325 and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that their levels are the same or substantially the same, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water and hydrogen from the insulating layer 265 or the like into the transistor 320. For the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* that covers a side surface of an opening of the insulating layer 265, the insulating layer 329, the insulating layer 264, and the insulating layer 328 and part of the top surface of the conductive layer 325, and a conductive layer 274*b* in contact with the top surface of the conductive layer 274*a*. In this case, a conductive material in which hydrogen and oxygen are less likely to diffuse is preferably used for the conductive layer 274*a*.

The structures of the insulating layer 254 and the components thereover up to the substrate 120 in the display apparatus 100D are similar to those in the display apparatus 100C.

<Display Apparatus 100E>

Figure 41:
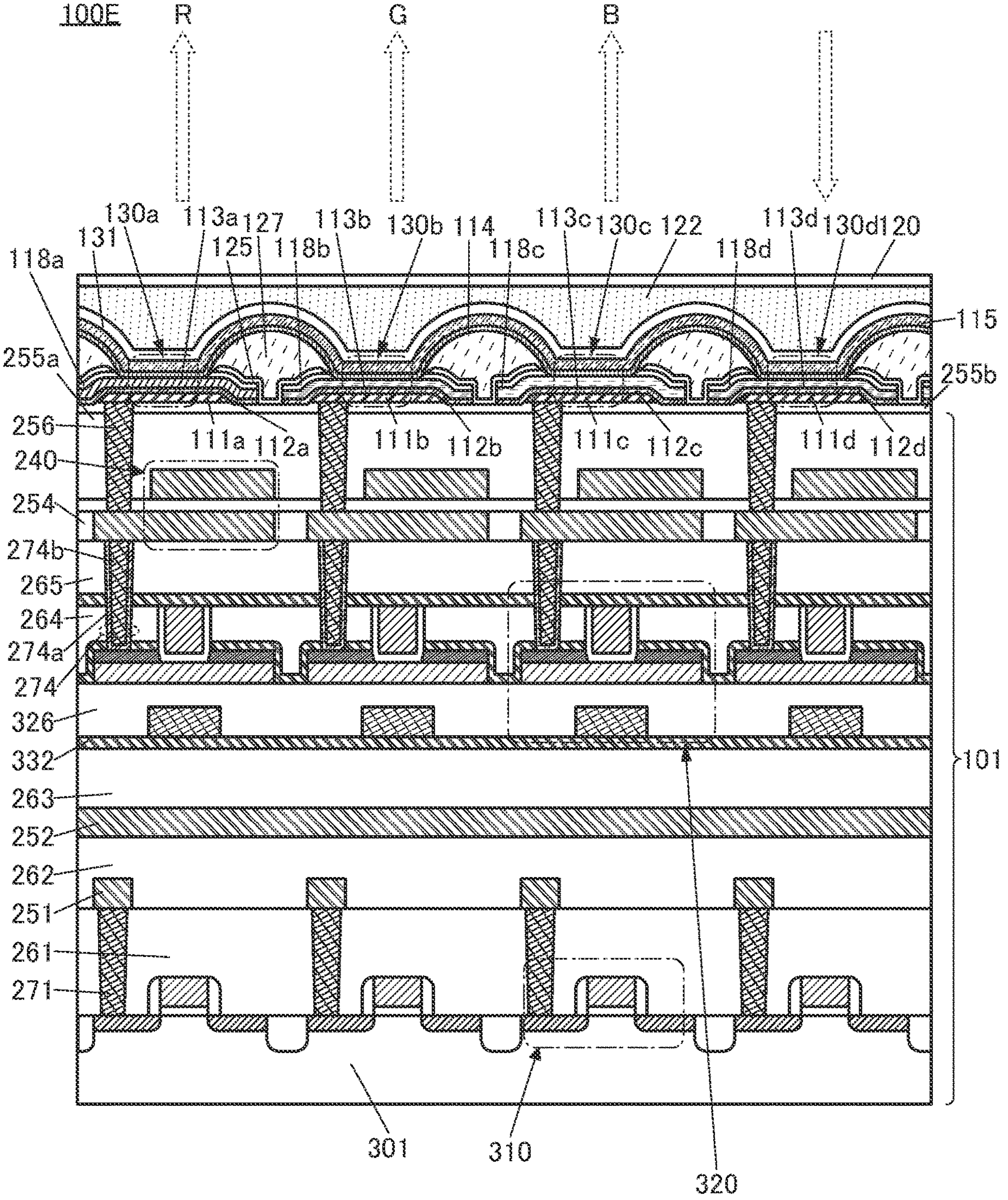
FIG. 41 is a cross-sectional view illustrating an example of a display apparatus.

The display apparatus 100E illustrated in FIG. 41 has a structure where the transistor 310 whose channel is formed in the substrate 301 and the transistor 320 including a metal oxide in the semiconductor layer where the channel is formed are stacked. Note that description of portions similar to those in the display apparatuses 100C and 100D is omitted in some cases.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display apparatus can be downsized as compared with the case where a driver circuit is provided in the periphery of a display region.

<Display Apparatus 100F>

Figure 42:
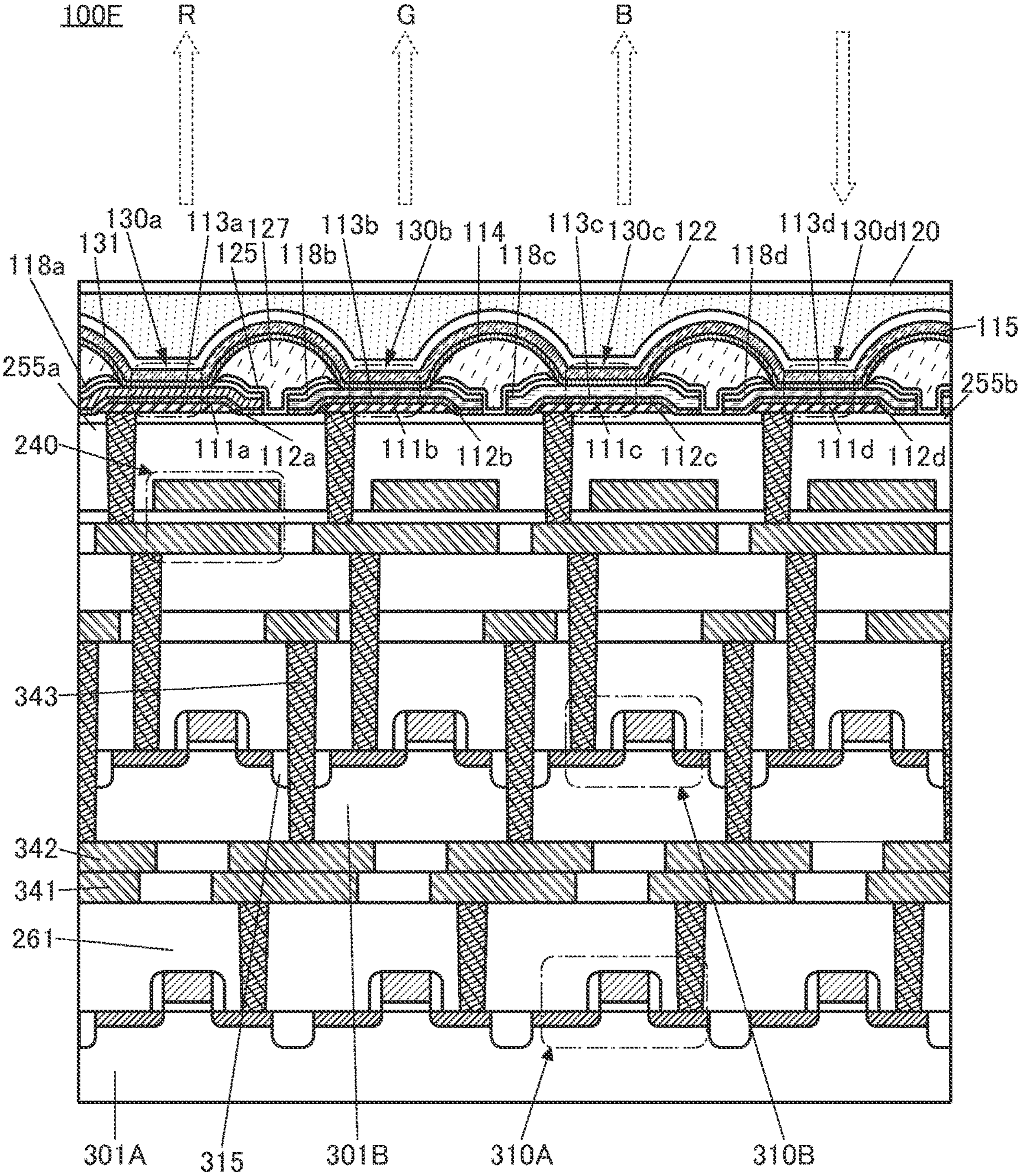
FIG. 42 is a cross-sectional view illustrating an example of a display apparatus.

A display apparatus 100F illustrated in FIG. 42 has a structure where a transistor 310A and a transistor 310B in each of which a channel is formed in a semiconductor substrate are stacked.

In the display apparatus 100F, a substrate 301B provided with the transistor 310B, the capacitor 240, and the light-emitting devices is bonded to a substrate 301A provided with the transistor 310A.

The substrate 301B is provided with a plug 343 that penetrates the substrate 301B. The plug 343 is electrically connected to a conductive layer 342 provided on the rear surface of the substrate 301B (a surface opposite to the substrate 120 side). A conductive layer 341 is provided over the insulating layer 261 over the substrate 301A.

The conductive layer 341 and the conductive layer 342 are bonded to each other, whereby the substrate 301A and the substrate 301B are electrically connected to each other.

The conductive layer 341 and the conductive layer 342 are preferably formed using the same conductive material. For example, a metal film containing an element selected from Al, Cr, Cu, Ta, Ti, Mo, and W, a metal nitride film containing the above element as a component (a titanium nitride film, a molybdenum nitride film, or a tungsten nitride film), or the like can be used. In particular, copper is preferably used for the conductive layer 341 and the conductive layer 342. In that case, it is possible to employ Cu—Cu direct bonding (a technique for establishing electrical continuity by connecting Cu (copper) pads to each other). Note that the conductive layer 341 and the conductive layer 342 may be bonded to each other through a bump.

<Display Apparatus 100G>

Figure 43:
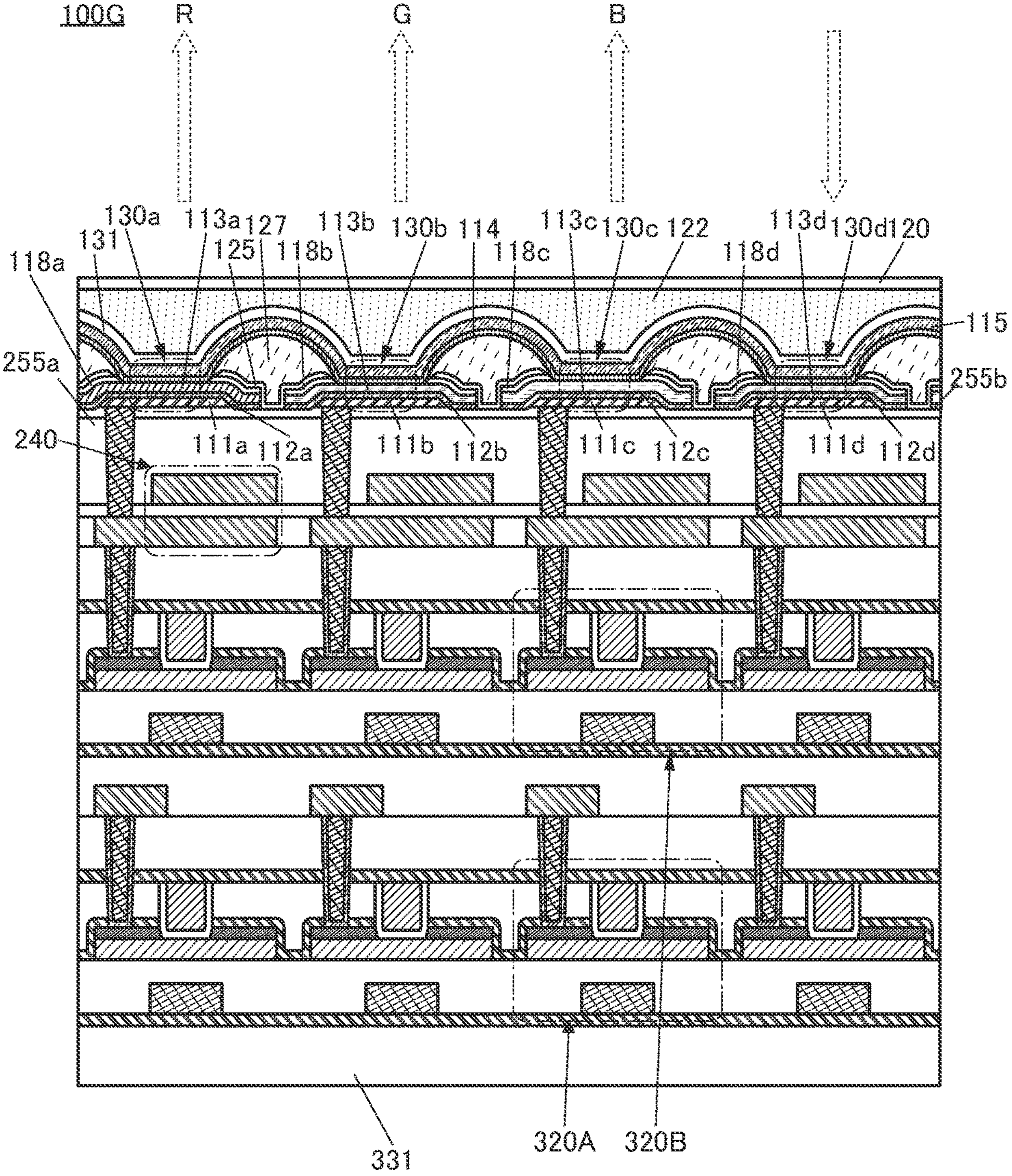
FIG. 43 is a cross-sectional view illustrating an example of a display apparatus.

In a display apparatus 100G illustrated in FIG. 43, a transistor 320A and a transistor 320B each including an oxide semiconductor in a semiconductor layer where a channel is formed are stacked.

The description of the display apparatus 100D can be referred to for the transistor 320A, the transistor 320B, and the components around them.

Although the structure where two transistors including an oxide semiconductor are stacked is described, the present invention is not limited thereto. For example, three or more transistors may be stacked.

<Structure Example of Transistor>

Cross-sectional structure examples of a transistor that can be used for the display apparatuses are described below.

Figure 44A:
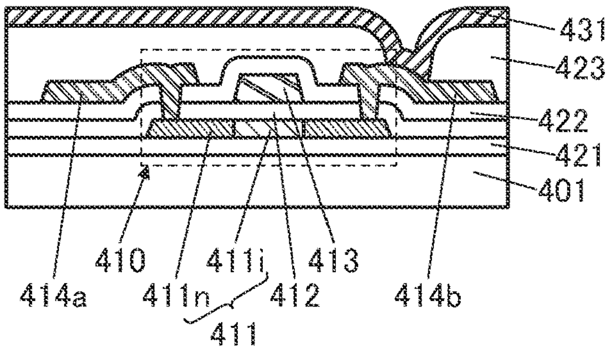
FIG. 44A to FIG. 44D are diagrams illustrating examples of transistors.

FIG. 44A is a cross-sectional view including a transistor 410.

The transistor 410 is a transistor provided over a substrate 401 and includes polycrystalline silicon as its semiconductor layer. FIG. 44A illustrates an example where one of a source and a drain of the transistor 410 is electrically connected to a conductive layer 431 of the light-emitting device.

The transistor 410 includes a semiconductor layer 411, an insulating layer 412, a conductive layer 413, and the like. The semiconductor layer 411 includes a channel formation region 411*i* and low-resistance regions 411*n*. The semiconductor layer 411 contains silicon. The semiconductor layer 411 preferably contains polycrystalline silicon. Part of the insulating layer 412 functions as a gate insulating layer. Part of the conductive layer 413 functions as a gate electrode.

Alternatively, the semiconductor layer 411 can contain a metal oxide exhibiting semiconductor characteristics (also referred to as an oxide semiconductor). In this case, the transistor 410 can be referred to as an OS transistor.

The low-resistance region 411*n* is a region containing an impurity element. For example, in the case where the transistor 410 is an n-channel transistor, phosphorus, arsenic, or the like is added to the low-resistance region 411*n*. Meanwhile, in the case where the transistor 410 is a p-channel transistor, boron, aluminum, or the like is added to the low-resistance region 411*n*. In addition, in order to control the threshold voltage of the transistor 410, the above-described impurity may be added to the channel formation region 411*i*.

An insulating layer 421 is provided over the substrate 401. The semiconductor layer 411 is provided over the insulating layer 421. The insulating layer 412 is provided to cover the semiconductor layer 411 and the insulating layer 421. The conductive layer 413 is provided at a position that is over the insulating layer 412 and overlaps with the semiconductor layer 411.

An insulating layer 422 is provided to cover the conductive layer 413 and the insulating layer 412. A conductive layer 414*a* and a conductive layer 414*b* are provided over the insulating layer 422. The conductive layer 414*a* and the conductive layer 414*b* are electrically connected to the low-resistance regions 411*n* through the opening portions provided in the insulating layer 422 and the insulating layer 412. Part of the conductive layer 414*a* functions as one of a source electrode and a drain electrode, and part of the conductive layer 414*b* functions as the other of the source electrode and the drain electrode. An insulating layer 423 is provided to cover the conductive layer 414*a*, the conductive layer 414*b*, and the insulating layer 422.

The conductive layer 431 functioning as a pixel electrode is provided over the insulating layer 423. The conductive layer 431 is provided over the insulating layer 423 and is electrically connected to the conductive layer 414*b* through an opening provided in the insulating layer 423. Although not illustrated here, an EL layer and a common electrode can be stacked over the conductive layer 431.

Figure 44B:
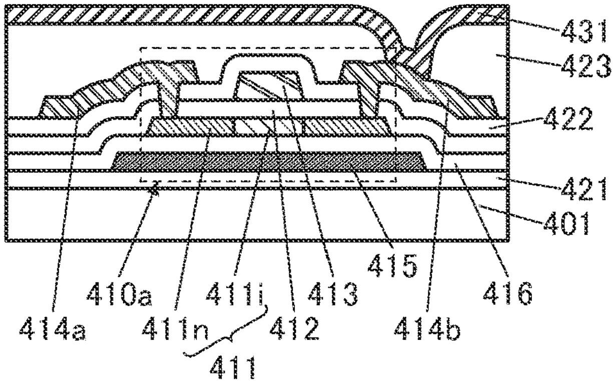

FIG. 44B illustrates a transistor 410*a* including a pair of gate electrodes. The transistor 410*a* illustrated in FIG. 44B is different from FIG. 44A mainly in including a conductive layer 415 and an insulating layer 416.

The conductive layer 415 is provided over the insulating layer 421. The insulating layer 416 is provided to cover the conductive layer 415 and the insulating layer 421. The semiconductor layer 411 is provided such that at least the channel formation region 411*i* overlaps with the conductive layer 415 with the insulating layer 416 therebetween.

In the transistor 410*a* illustrated in FIG. 44B, part of the conductive layer 413 functions as a first gate electrode, and part of the conductive layer 415 functions as a second gate electrode. At this time, part of the insulating layer 412 functions as a first gate insulating layer, and part of the insulating layer 416 functions as a second gate insulating layer.

Here, to electrically connect the first gate electrode to the second gate electrode, the conductive layer 413 is electrically connected to the conductive layer 415 through an opening portion provided in the insulating layer 412 and the insulating layer 416 in a region not illustrated. To electrically connect the second gate electrode to a source or a drain, the conductive layer 415 is electrically connected to the conductive layer 414*a* or the conductive layer 414*b* through an opening portion provided in the insulating layer 422, the insulating layer 412, and the insulating layer 416 in a region not illustrated.

In the case of using LTPS transistors as all of the transistors included in the subpixel 81, the transistor 410 illustrated in FIG. 44A as an example or the transistor 410*a* illustrated in FIG. 44B as an example can be used. In that case, the transistors 410*a* may be used as all of the transistors included in the subpixel 81, the transistors 410 may be used as all of the transistors, or the transistors 410*a* and the transistors 410 may be used in combination.

Described below is an example of a structure including both a transistor including silicon as its semiconductor layer and a transistor including a metal oxide as its semiconductor layer.

Figure 44C:
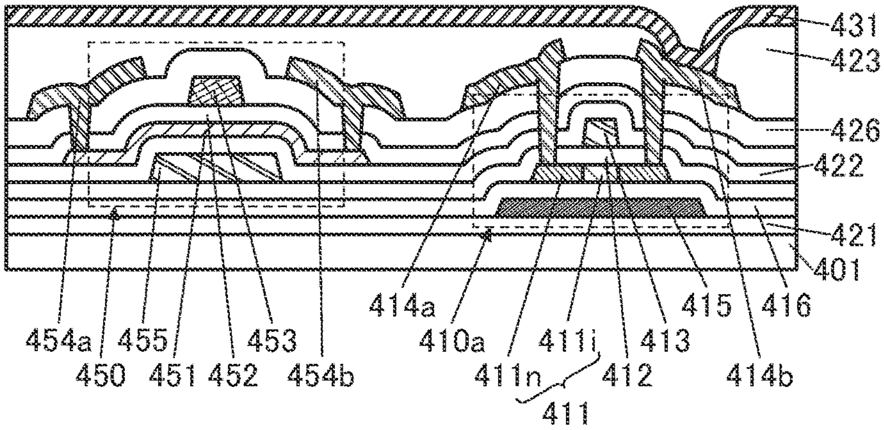
Figure 44D:
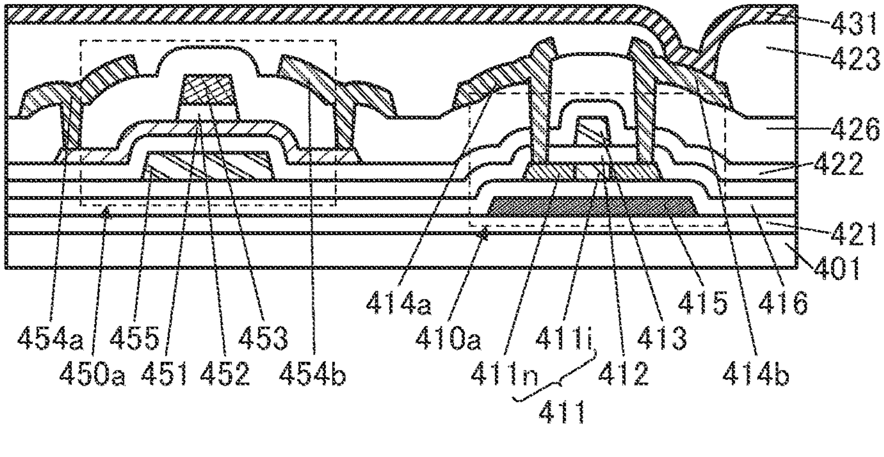

FIG. 44C is a schematic cross-sectional view including the transistor 410*a* and a transistor 450.

The above description in Structure example 1 can be referred to for the transistor 410*a*. Although an example using the transistor 410*a* is illustrated here, a structure including the transistor 410 and the transistor 450 may be employed or a structure including all of the transistor 410, the transistor 410*a*, and the transistor 450 may be employed.

The transistor 450 is a transistor including a metal oxide as its semiconductor layer. The structure illustrated in FIG. 44C shows an example where the transistor 450 and the transistor 410*a* correspond to the transistor 55A and the transistor 55B, respectively, in the pixel 81_2. That is, FIG. 44C illustrates an example where one of the source and the drain of the transistor 410*a* is electrically connected to the conductive layer 431.

FIG. 44C illustrates an example where the transistor 450 includes a pair of gates.

The transistor 450 includes a conductive layer 455, the insulating layer 422, a semiconductor layer 451, an insulating layer 452, a conductive layer 453, and the like. Part of the conductive layer 453 functions as a first gate of the transistor 450, and part of the conductive layer 455 functions as a second gate of the transistor 450. In this case, part of the insulating layer 452 functions as a first gate insulating layer of the transistor 450, and part of the insulating layer 422 functions as a second gate insulating layer of the transistor 450.

The conductive layer 455 is provided over the insulating layer 412. The insulating layer 422 is provided to cover the conductive layer 455. The semiconductor layer 451 is provided over the insulating layer 422. The insulating layer 452 is provided to cover the semiconductor layer 451 and the insulating layer 422. The conductive layer 453 is provided over the insulating layer 452 and includes a region overlapping with the semiconductor layer 451 and the conductive layer 455.

An insulating layer 426 is provided to cover the insulating layer 452 and the conductive layer 453. A conductive layer 454*a* and a conductive layer 454*b* are provided over the insulating layer 426. The conductive layer 454*a* and the conductive layer 454*b* are electrically connected to the semiconductor layer 451 through opening portions provided in the insulating layer 426 and the insulating layer 452. Part of the conductive layer 454*a* functions as one of a source electrode and a drain electrode and part of the conductive layer 454*b* functions as the other of the source electrode and the drain electrode. The insulating layer 423 is provided to cover the conductive layer 454*a*, the conductive layer 454*b*, and the insulating layer 426.

Here, the conductive layer 414*a* and the conductive layer 414*b* electrically connected to the transistor 410*a* are preferably formed by processing the same conductive film as the conductive layer 454*a* and the conductive layer 454*b*. FIG. 44C illustrates a structure where the conductive layer 414*a*, the conductive layer 414*b*, the conductive layer 454*a*, and the conductive layer 454*b* are formed on the same plane (i.e., in contact with the top surface of the insulating layer 426) and contain the same metal element. In this case, the conductive layer 414*a* and the conductive layer 414*b* are electrically connected to the low-resistance regions 411*n* through openings provided in the insulating layer 426, the insulating layer 452, the insulating layer 422, and the insulating layer 412. This is preferable because the manufacturing process can be simplified.

The conductive layer 413 functioning as the first gate electrode of the transistor 410*a* and the conductive layer 455 functioning as the second gate electrode of the transistor 450 are preferably formed by processing the same conductive film. FIG. 44C illustrates a structure where the conductive layer 413 and the conductive layer 455 are formed on the same plane (i.e., in contact with the top surface of the insulating layer 412) and contain the same metal element. This is preferable because the manufacturing process can be simplified.

FIG. 44C illustrates a structure where the insulating layer 452 functioning as the first gate insulating layer of the transistor 450 covers an end portion of the semiconductor layer 451; however, as in a transistor 450*a* illustrated in FIG.

44D, the insulating layer 452 may be processed to have the same or substantially the same top surface shape as the conductive layer 453.

Note that in this specification and the like, the expression "having substantially the same top surface shapes" means that at least outlines of stacked layers partly overlap with each other. For example, the case of processing an upper layer and a lower layer with the use of the same mask pattern or mask patterns that are partly the same is included. However, in some cases, the outlines do not completely overlap with each other and the upper layer is positioned on an inner side of the lower layer or the upper layer is positioned on an outer side of the lower layer; such a case is also represented by the expression "having substantially the same top surface shapes".

Although the example where the transistor 410*a* corresponds to the transistor 55B and is electrically connected to the pixel electrode is shown here, one embodiment of the present invention is not limited thereto. For example, a structure where the transistor 450 or the transistor 450*a* corresponds to the transistor 55B may be employed. In this case, the transistor 410*a* corresponds to the transistor 55A, the transistor 55C, or another transistor.

This embodiment can be combined with any of the other embodiments as appropriate.

Embodiment 7

In this embodiment, electronic devices of one embodiment of the present invention will be described with reference to FIG. 45 to FIG. 47.

An electronic device of this embodiment includes the display apparatus of one embodiment of the present invention in a display portion. The definition and resolution of the display apparatus of one embodiment of the present invention can be easily increased. Thus, the display apparatus of one embodiment of the present invention can be used for display portions of a variety of electronic devices.

Examples of electronic devices include a digital camera, a digital video camera, a digital photo frame, a mobile phone, a portable game machine, a portable information terminal, and an audio reproducing device in addition to electronic devices with a relatively large screen, such as a television device, a desktop or laptop personal computer, a monitor of a computer or the like, digital signage, and a large game machine such as a pachinko machine.

In particular, a display apparatus of one embodiment of the present invention can have high definition, and thus can be suitably used for an electronic device having a relatively small display portion. Examples of such an electronic device include a watch-type or a bracelet-type information terminal device (wearable device), and a wearable device worn on a head, such as a device for VR such as a head-mounted display, a glasses-type device for AR, and a device for MR.

The resolution of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the resolution is preferably 4K, 8K, or higher. Furthermore, the pixel density (definition) of the display apparatus of one embodiment of the present invention is preferably higher than or equal to 100 ppi, higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With the use of such a display apparatus having one or both of high resolution and high definition, the electronic device can have higher realistic sensation, sense of depth, and the like in personal use such as portable use and home use. There is no particular limitation on the screen ratio (aspect ratio) of the display apparatus of one embodiment of the present invention. For example, the display apparatus is compatible with a variety of screen ratios such as 1:1 (square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 45A:
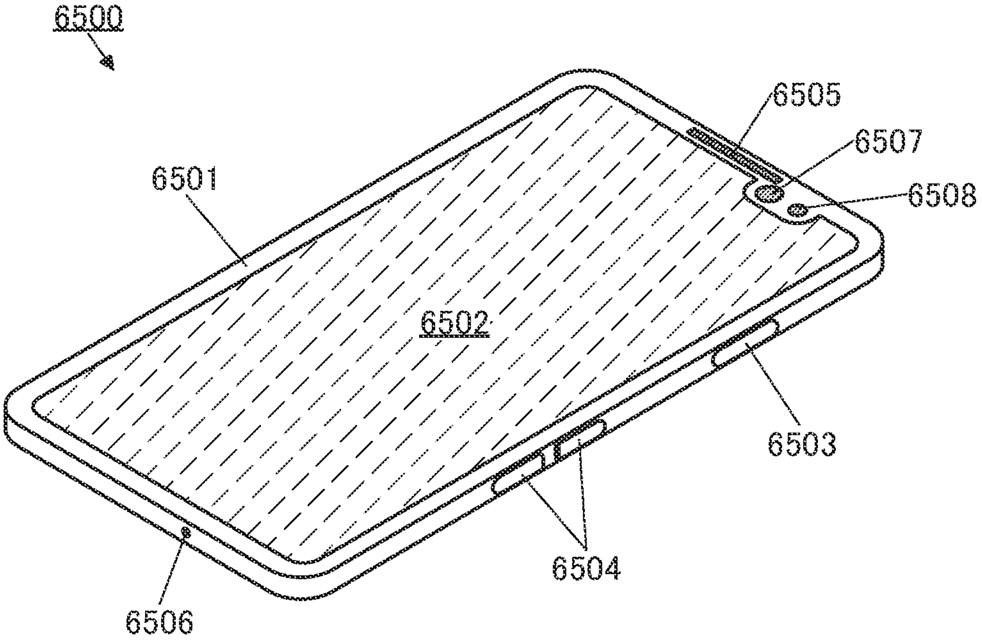
FIG. 45A and FIG. 45B are diagrams illustrating an example of an electronic device.

An electronic device 6500 illustrated in FIG. 45A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 45B:
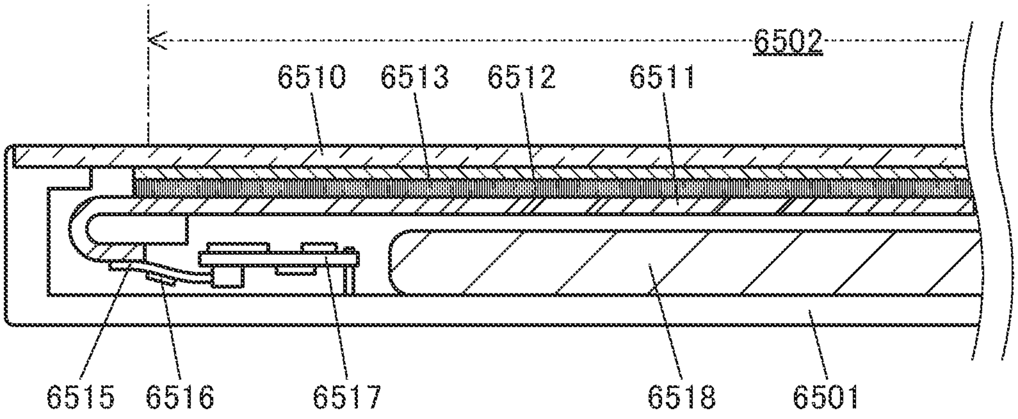

FIG. 45B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are placed in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is reduced. Moreover, part of the display panel 6511 is folded back so that a connection portion with the FPC 6515 is placed on the back side of a pixel portion, whereby an electronic device with a narrow bezel can be achieved.

Figure 46A:
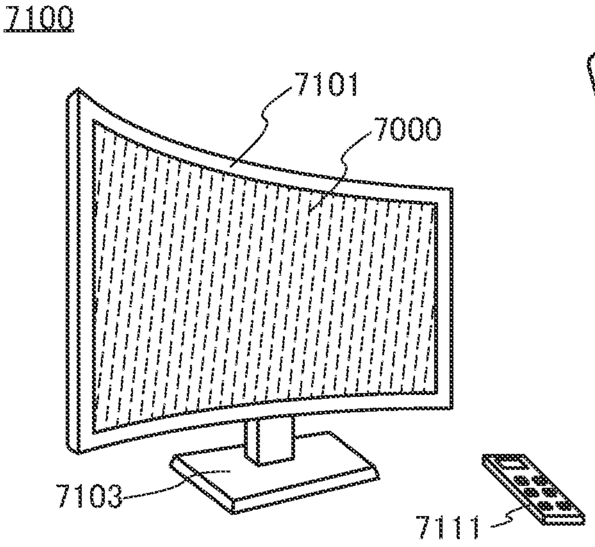
FIG. 46A to FIG. 46D are diagrams illustrating examples of electronic devices.

FIG. 46A illustrates an example of a television device. In a television device 7100, a display portion 7000 is incorporated in a housing 7101. Here, the housing 7101 is supported by a stand 7103.

The display apparatus of one embodiment of the present invention can be used for the display portion 7000.

Operation of the television device 7100 illustrated in FIG. 46A can be performed with an operation switch provided in the housing 7101 and a separate remote controller 7111. Alternatively, the display portion 7000 may be provided with a touch sensor, and the television device 7100 may be operated by touch on the display portion 7000 with a finger or the like. The remote controller 7111 may include a display portion for displaying information output from the remote controller 7111. With operation keys or a touch panel provided in the remote controller 7111, channels and volume can be operated and an image displayed on the display portion 7000 can be operated.

Note that the television device 7100 has a structure where a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 46B:
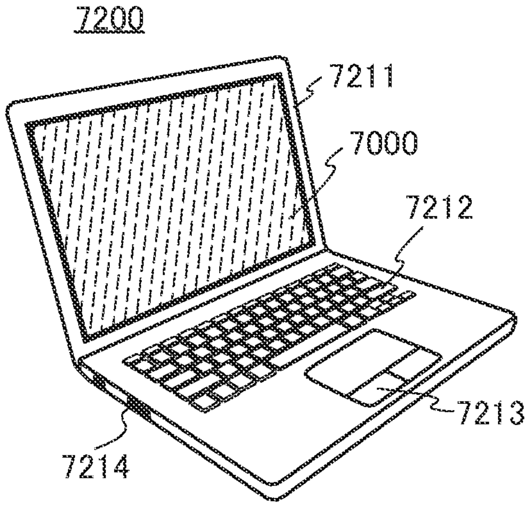

FIG. 46B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000.

Figure 46C:
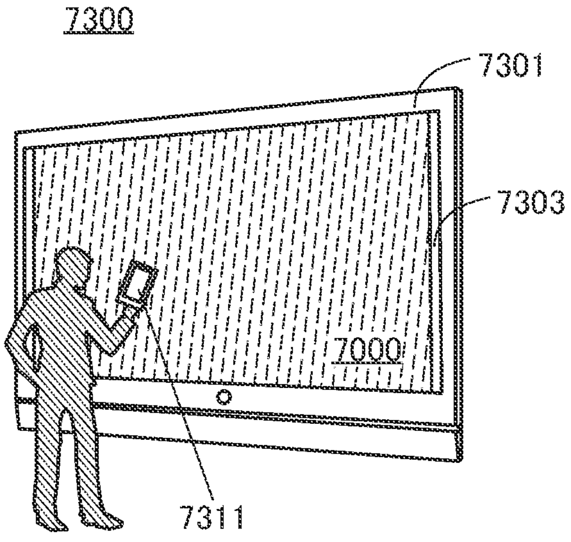
Figure 46D:
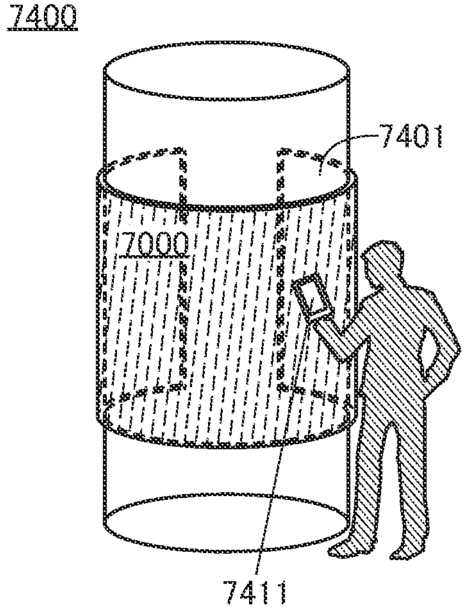

FIG. 46C and FIG. 46D illustrate examples of digital signage.

Digital signage 7300 illustrated in FIG. 46C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 46D is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 46C and FIG. 46D.

A larger area of the display portion 7000 can increase the amount of information that can be provided at a time. The larger display portion 7000 attracts more attentions, so that the effectiveness of the advertisement can be increased, for example.

The use of a touch panel in the display portion 7000 is preferable because in addition to display of an image or a moving image on the display portion 7000, intuitive operation by a user is possible. Moreover, for an application for providing information such as route information or traffic information, usability with intuitive operation can be enhanced.

As illustrated in FIG. 46C and FIG. 46D, preferably, the digital signage 7300 or the digital signage 7400 can work with an information terminal 7311 or an information terminal 7411 such as a smartphone of a user through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game at the same time.

Electronic devices illustrated in FIG. 47A to FIG. 47F each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays), a microphone 9008, and the like.

The electronic devices illustrated in FIG. 47A to FIG. 47F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a recording medium (an external recording medium or a recording medium incorporated in the camera), a function of displaying the taken image on the display portion, or the like.

The electronic devices illustrated in FIG. 47A to FIG. 47F will be described in detail below.

Figure 47A:
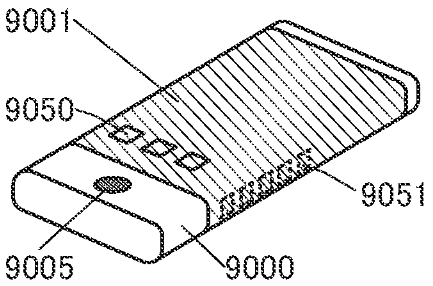
FIG. 47A to FIG. 47F are diagrams illustrating examples of electronic devices.

FIG. 47A is a perspective view illustrating a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 47A illustrates an example where three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 47B:
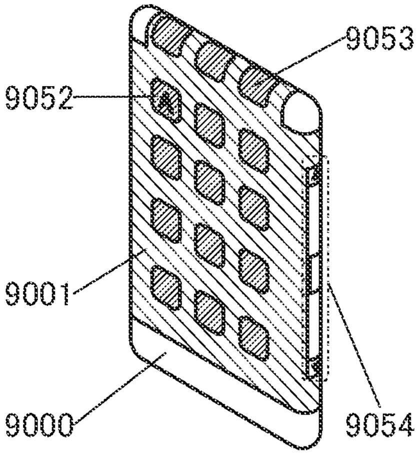

FIG. 47B is a perspective view illustrating a portable information terminal 9102. The portable information terminal 9102 has a function of displaying information on three or more surfaces of the display portion 9001. Here, an example is illustrated where information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 47C:
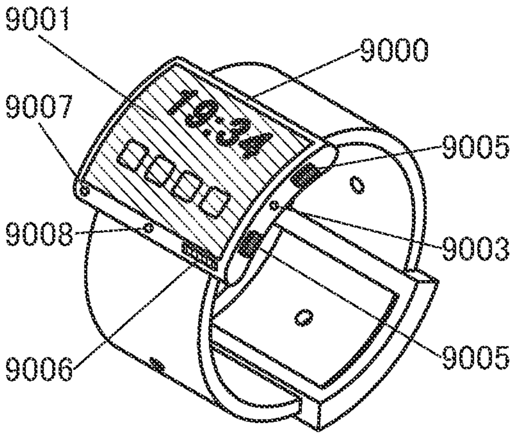

FIG. 47C is a perspective view illustrating a watch-type portable information terminal 9200. For example, the portable information terminal 9200 can be used as a Smartwatch (registered trademark). The display surface of the display portion 9001 is curved, and display can be performed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 47D:
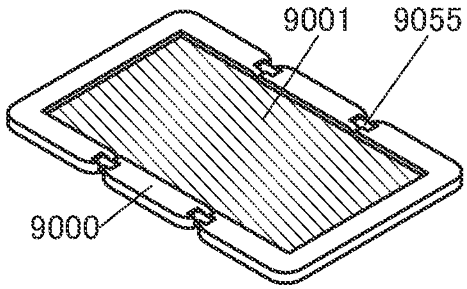
Figure 47E:
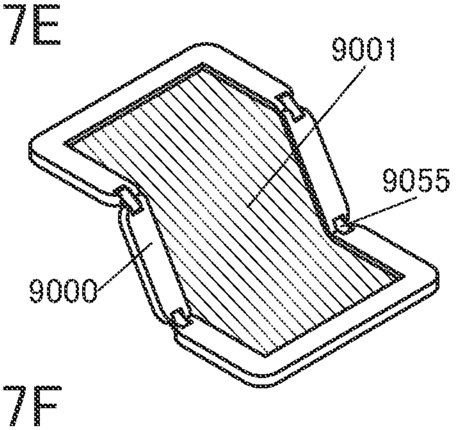
Figure 47F:
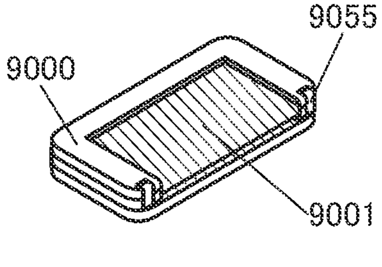

FIG. 47D to FIG. 47F are perspective views illustrating a foldable portable information terminal 9201. FIG. 47D is a perspective view of an opened state of the portable information terminal 9201, FIG. 47F is a perspective view of a folded state thereof, and FIG. 47E is a perspective view of a state in the middle of change from one of FIG. 47D and FIG. 47F to the other. The portable information terminal 9201 is highly portable in the folded state and is highly browsable in the opened state because of a seamless large display region. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined with any of the other embodiments as appropriate.

<Supplementary Notes on Description in this Specification and the Like>

The following are notes on the description of the structures in the foregoing embodiments and the structures in the embodiments.

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that a content (or part thereof) described in one embodiment can be applied to, combined with, or replaced with another content (or part thereof) described in the embodiment and/or a content (or part thereof) described in another embodiment or other embodiments, for example.

Note that in each embodiment, a content described in the embodiment is a content described using a variety of diagrams or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In this specification and the like, components are classified according to their functions, and illustrated as blocks independent of one another in block diagrams. However, in an actual circuit or the like, it is difficult to classify components according to their functions, and there is such a case where one circuit relates to a plurality of functions or a case where a plurality of circuits relate to one function. Therefore, the blocks in the block diagrams are not limited by the components described in the specification, and the description can be changed appropriately depending on the situation.

In drawings, the size, the layer thickness, or the region is shown arbitrarily for description convenience. Therefore, the size, the layer thickness, or the region is not limited to the illustrated scale. Note that the drawings schematically illustrates components for clarity, and embodiments of the present invention are not limited to shapes, values, or the like illustrated in the drawings. For example, variations in a signal, a voltage, or a current due to noise, variations in a signal, a voltage, or a current due to difference in timing, or the like can be included.

In this specification and the like, the terms "one of a source and a drain" (or a first electrode or a first terminal) and "the other of the source and the drain" (or a second electrode or a second terminal) are used to describe the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, voltage and potential can be replaced with each other as appropriate. The term voltage refers to a potential difference from a reference potential, and when the reference potential is a ground potential, for example, voltage can be replaced with potential. The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Also, for example, the term "insulating film" can be changed into the term "insulating layer" in some cases. In this specification and the like, a switch is in a conduction state (on state) or in a non-conduction state (off state) to determine whether current flows therethrough or not. Alternatively, a switch has a function of selecting and changing a current path.

In this specification and the like, the channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, the channel width refers to, for example, the length of a portion where a source and a drain face each other in a region where a semiconductor (or a portion where current flows in a semiconductor when a transistor is in an on state) and a gate electrode overlap with each other or a region where a channel is formed.

In this specification and the like, the expression "A and B are connected" means the case where A and B are electrically connected as well as the case where A and B are directly connected. Here, the expression "A and B are electrically connected" means the case where electric signals can be transmitted and received between A and B when an object having any electric action is present between A and B.

REFERENCE NUMERALS

10: display apparatus 20: correction circuit, 21: video data correction circuit, 22: touch detection circuit, 23: memory circuit, 71: display portion, 72: signal line driver circuit, 73: gate line driver circuit, 74: control line driver circuit, 75: signal readout circuit, 80: pixel, 81B: subpixel, 81G: subpixel, 81R: subpixel, 82PS: subpixel

The invention claimed is:

1. A correction method for a display apparatus, the display apparatus comprising a display portion, a correction circuit, a memory circuit, a reflective plate, and a protection portion, the display portion comprising a plurality of pixels each comprising a first subpixel including a light-emitting device and a second subpixel including a light-receiving device, the correction circuit comprising the steps of:

obtaining offset corresponding to a current flowing through the second subpixel when the first subpixel is not lit;

obtaining, for each pixel, correction output data, obtained by correcting, with the offset, data corresponding to a current flowing through each of the second subpixels in sequentially supplying correction video data to the first subpixels, and storing the correction video data and the correction output data corresponding to the correction video data in the memory circuit;

calculating coefficients obtained when a relation between the correction video data and the correction output data corresponding to the correction video data is approximated by a quadratic expression and storing the coefficients in the memory circuit;

creating a correction table on the basis of the correction output data and the coefficients and storing the correction table in the memory circuit; and correcting display video data in accordance with the correction table, wherein the display portion is provided over and overlapping with the correction circuit, wherein the first subpixel and the second subpixel are provided on a same insulating layer, wherein the correction output data and the offset corresponding to the current flowing through the second subpixel are obtained in a state of weak external light, and wherein the state of weak external light corresponds to a state in which the reflective plate provided in the protection portion covers and overlaps with a display surface of the display portion when the protection portion is folded on a display portion side.

2. The correction method for the display apparatus according to claim 1, wherein the quadratic expression is represented by Formula (1), $$D_{PI} = \alpha(D_{DATA} - \beta)^2, \quad (1)$$

wherein, in the Formula (1), $D_{DATA}$ represents the correction video data and $D_{PI}$ represents the correction output data, and wherein, in the Formula (1), the coefficients are $\alpha$ and $\beta$.

3. A correction method for a display apparatus, the display apparatus comprising a display portion, a correction circuit, and a memory circuit, the display portion comprising a plurality of pixels each comprising a first subpixel including a light-emitting device and a second subpixel including a light-receiving device, the correction circuit comprising the steps of:

obtaining offset corresponding to a current flowing through the second subpixel when the first subpixel is not lit;

obtaining first correction output data corresponding to a current flowing through the second subpixel when the first subpixel is lit with a maximum grayscale level;

obtaining, for each pixel, second correction output data, obtained by correcting, with the offset, data corresponding to a current flowing through each of the second subpixels in sequentially supplying correction video data to the first subpixels;

determining the second correction output data corresponding to a grayscale level on the basis of the first correction output data;

storing a correction table created on the basis of the correction video data corresponding to the second correction output data in the memory circuit; and correcting display video data in accordance with the correction table, wherein luminance of the grayscale level is obtained through the following operation:

the light-emitting device emits a first light towards a reflective plate provided over and overlapping with the display portion;

the reflective plate reflects the first light towards the light-receiving device as a second light; and the light-receiving device receives the second light, wherein the display portion is provided over and overlapping with the correction circuit, wherein the first subpixel and the second subpixel are provided in direct contact with a top surface of a first insulating layer, wherein the first correction output data and the offset corresponding to the current flowing through the second subpixel are obtained in a state of weak external light, and wherein the state of weak external light corresponds to a state in which the reflective plate provided in a protection portion covers and overlaps with a display surface of the display portion when the protection portion is folded on a display portion side.

4. A display apparatus comprising a display portion, a correction circuit provided below and overlapping with the display portion, a memory circuit, and a reflective plate provided over and overlapping with the display portion and the correction circuit, wherein the display portion comprises a plurality of pixels each comprising a first subpixel provided on a first insulating layer and including a light-emitting device and a second subpixel provided on the first insulating layer and including a light-receiving device, wherein the correction circuit is configured to obtain offset corresponding to a current flowing through the second subpixel when the first subpixel is not lit in a state of weak external light using the reflective plate, wherein the state of weak external light corresponds to a state in which the reflective plate provided in a protection portion covers and overlaps with a display surface of the display portion when the protection portion is folded on a display portion side, and wherein the display apparatus is configured to:

obtain, for each pixel, correction output data, obtained by correcting, with the offset, data corresponding to a current flowing through each of the second subpixels in sequentially supplying correction video data to the first subpixels, and store the correction video data and the correction output data corresponding to the correction video data in the memory circuit;

calculate coefficients obtained when a relation between the correction video data and the correction output data corresponding to the correction video data is approximated by a quadratic expression and store the coefficients in the memory circuit;

create a correction table on the basis of the correction output data and the coefficients and store the correction table in the memory circuit; and correct display video data in accordance with the correction table.

5. The display apparatus according to claim 4, wherein the quadratic expression is represented by Formula (1), $$D_{PI} = \alpha(D_{DATA} - \beta)^2, \quad (1)$$

wherein, in the Formula (1), $D_{DATA}$ represents the correction video data and $D_{PI}$ represents the correction output data, and wherein, in the Formula (1), the coefficients are $\alpha$ and $\beta$.

6. The display apparatus according to claim 4, wherein the light-emitting device is an organic EL device, and wherein the light-receiving device is an organic photodiode.

7. The correction method for the display apparatus according to claim 1, wherein the reflective plate is fixed to the display portion.

8. The correction method for the display apparatus according to claim 1, wherein the protection portion is provided on a back side of the display portion.

9. The correction method for the display apparatus according to claim 1, wherein, when the protection portion is folded, the protection portion sandwiches the display portion and the correction circuit.

10. The correction method for the display apparatus according to claim 3, wherein the reflective plate is fixed to the display portion.

11. The correction method for the display apparatus according to claim 3, wherein the protection portion is provided on a back side of the display portion.

12. The correction method for the display apparatus according to claim 3, wherein, when the protection portion is folded, the protection portion sandwiches the display portion and the correction circuit.

13. The display apparatus according to claim 4, wherein the reflective plate is fixed to the display portion.

14. The display apparatus according to claim 4, wherein the protection portion is provided on a back side of the display portion.

15. The display apparatus according to claim 4, wherein, when the protection portion is folded, the protection portion sandwiches the display portion and the correction circuit.

* * * * *